(12) United States Patent
Matsuoka

(10) Patent No.: US 9,502,106 B2
(45) Date of Patent: Nov. 22, 2016

(54) SEMICONDUCTOR MEMORY DEVICE AND METHOD OF CONTROLLING SEMICONDUCTOR MEMORY DEVICE

(71) Applicant: KABUSHIKI KAISHA TOSHIBA, Minato-ku, Tokyo (JP)

(72) Inventor: Fumiyoshi Matsuoka, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/644,167

(22) Filed: Mar. 10, 2015

(65) Prior Publication Data

US 2016/0172032 A1    Jun. 16, 2016

Related U.S. Application Data

(60) Provisional application No. 62/090,199, filed on Dec. 10, 2014.

(51) Int. Cl.
*G11C 11/00*    (2006.01)
*G11C 13/00*    (2006.01)

(52) U.S. Cl.
CPC ......... *G11C 13/0069* (2013.01); *G11C 13/004* (2013.01); *G11C 13/0038* (2013.01); *G11C 2013/0054* (2013.01)

(58) Field of Classification Search
CPC .................................................. G11C 11/00
USPC ................... 365/46, 94, 100, 129, 148, 163
See application file for complete search history.

(56) References Cited

U.S. PATENT DOCUMENTS

| 2003/0011379 | A1  |  1/2003 | Khoury |
| 2007/0268737 | A1* | 11/2007 | Hidaka ................... G11C 11/16 365/148 |
| 2009/0010045 | A1  |  1/2009 | Ueda |
| 2009/0219750 | A1* |  9/2009 | Tokiwa .................... G11C 5/02 365/148 |
| 2009/0285008 | A1* | 11/2009 | Jeong ....................... G11C 8/10 365/148 |
| 2010/0321982 | A1* | 12/2010 | Takagi ............... G11C 13/0002 365/148 |
| 2012/0069633 | A1* |  3/2012 | Katoh .................. G11C 13/004 365/148 |
| 2013/0044535 | A1* |  2/2013 | Shimakawa ......... G11C 13/004 365/148 |

(Continued)

FOREIGN PATENT DOCUMENTS

JP    08263998 A    10/1996
JP    09246499 A     9/1997

*Primary Examiner* — Harry W Byrne
(74) *Attorney, Agent, or Firm* — Holtz, Holtz & Volek PC

(57) ABSTRACT

According to one embodiment, a semiconductor memory device includes a cell array including a plurality of memory cells, a reference circuit, a sense amplifier for sensing a read current flowing through the memory cell, and a reference current flowing through the reference circuit, a write driver for writing data to the memory cell, a sub cell area including the cell array, the sense amplifier, and the write driver, a memory area including a plurality of sub cell areas, and a control circuit for supplying first write data to the sub cell area including the sense amplifier which performs a first read operation of supplying the read current to a selected memory cell without supplying the reference current.

12 Claims, 71 Drawing Sheets

(56) References Cited

U.S. PATENT DOCUMENTS

2013/0088911 A1* 4/2013 Nakura .............. G11C 13/0002
　　　　　　　　　　　　　　　　　　　　　365/148
2013/0223133 A1* 8/2013 Azuma .............. G11C 13/0007
　　　　　　　　　　　　　　　　　　　　　365/148

* cited by examiner

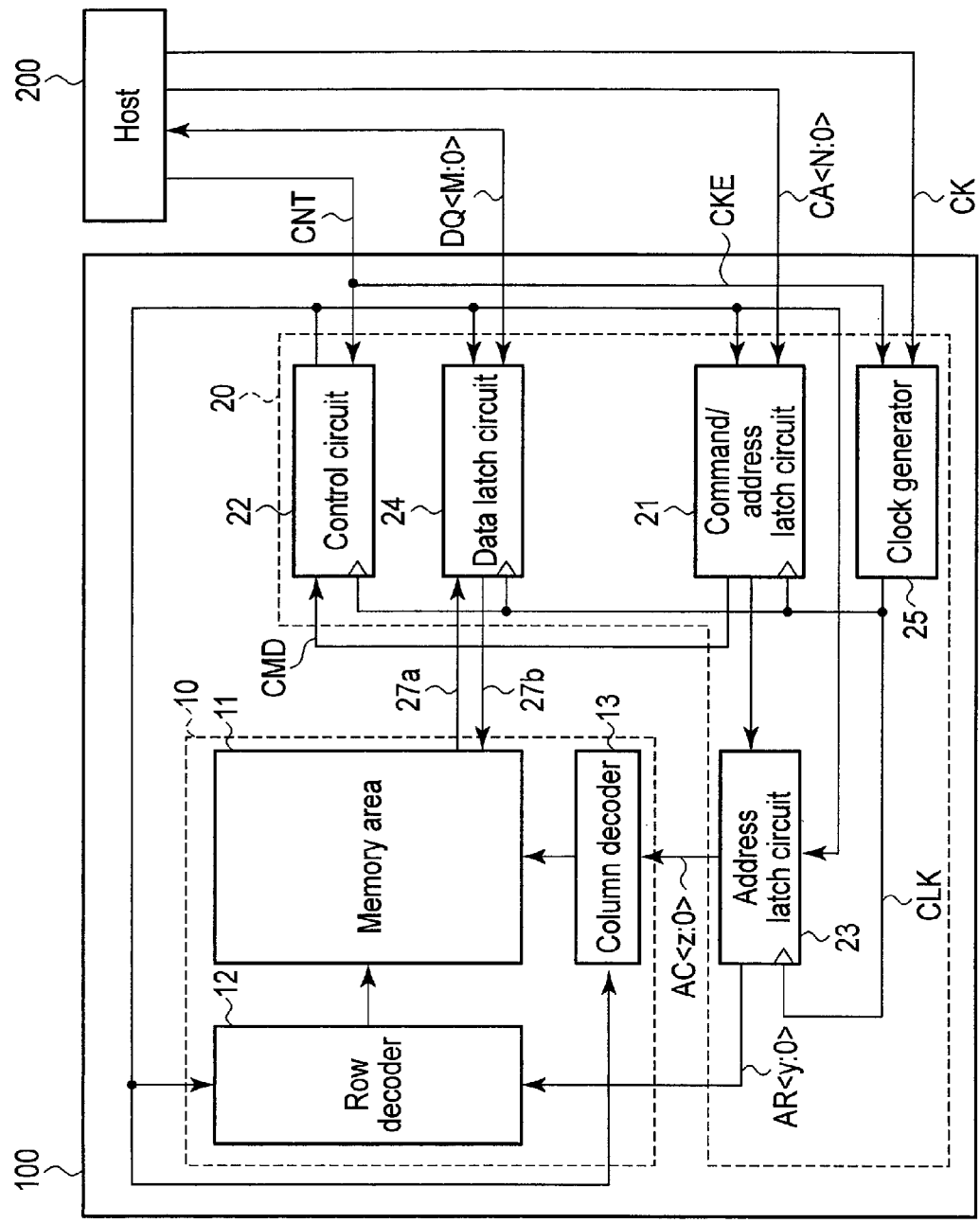
F I G. 1

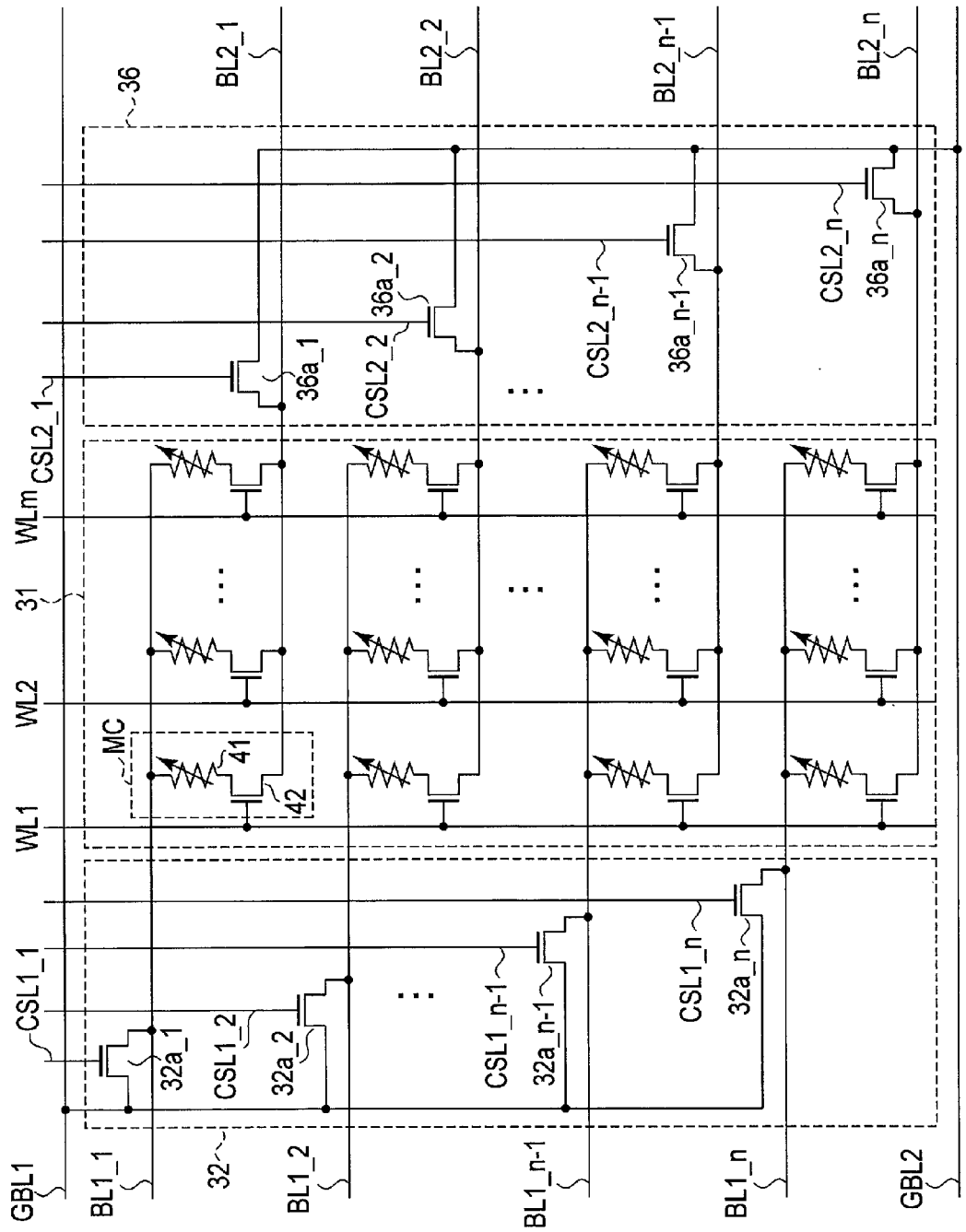
F I G. 3

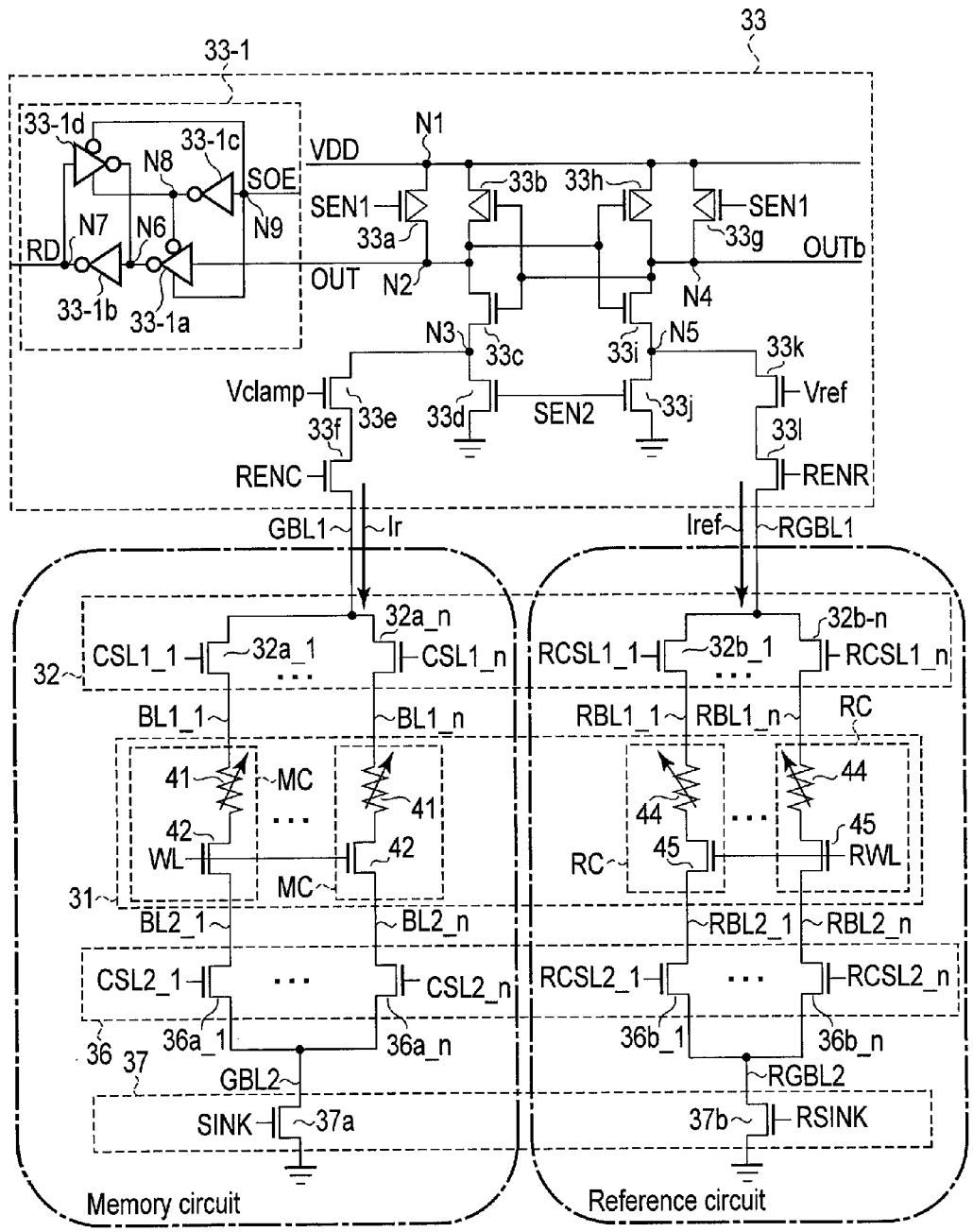
F I G. 5

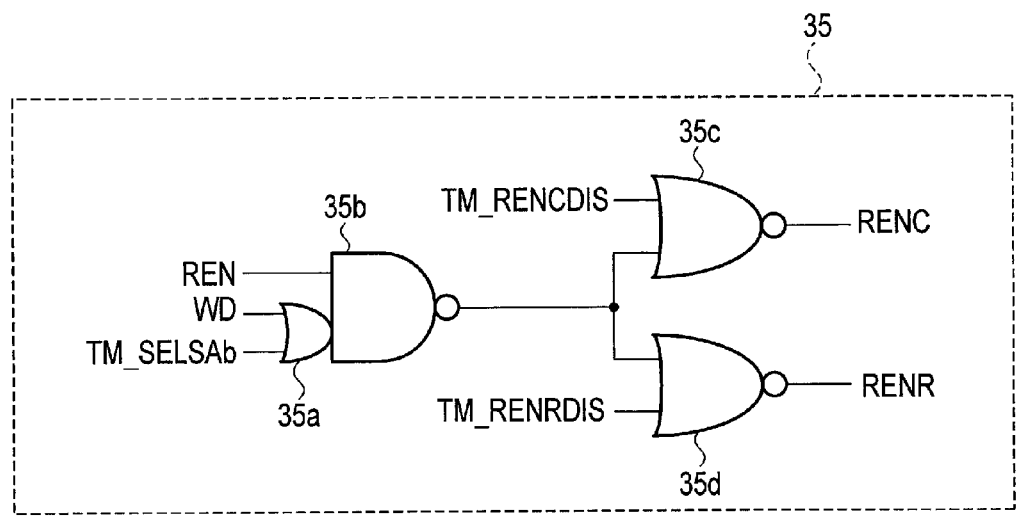
F I G. 6

| | TM_SELSAb | TM_RENCDIS | TM_RENRDIS | WD | REN | RENC | RENR |
|---|---|---|---|---|---|---|---|
| Operation 1 | H | L | L | X | L/H | L/H | L/H |
| Operation 2, 3, 4 for unselected S/A | L | X | X | L | X | L | L |
| Operation 2 for selected S/A | L | L | L | H | L/H | L/H | L/H |
| Operation 3 for selected S/A | L | L | H | H | L/H | L/H | L |
| Operation 4 for selected S/A | L | H | L | H | L/H | L | L/H |

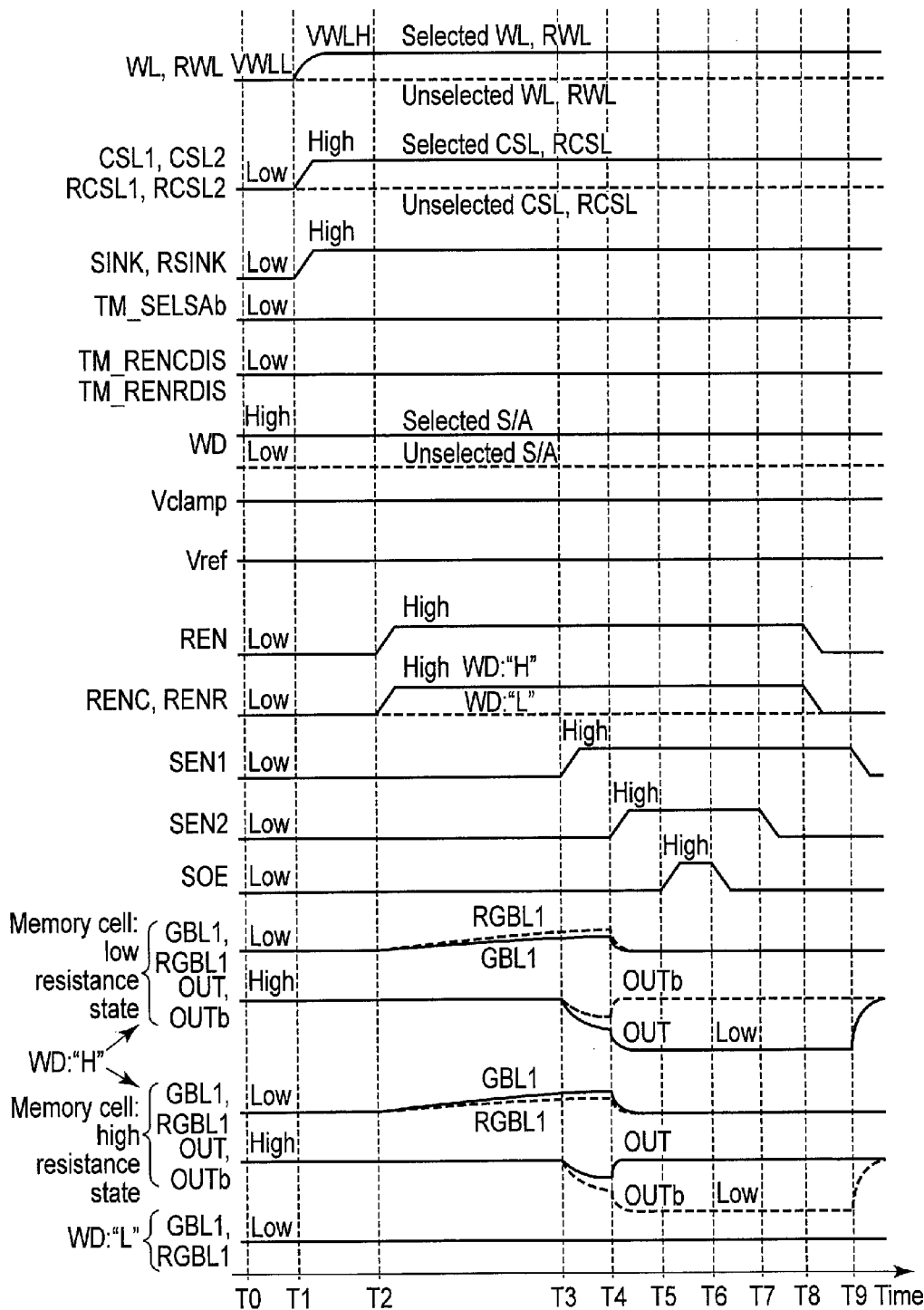
F I G. 9

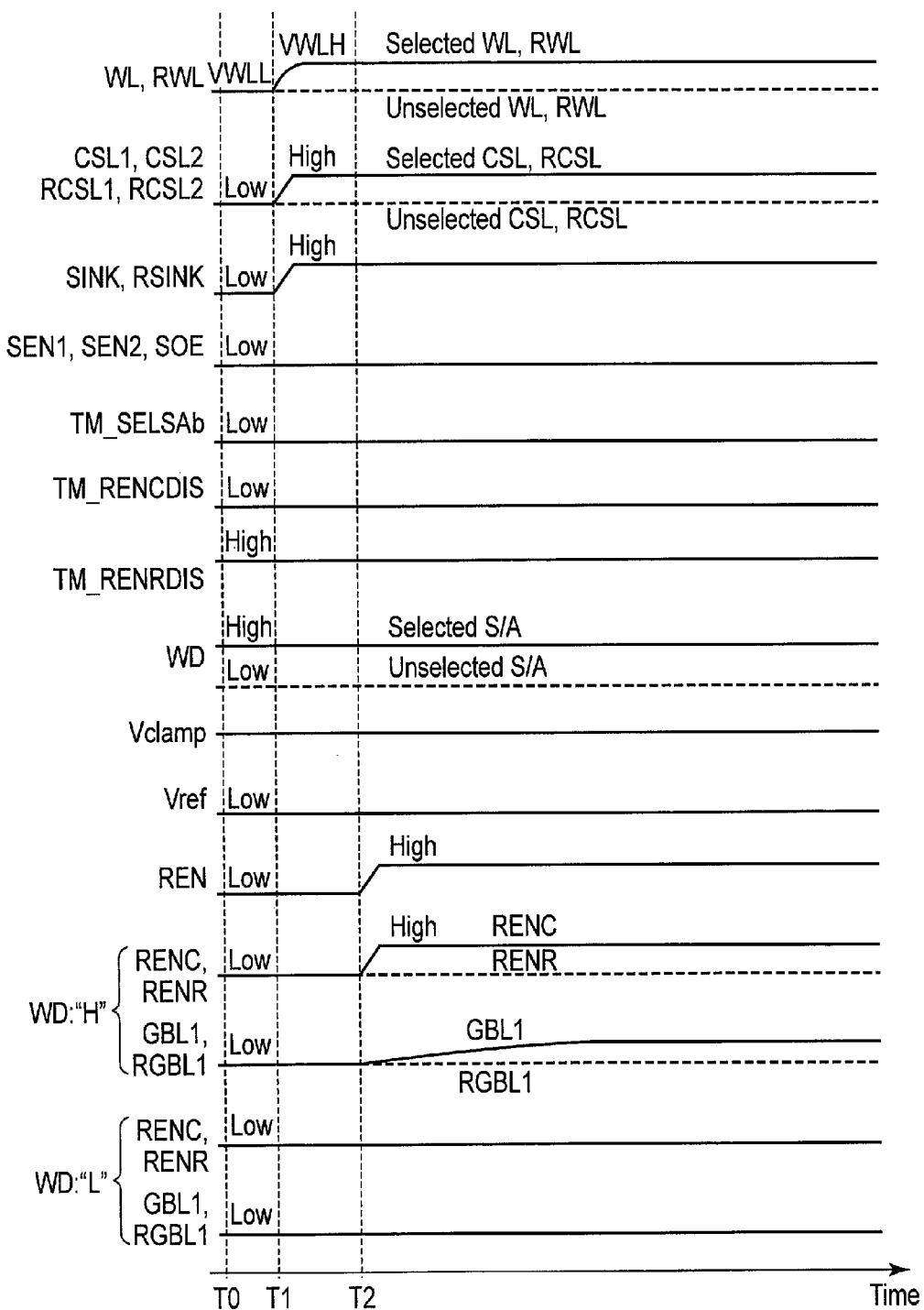
F I G. 10

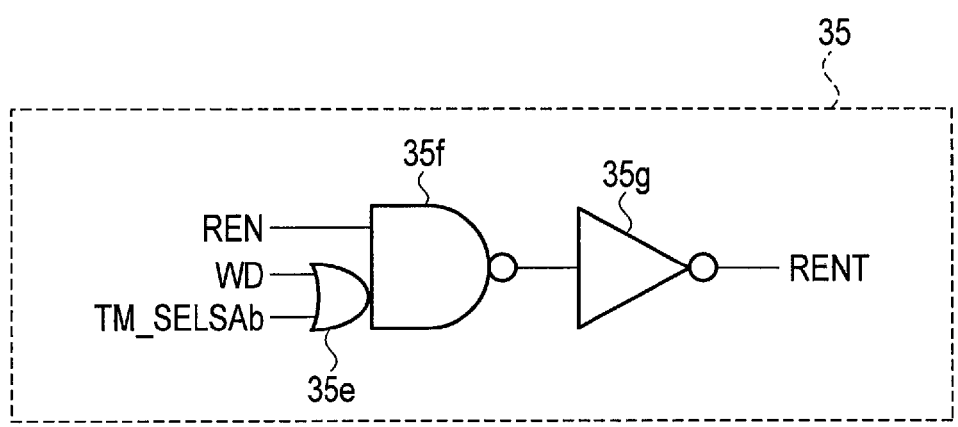
F I G. 12

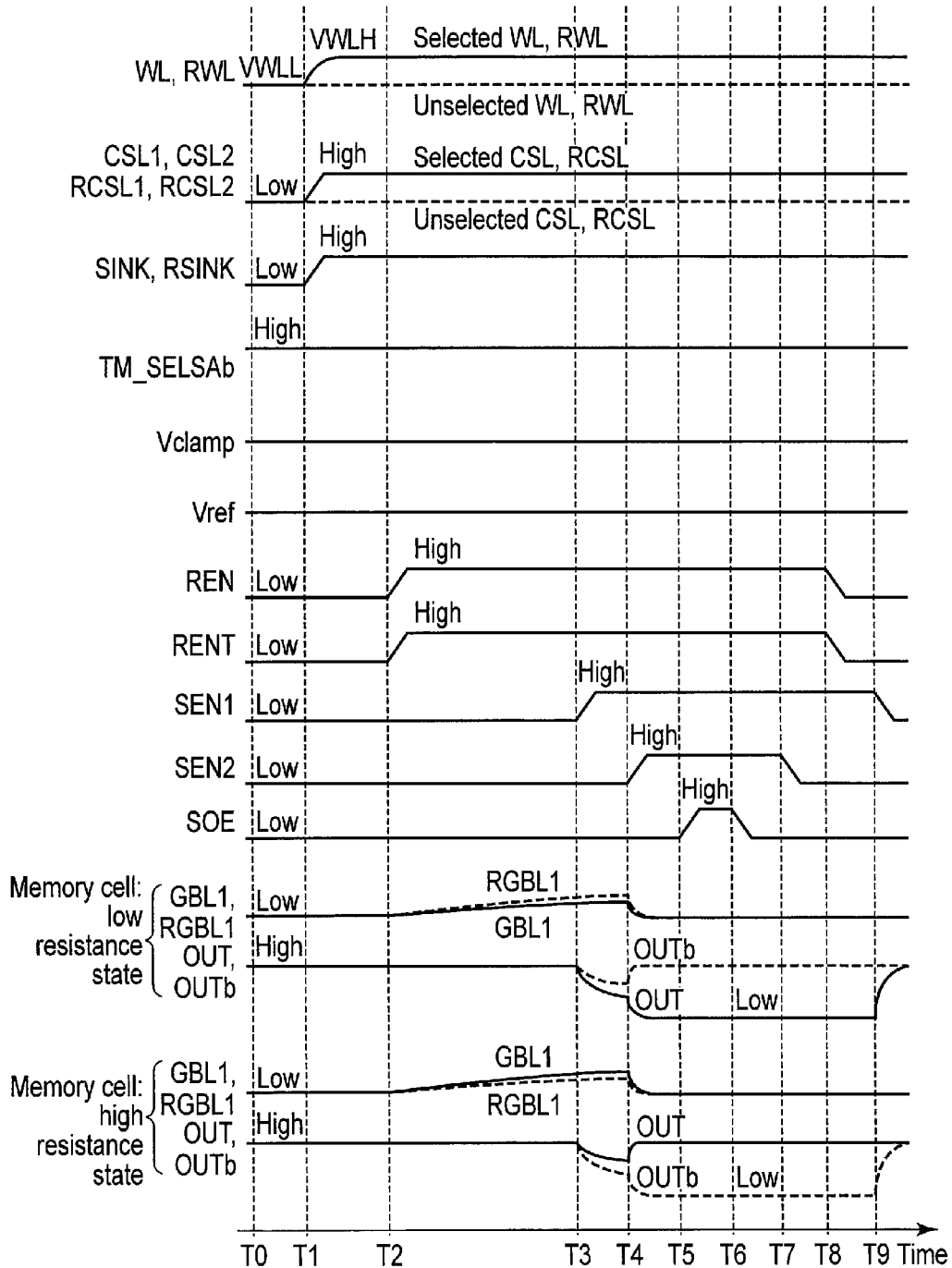
F I G. 13

|  | TM_SELSAb | WD | REN | RENT |
|---|---|---|---|---|
| Operation 1 | H | X | L/H | L/H |
| Operation 2,3,4 for unselected S/A | L | L | X | L |
| Operation 2,3,4 for selected S/A | L | H | L/H | L/H |

X:"L" or "H"

F I G. 14

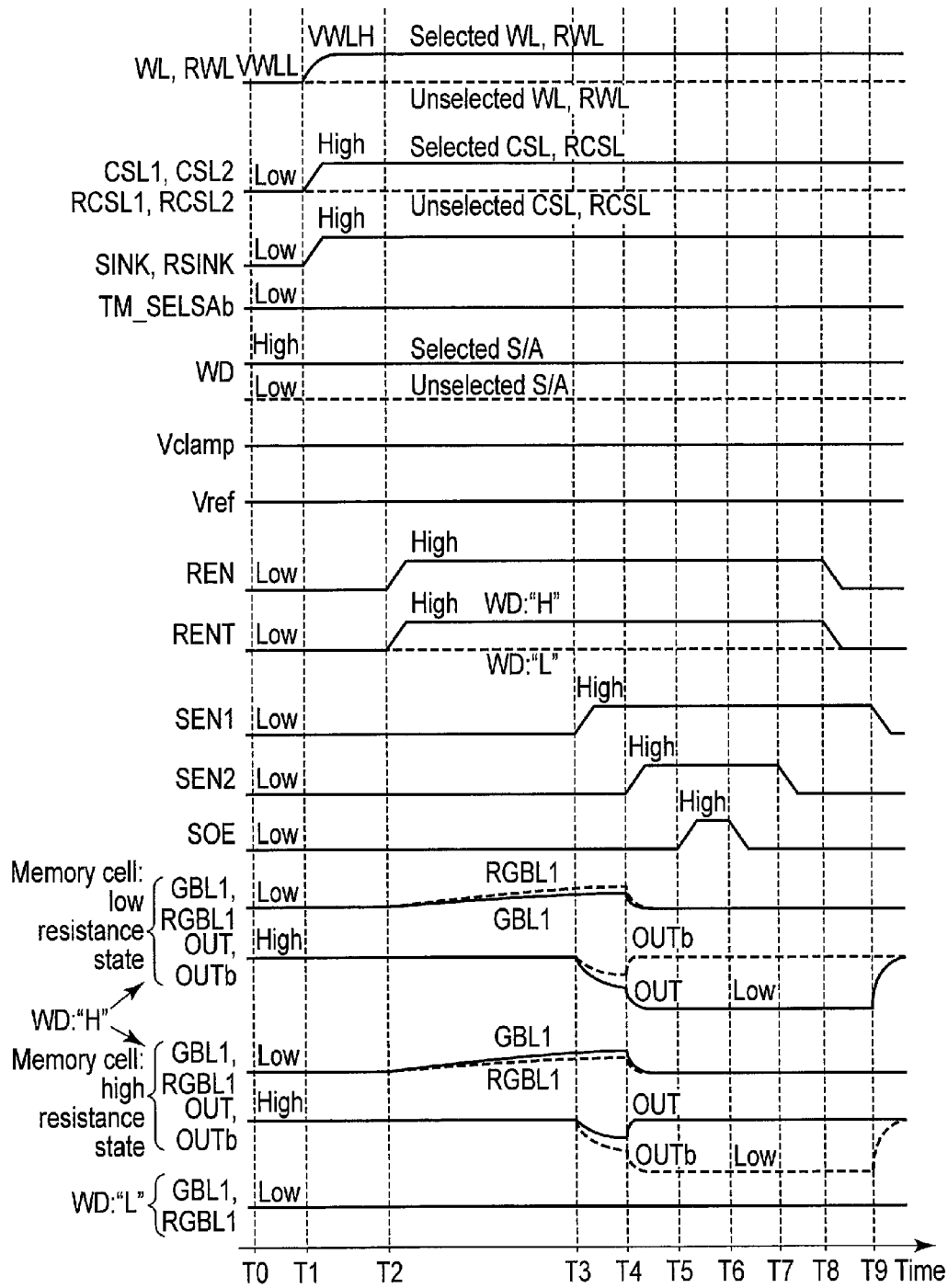
F I G. 15

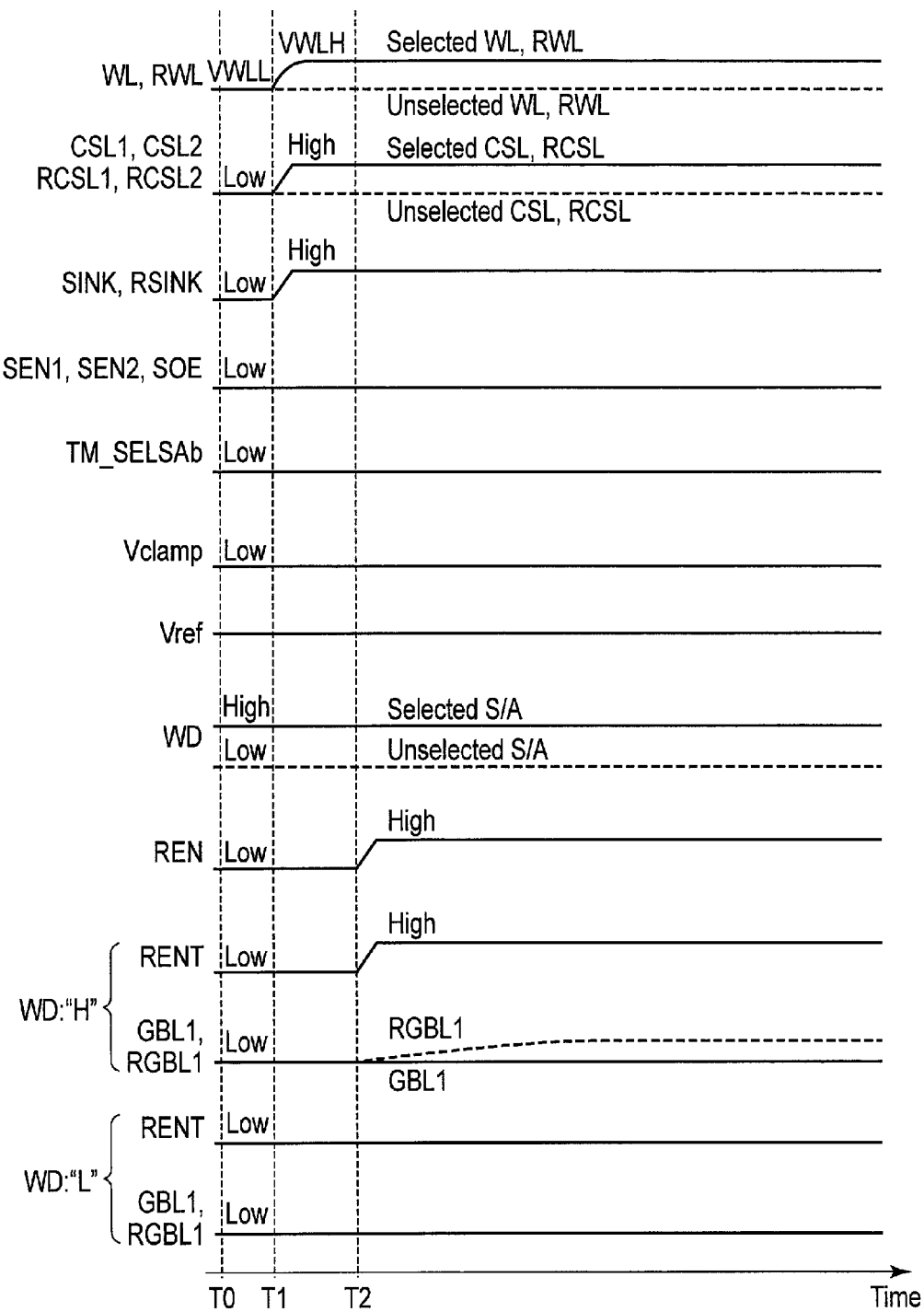
F I G. 17

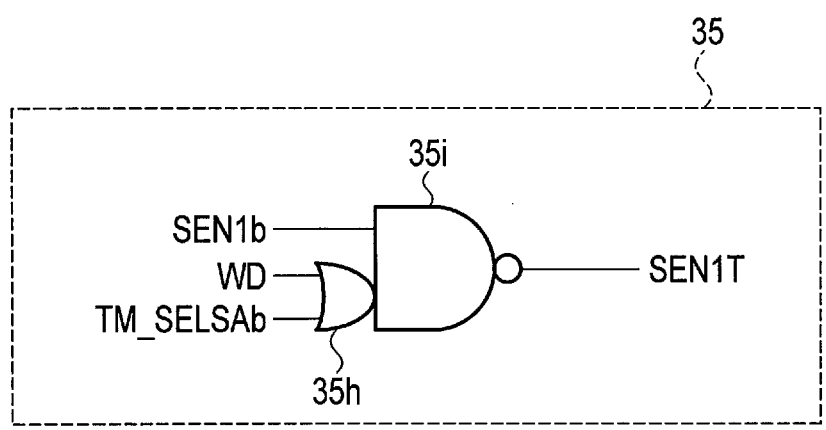
F I G. 18

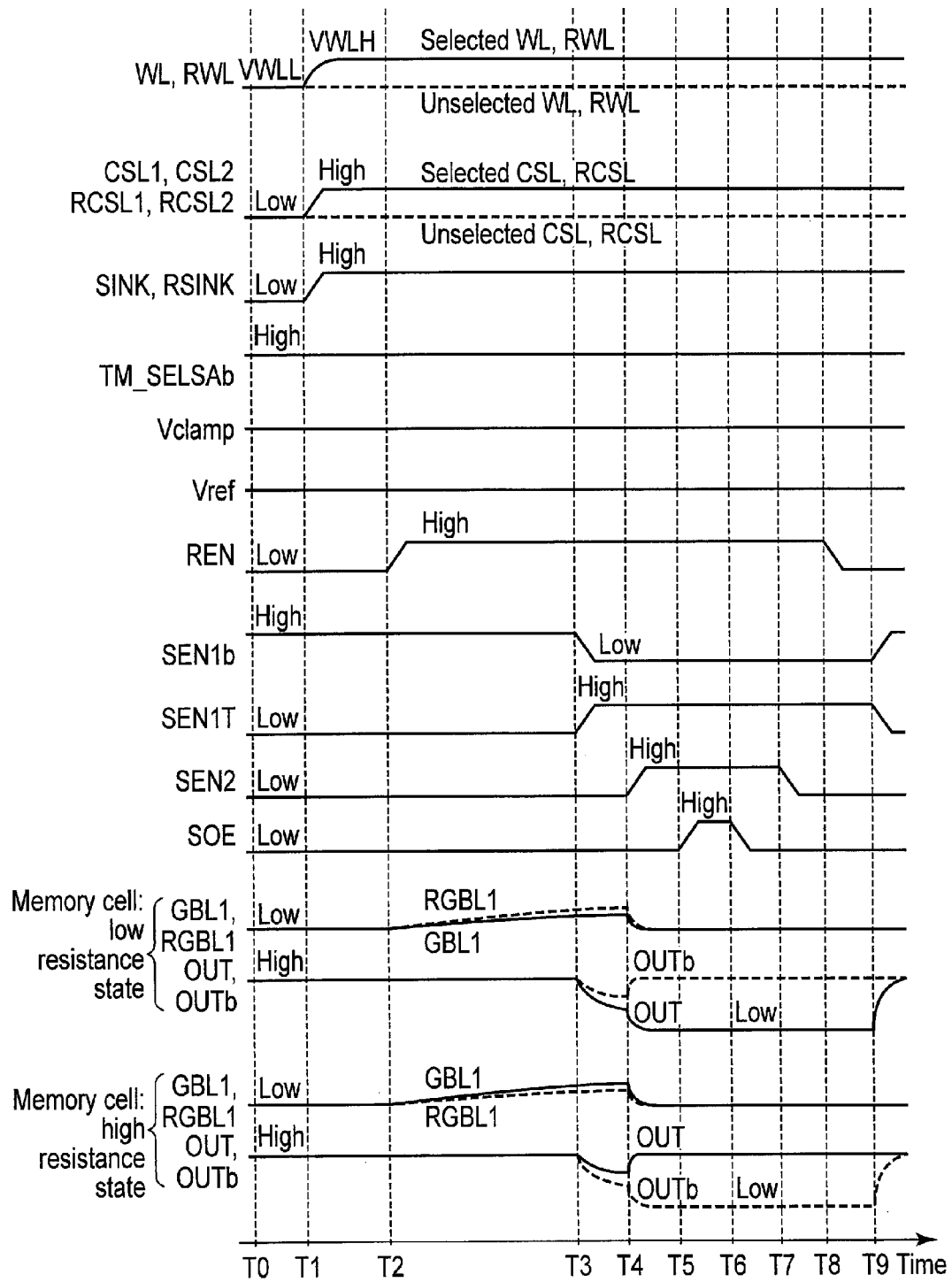
F I G. 19

|  | TM_SELSAb | WD | SEN1b | SEN1T |
|---|---|---|---|---|
| Operation 1 | H | X | H/L | L/H |
| Operation 2,3,4 for unselected S/A | L | L | X | H |
| Operation 2,3,4 for selected S/A | L | H | H/L | L/H |

X: "L" or "H"

F I G. 20

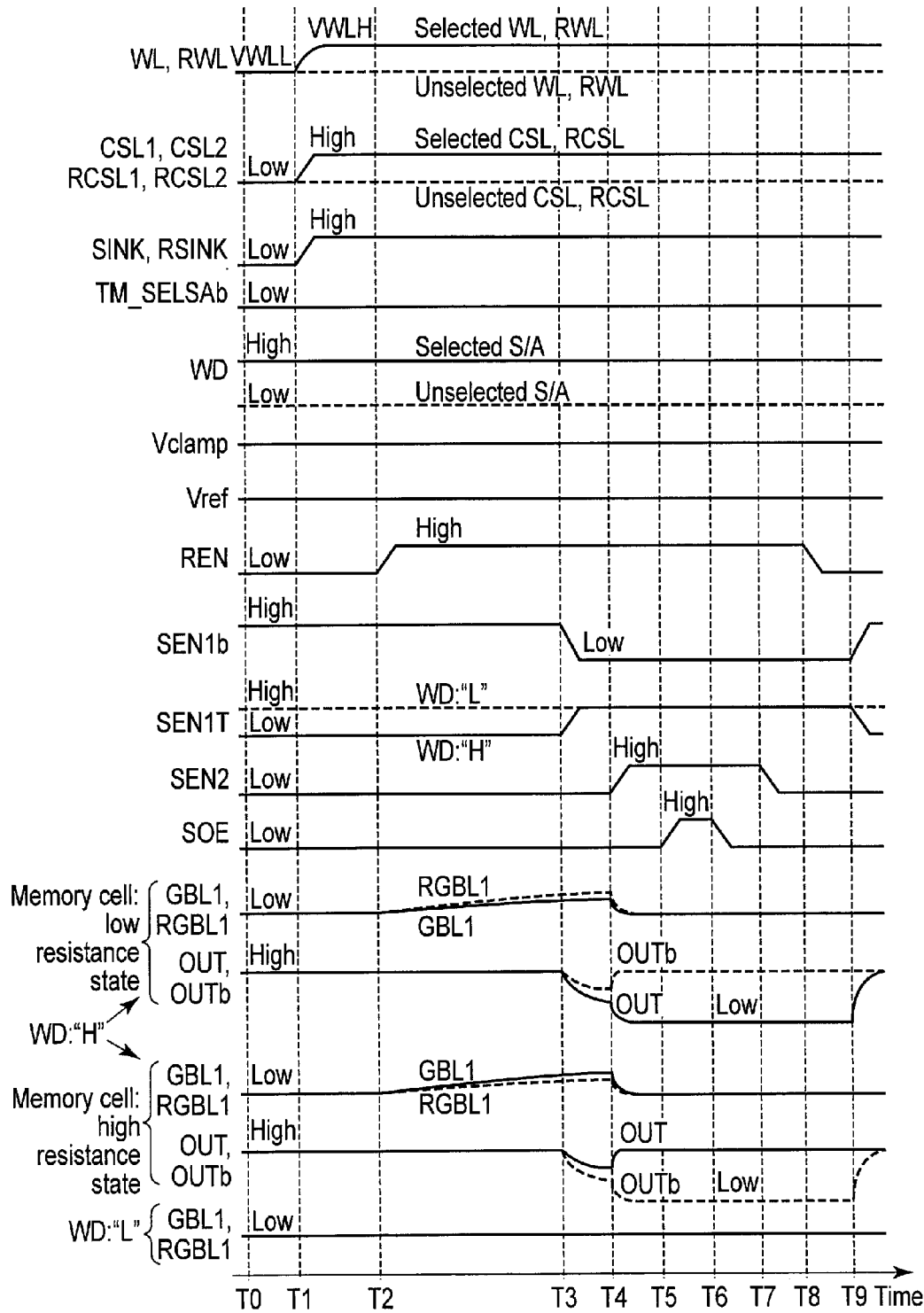
F I G. 21

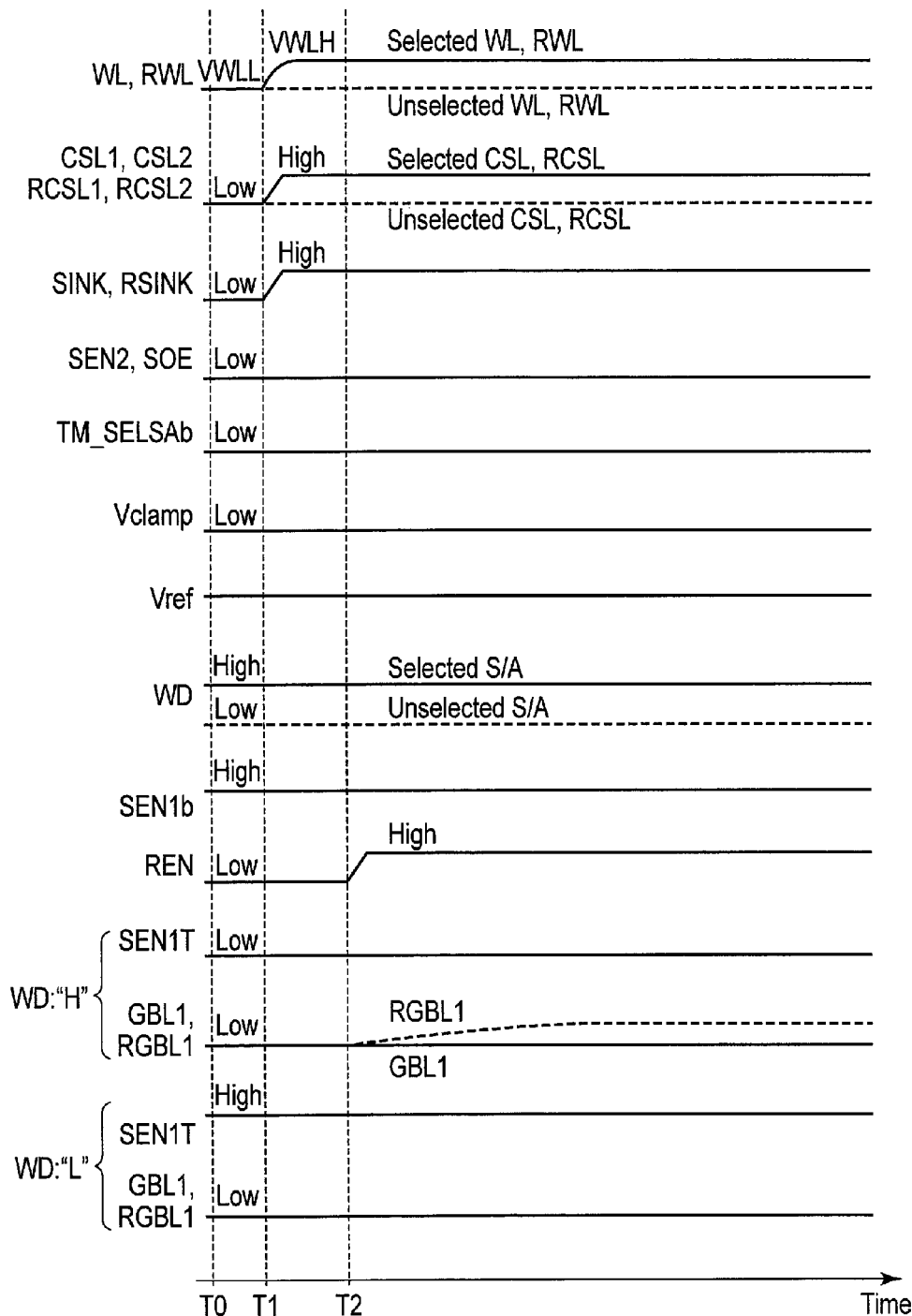
F I G. 23

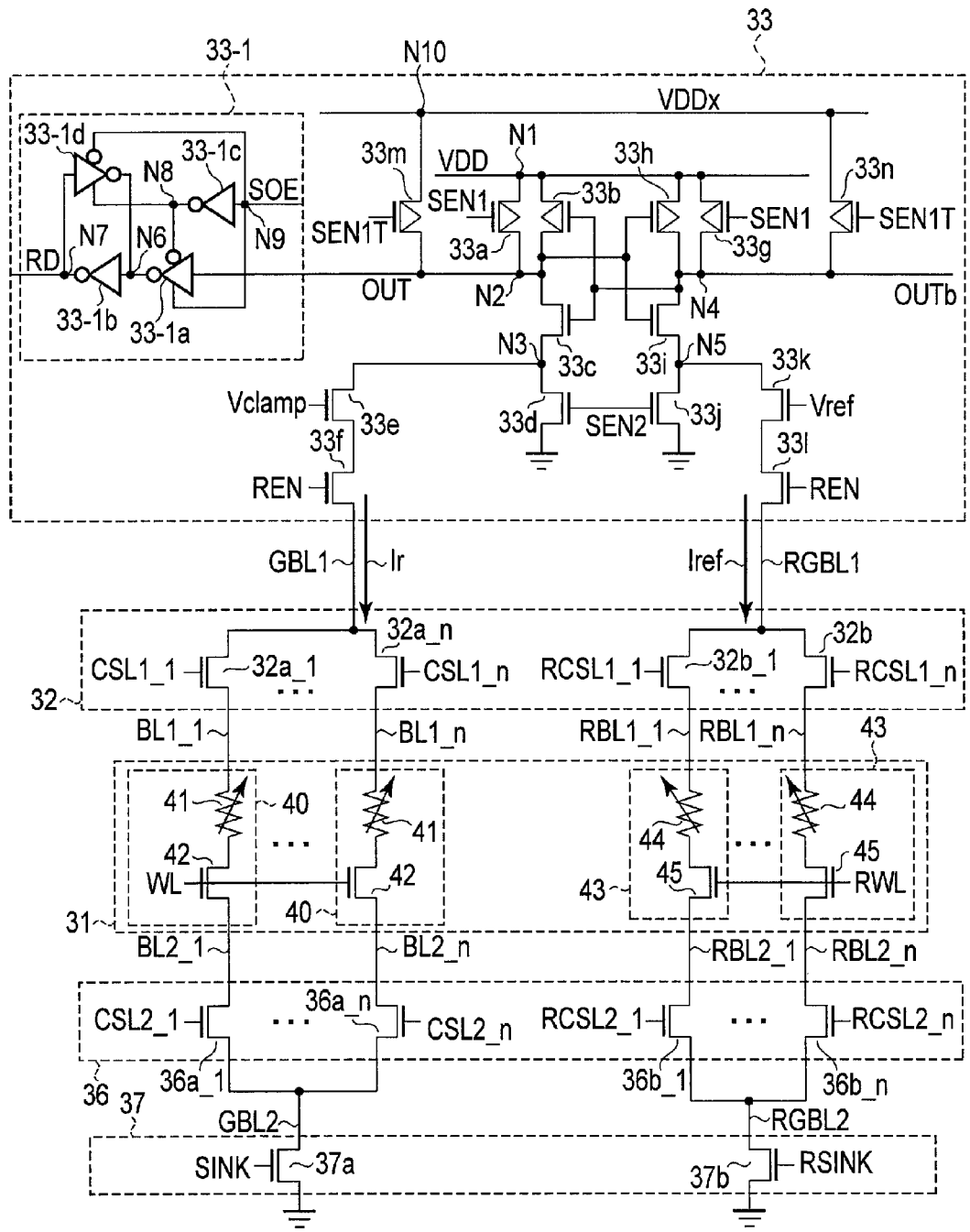
F I G. 24

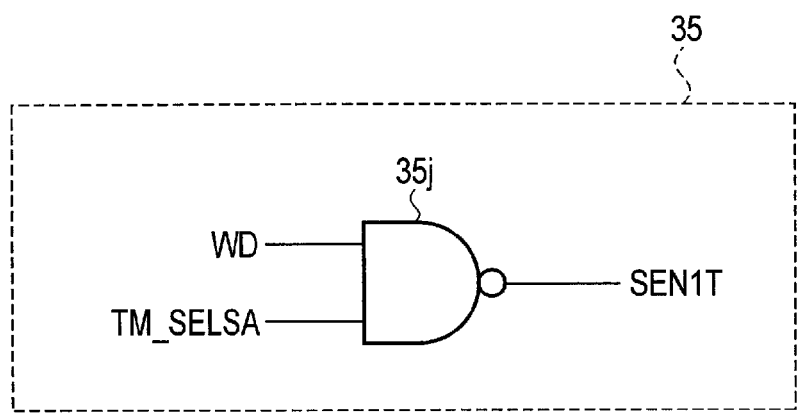
F I G. 25

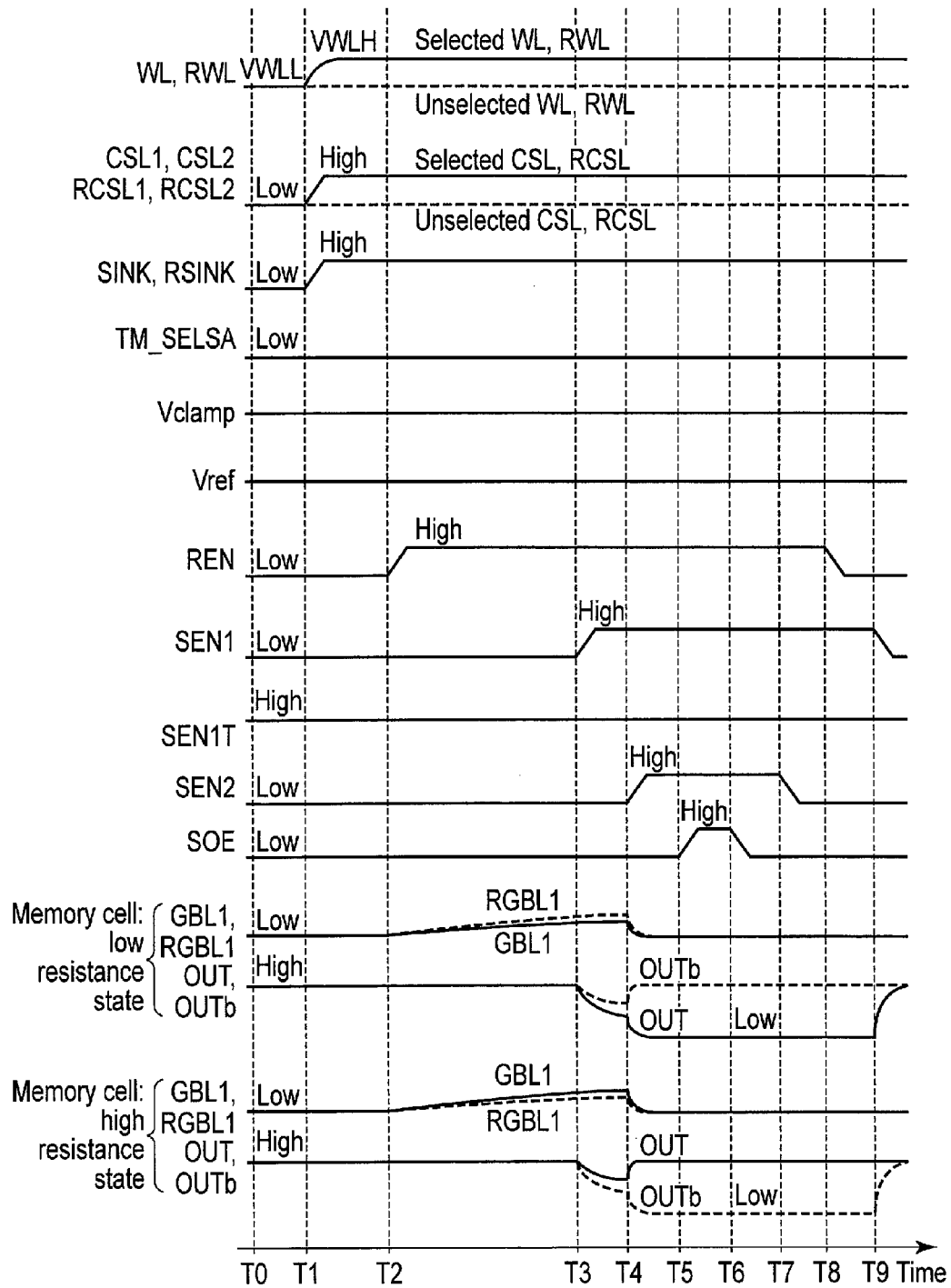
F I G. 26

|  | TM_SELSA | WD | SEN1T |
|---|---|---|---|
| Operation 1 | L | X | H |
| Operation 3,4 for unselected S/A | H | L | H |
| Operation 3,4 for selected S/A | H | H | L |

X:"L" or "H"

F I G. 27

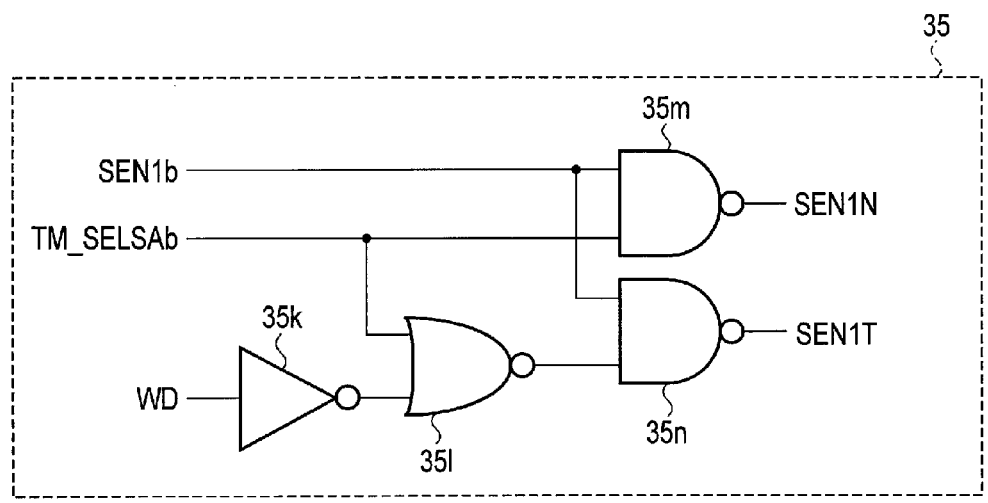
F I G. 30

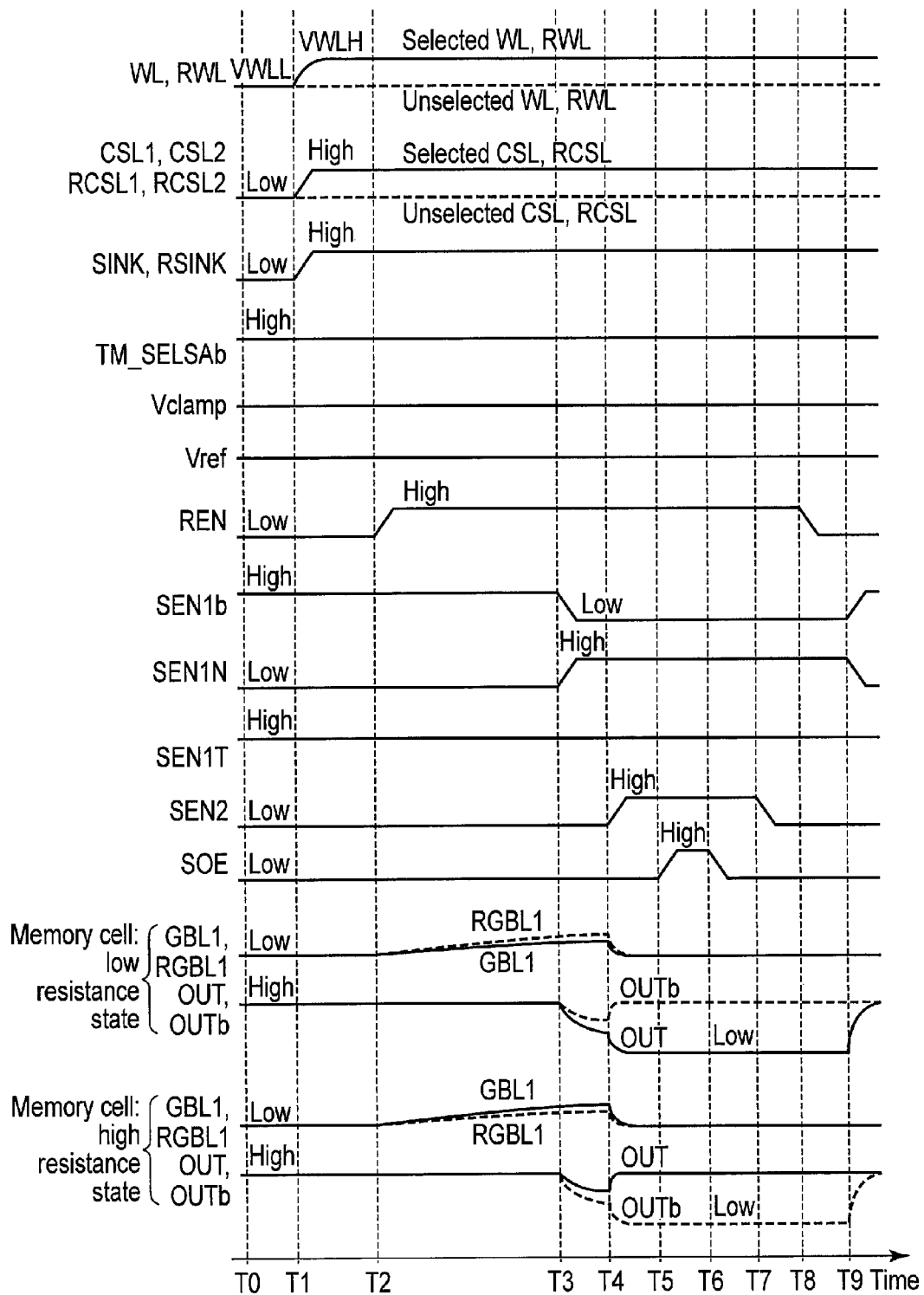
F I G. 31

|  | TM_SELSAb | SEN1b | WD | SEN1N | SEN1T |
|---|---|---|---|---|---|
| Operation 1 | H | H/L | X | L/H | H |
| Operation 2,3,4 for unselected S/A | L | X | L | H | H |
| Operation 2,3,4 for selected S/A | L | H/L | H | L | L/H |

X: "L" or "H"

F I G. 32

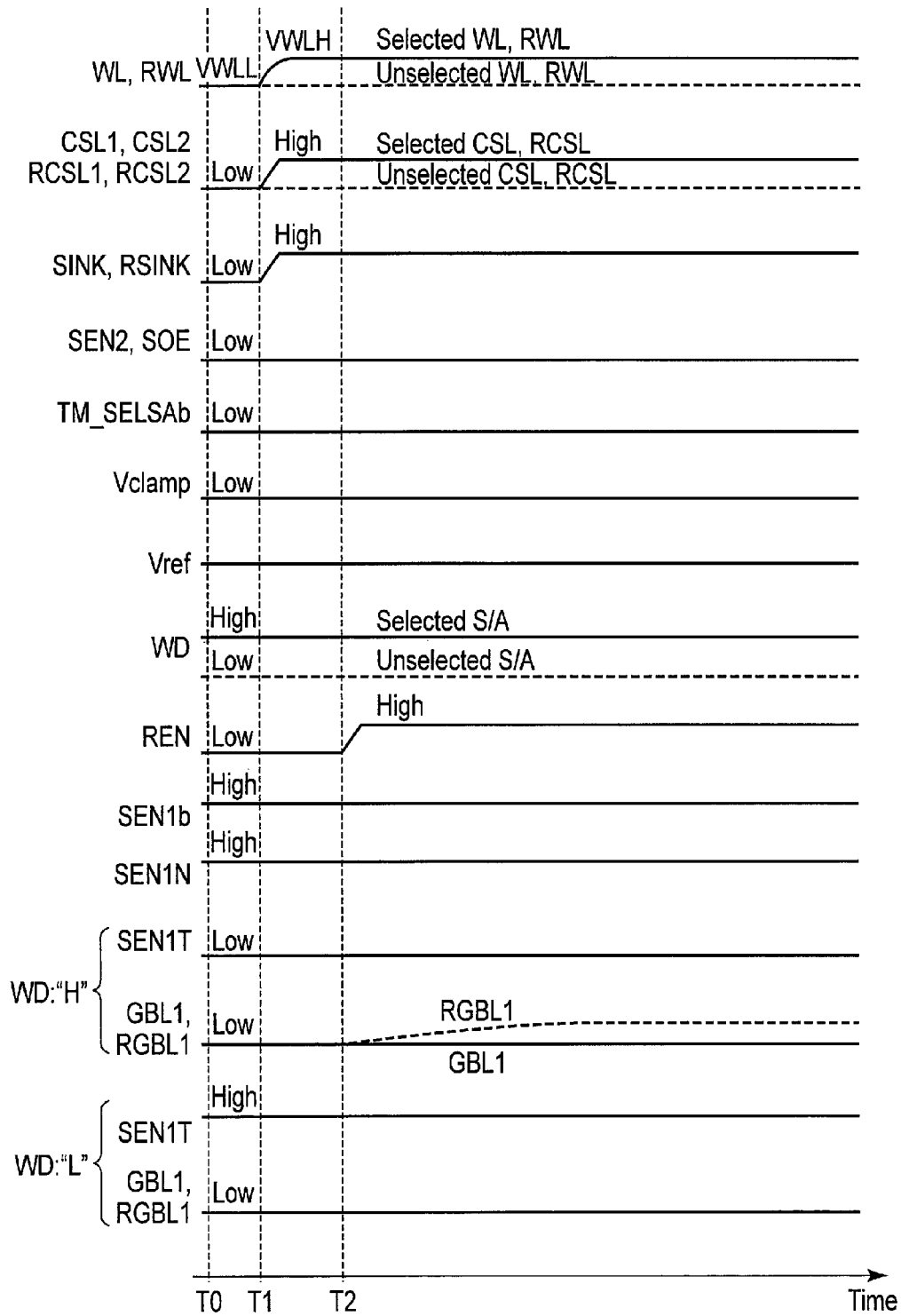
F I G. 35

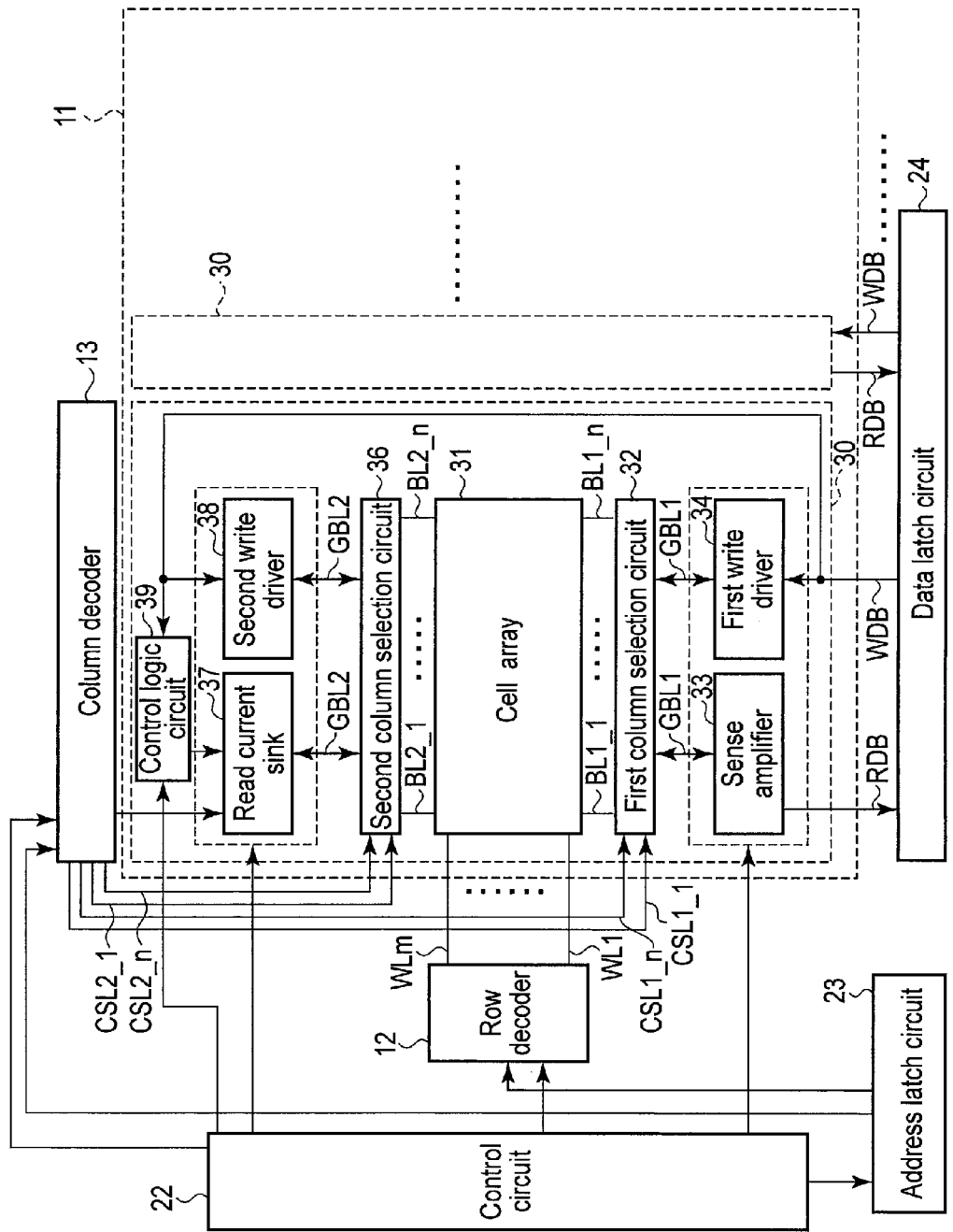
F I G. 36

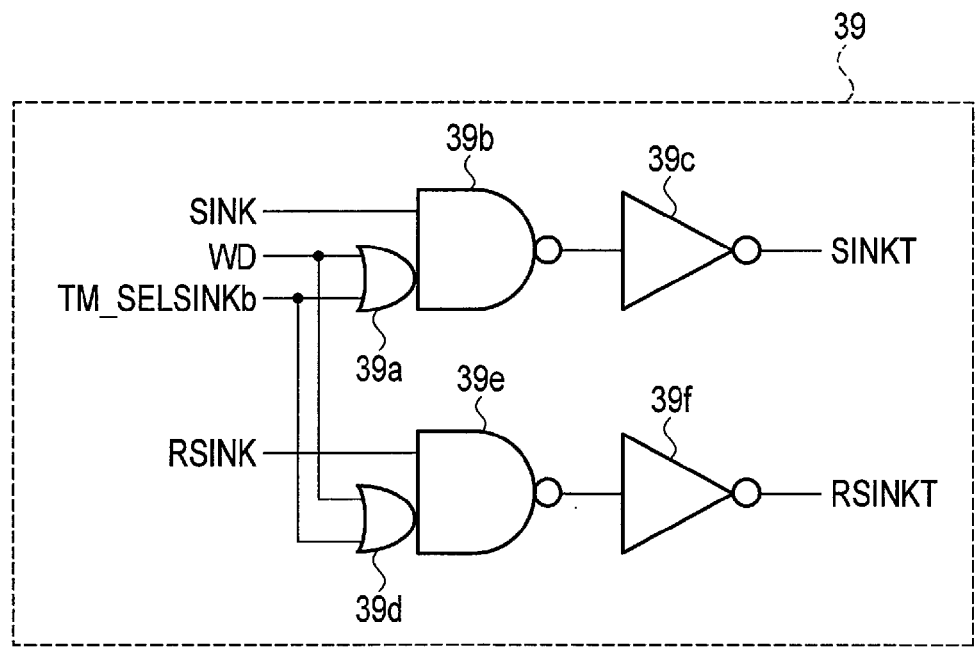
F I G. 37

| | TM_SELSINKb | WD | SINK | RSINK | SINKT | RSINKT |
|---|---|---|---|---|---|---|
| Operation 1 | H | X | L/H | L/H | L/H | L/H |
| Operation 2, 3, 4 for unselected S/A | L | L | X | X | L | L |
| Operation 2 for selected S/A | L | H | L/H | L/H | L/H | L/H |
| Operation 3 for selected S/A | L | H | L/H | L | L/H | L |
| Operation 4 for selected S/A | L | H | L | L/H | L | L/H |

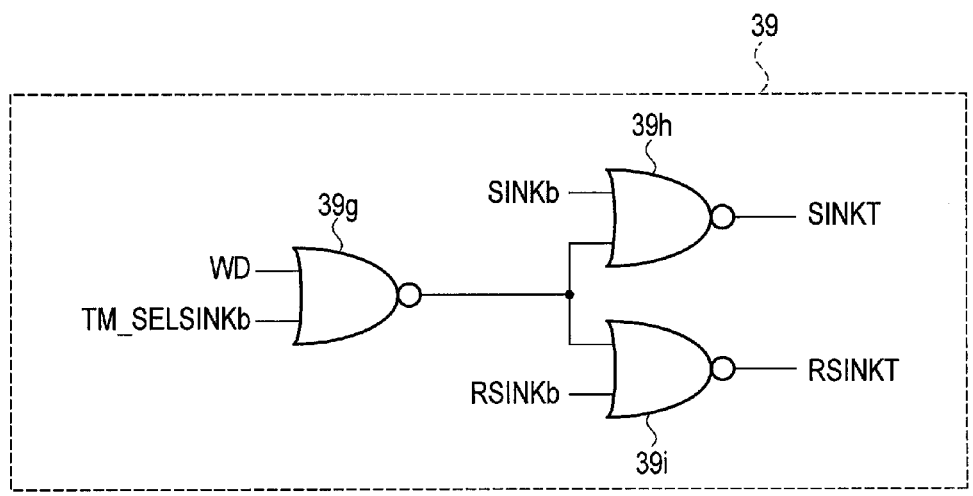
F I G. 43

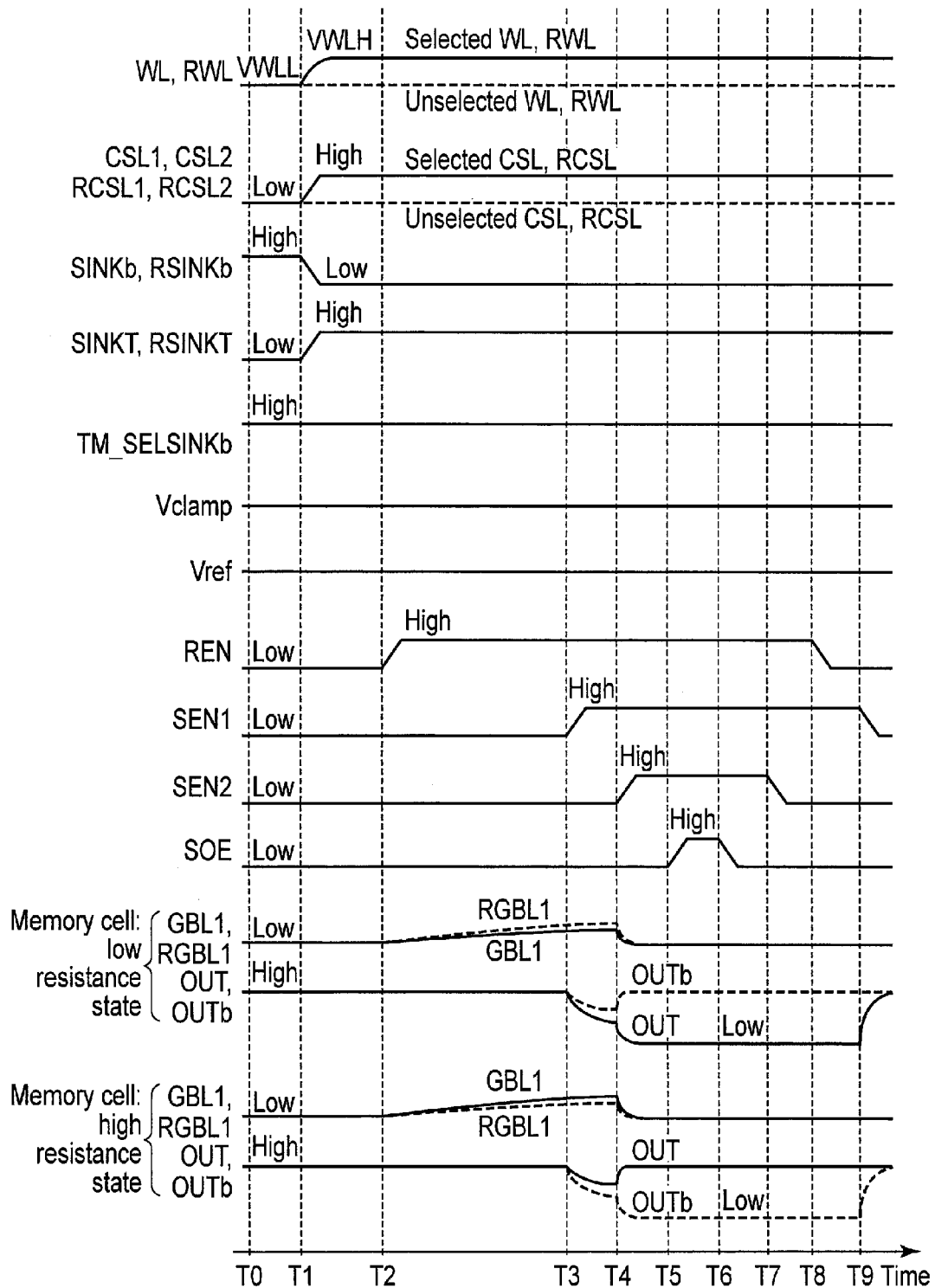
F I G. 44

|  | TM_SELSINKb | WD | SINKb | RSINKb | SINKT | RSINKT |
|---|---|---|---|---|---|---|
| Operation 1 | H | X | H/L | H/L | L/H | L/H |
| Operation 2, 3, 4 for unselected S/A | L | L | X | X | L | L |
| Operation 2 for selected S/A | L | H | H/L | H/L | L/H | L/H |
| Operation 3 for selected S/A | L | H | H | H | L/H | L |
| Operation 4 for selected S/A | L | H | H/L | H/L | L | L/H |

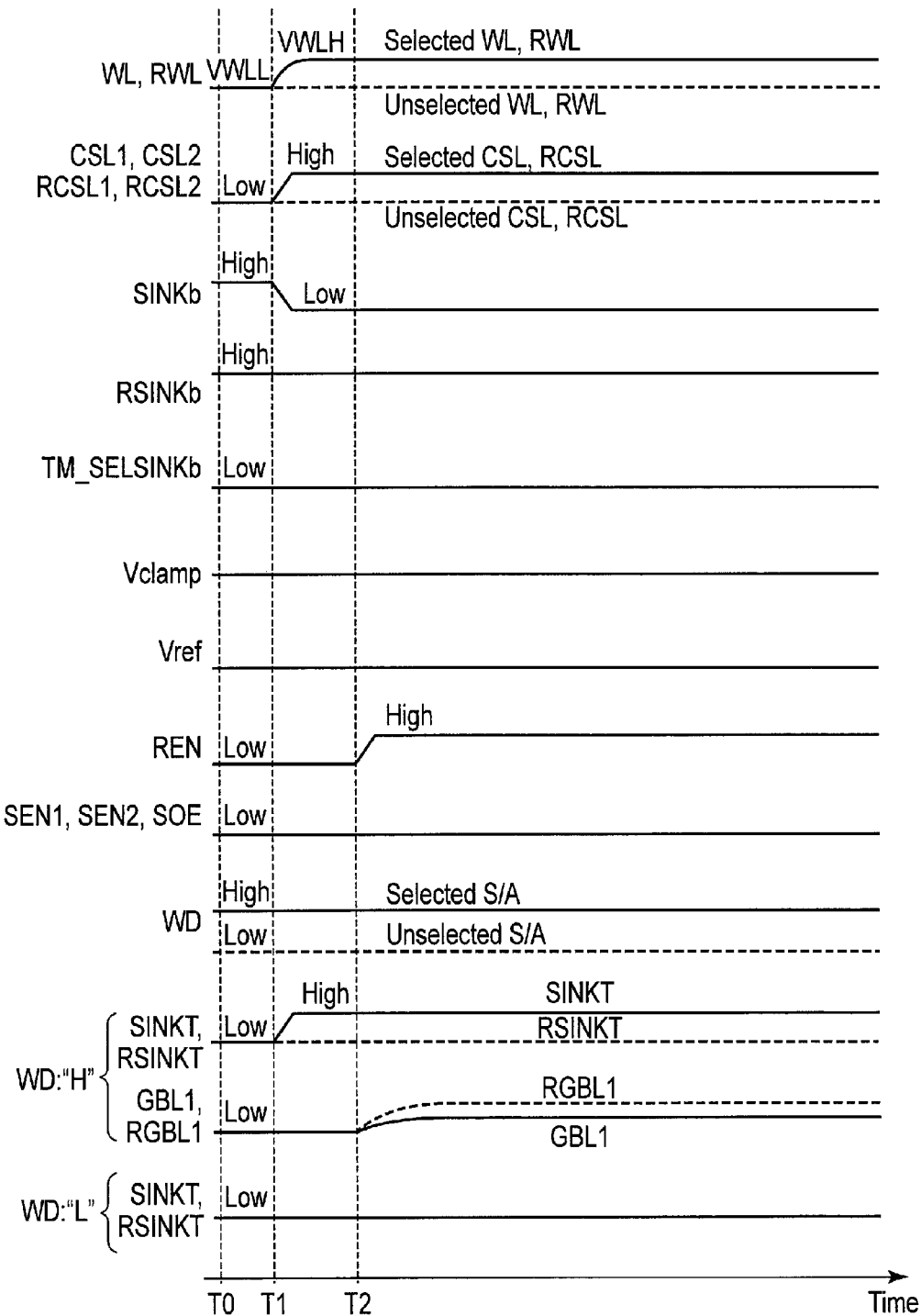
F I G. 47

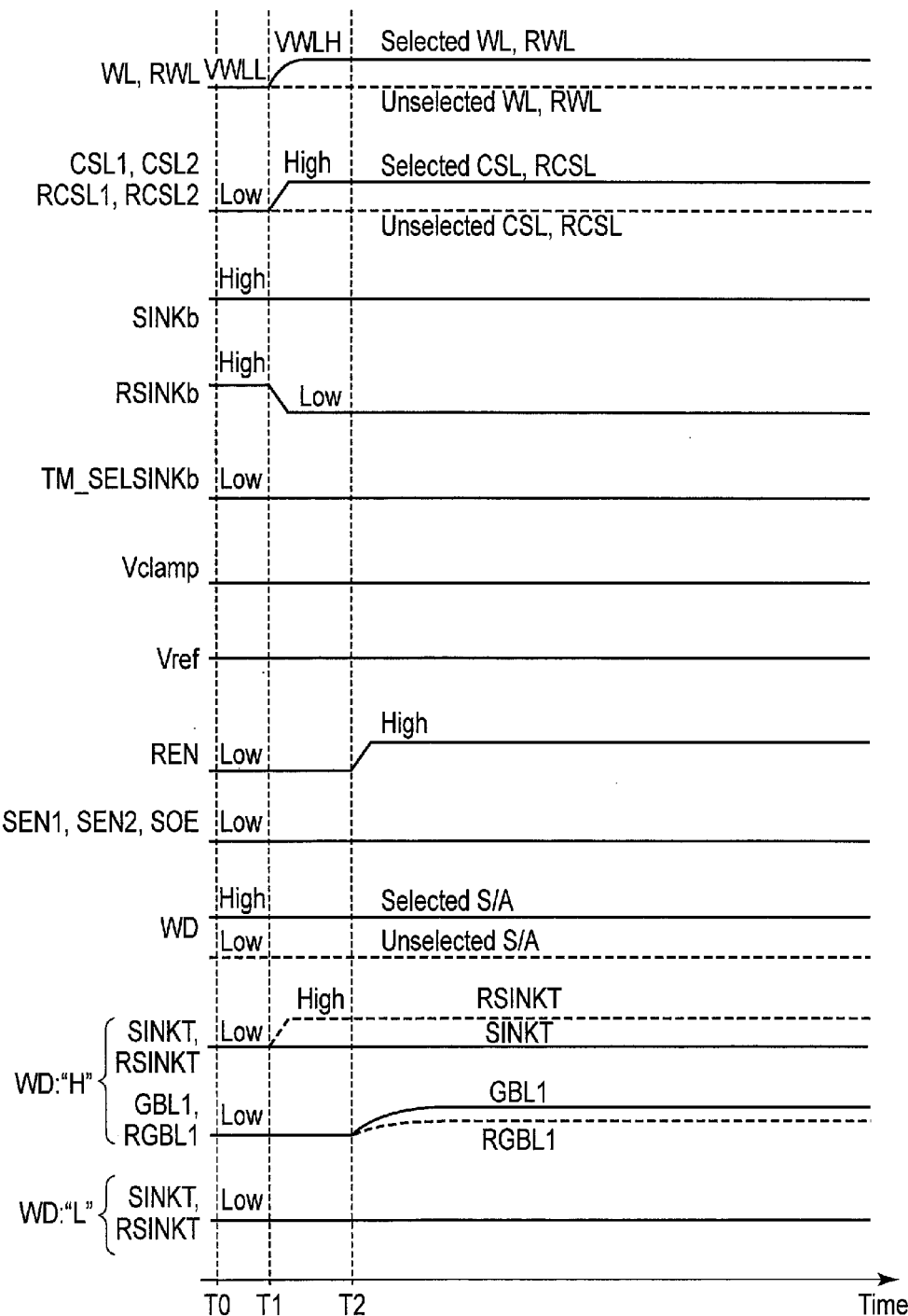
F I G. 48

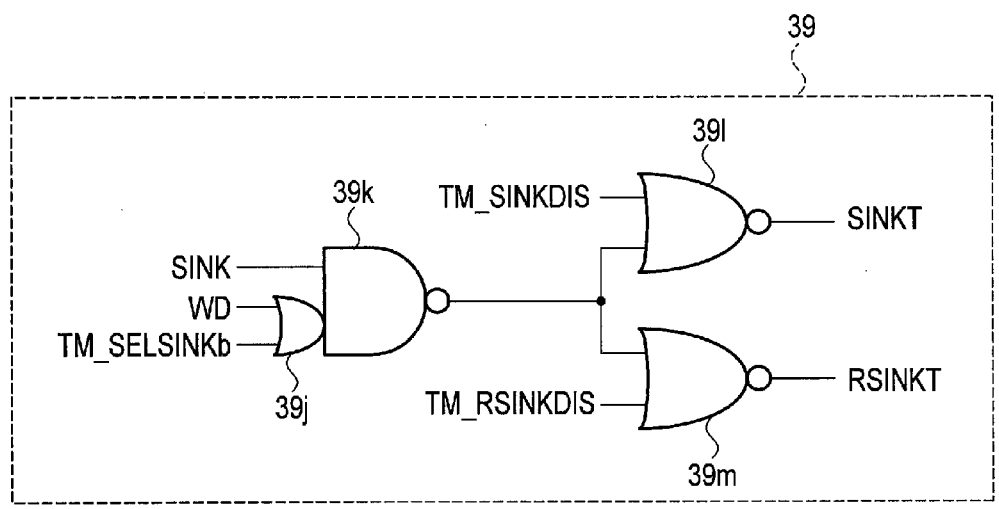
F I G. 49

|  | TM_SELSINKb | TM_SINKDIS | TM_RSINKDIS | WD | SINK | SINKT | RSINKT |
|---|---|---|---|---|---|---|---|
| Operation 1 | H | L | L | X | L/H | L/H | L/H |
| Operation 2 for unselected S/A | L | X | X | L | X | L | L |
| Operation 2 for selected S/A | L | L | L | H | L/H | L/H | L/H |
| Operation 3 for selected S/A | L | L | H | H | L/H | L/H | L |
| Operation 4 for selected S/A | L | H | L | H | L/H | L | L/H |

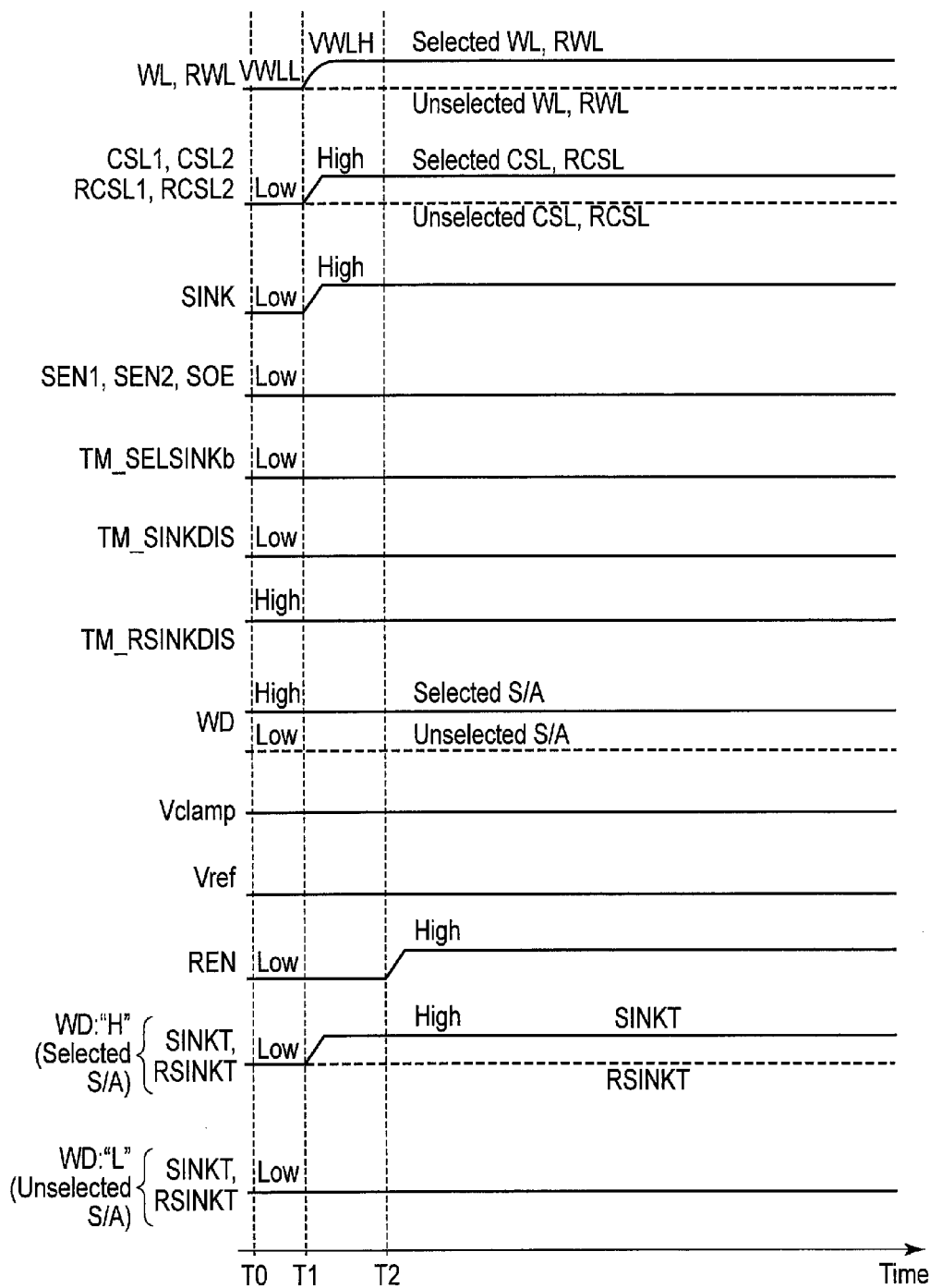
F I G. 53

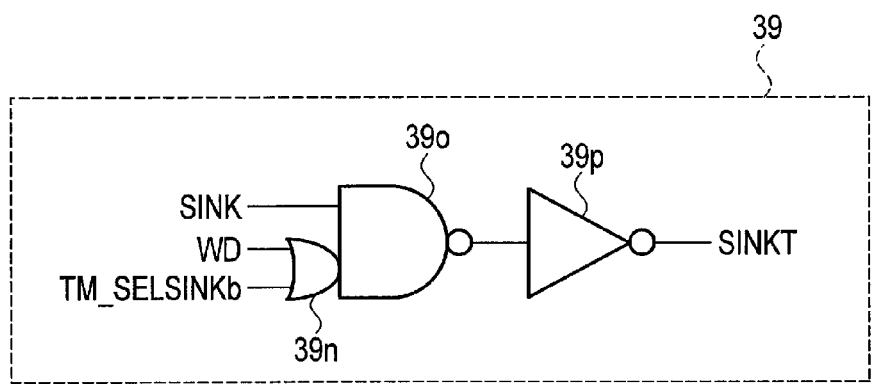
F I G. 55

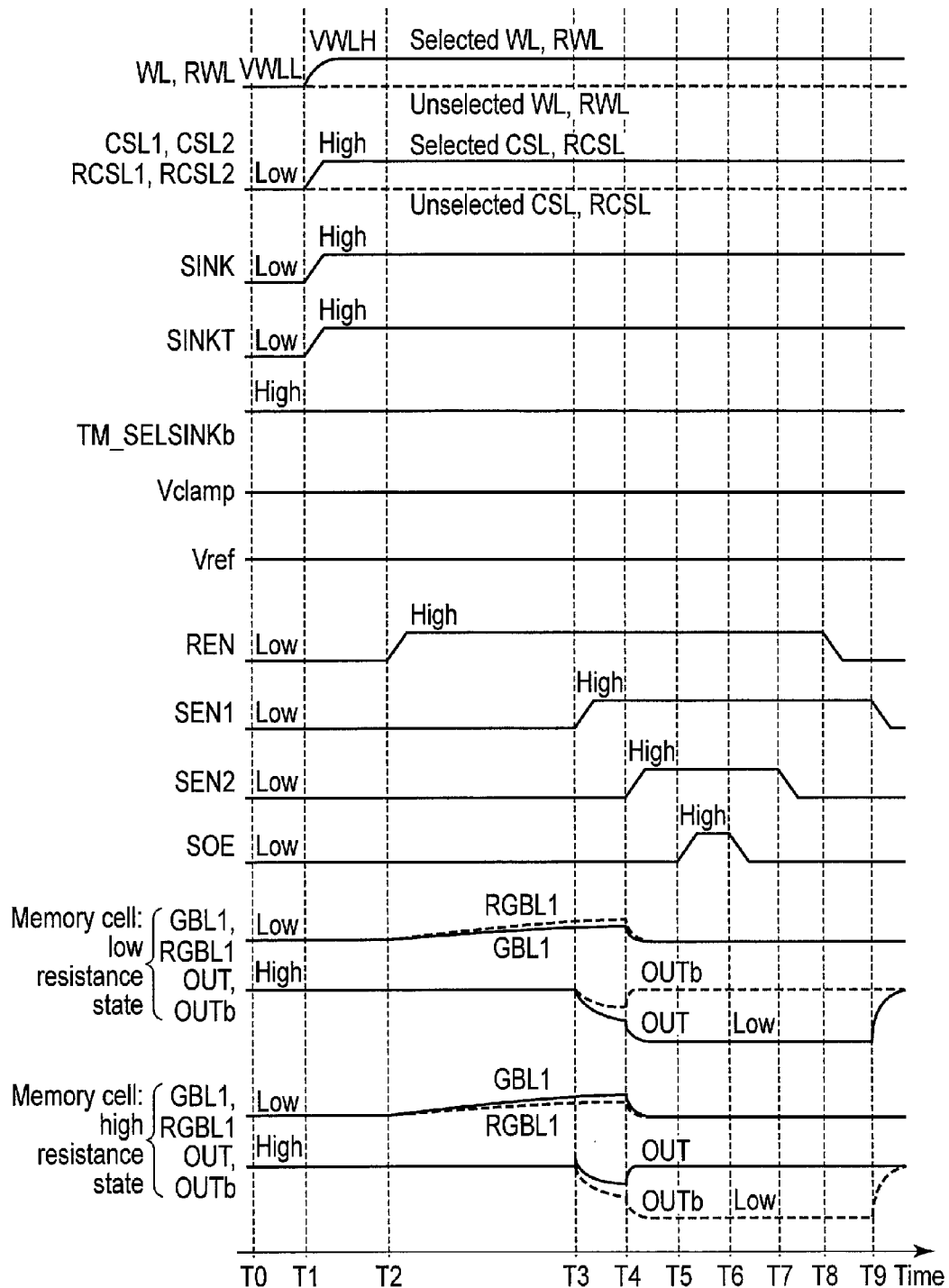
F I G. 56

|  | TM_SELSINKb | WD | SINK | SINKT |
|---|---|---|---|---|
| Operation 1 | H | X | L/H | L/H |
| Operation 2,3,4 for unselected S/A | L | L | X | L |
| Operation 2,3,4 for selected S/A | L | H | L/H | L/H |

X:"L" or "H"

F I G. 57

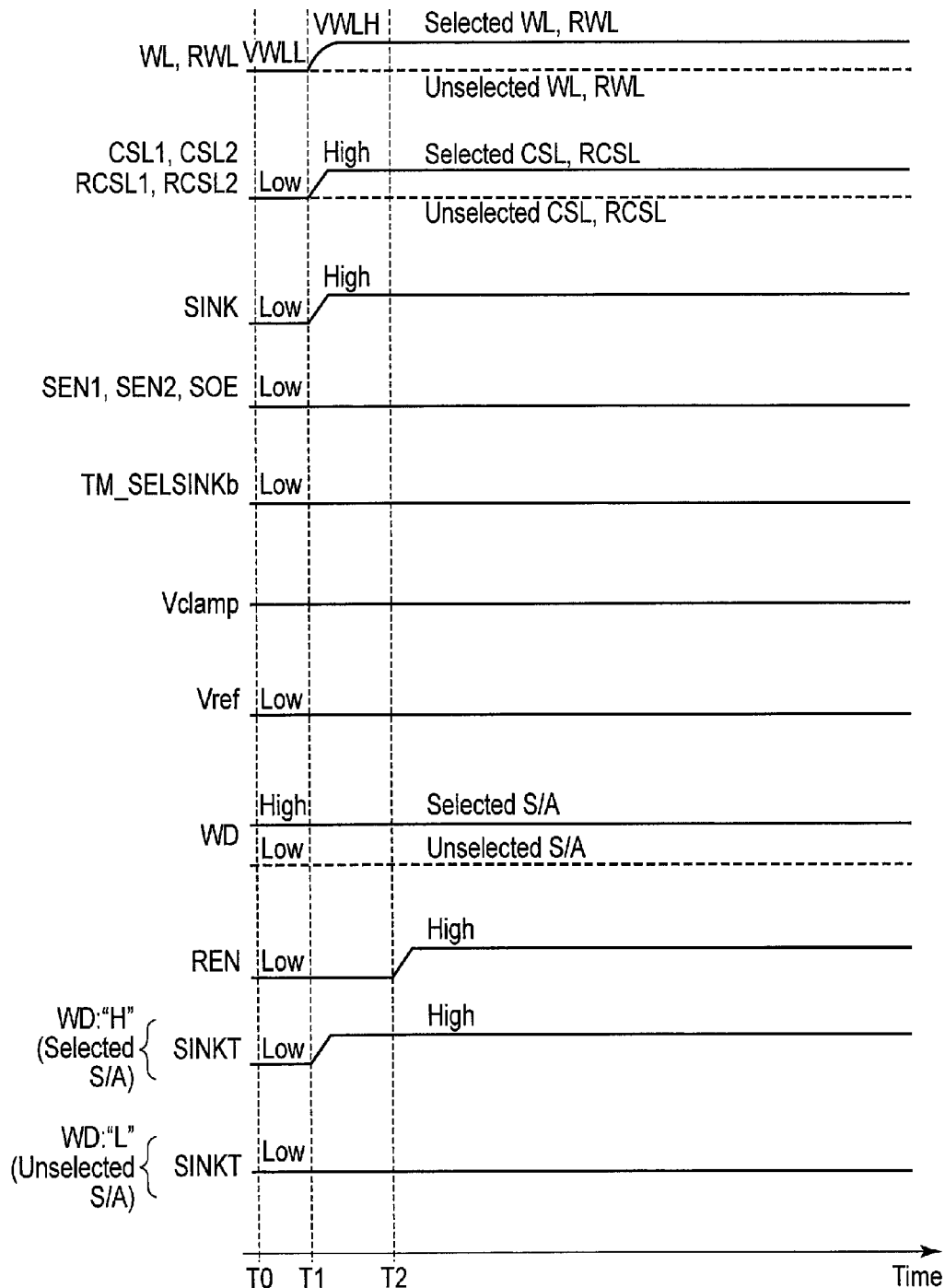
F I G. 59

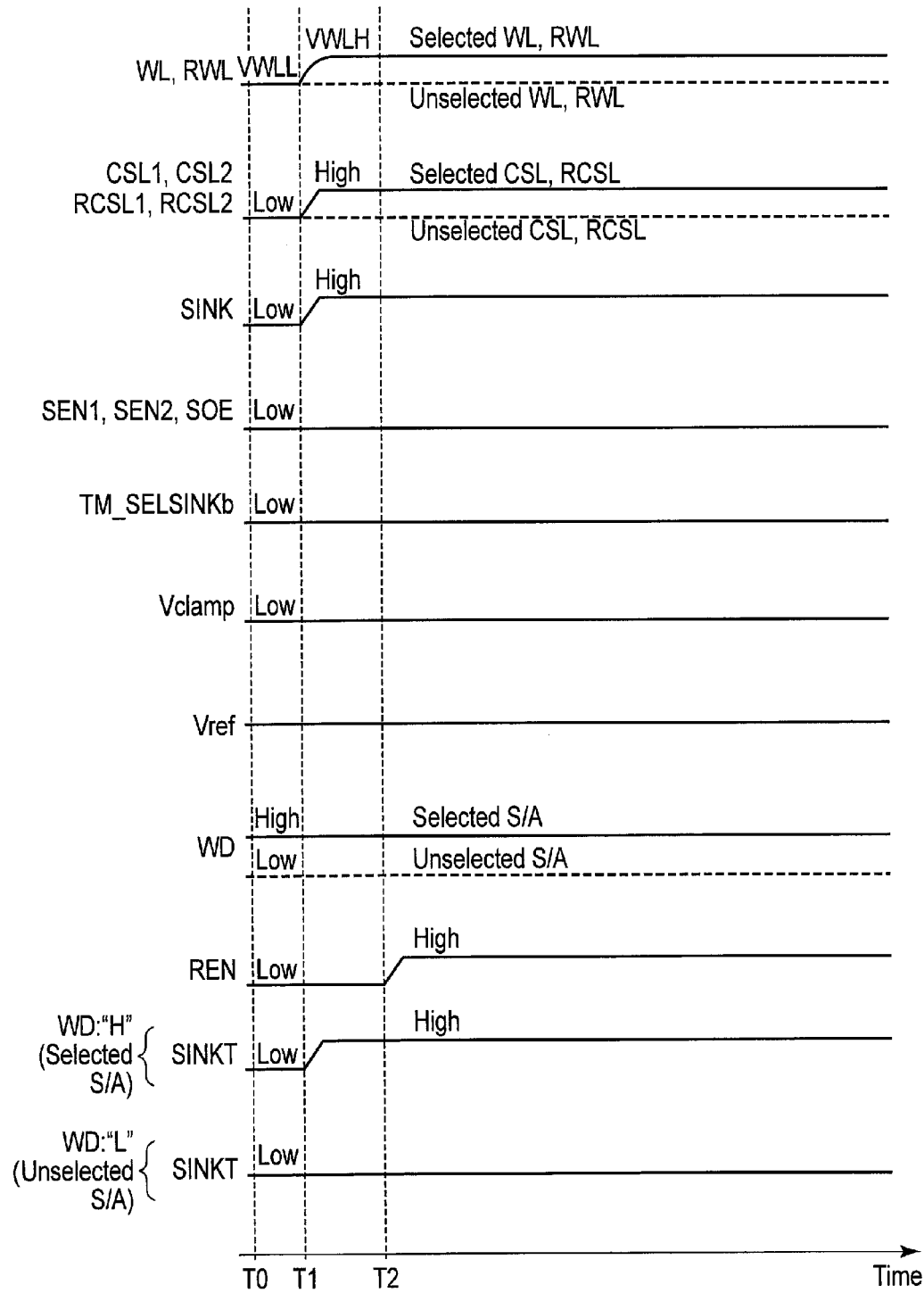
F I G. 60

F I G. 64

| | WEN | TM_SELWD1b | TM_SELWD2b | WD | PG1/NG1 | PG2/NG2 | 1st_GBL | 2nd_GBL |
|---|---|---|---|---|---|---|---|---|
| Operation 5 | L | X | X | X | H/L | H/L | - | - |
| Operation 6 | H | H | H | H | L/L | H/H | Vwrite1 | GND |
| | | | | L | H/H | L/L | GND | Vwrite2 |
| Operation 7, 9 | | L | | H | L/L | H/H | Vwrite1 | GND |
| | | | | L | H/L | H/L | - | - |
| Operation 8, 10 | | H | L | H | H/L | H/L | - | - |
| | | | | L | H/H | L/L | GND | Vwrite2 |

X: "L" or "H"

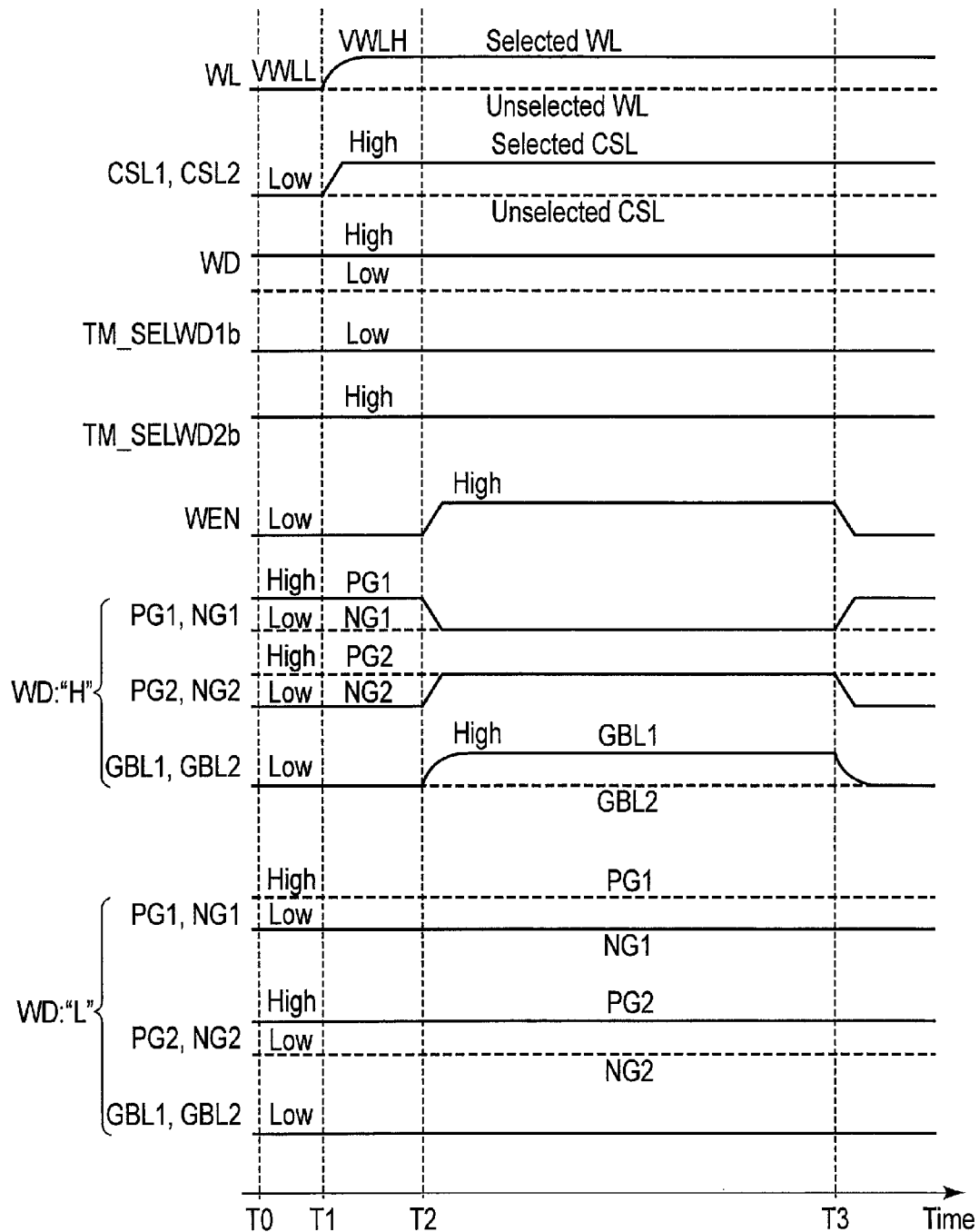
F I G. 66

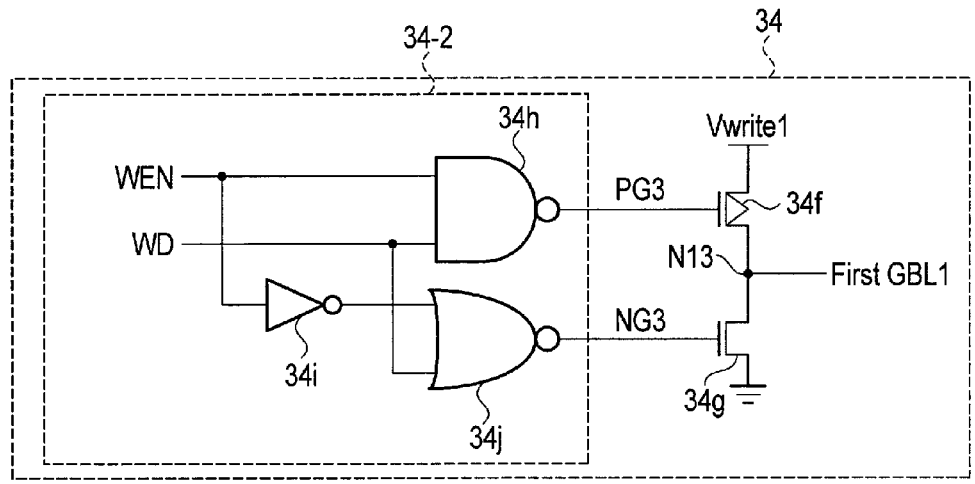
F I G. 70
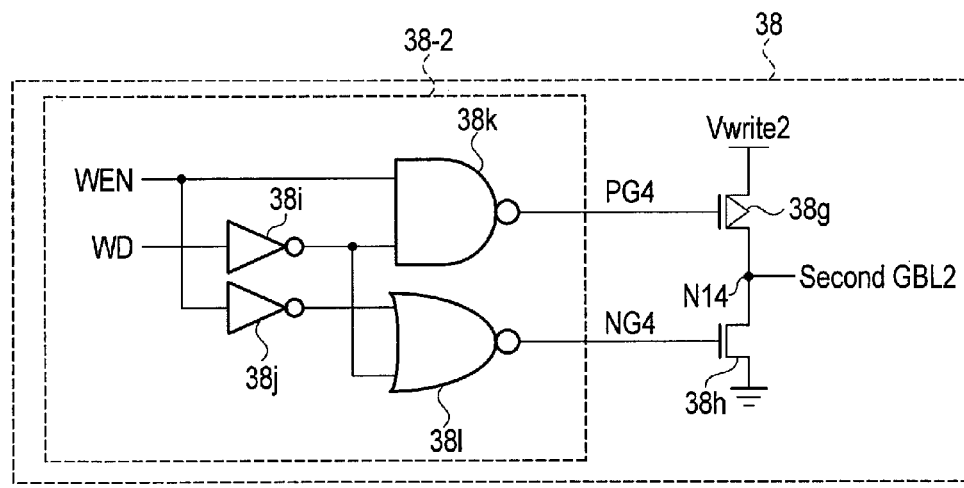
F I G. 71
| WEN | WD | PG3/NG3 | PG4/NG4 | 1st_GBL | 2nd_GBL |
|---|---|---|---|---|---|
| L | - | H/L | H/L | - | - |
| H | H | L/L | H/H | Vwrite1 | GND |
| H | L | H/H | L/L | GND | Vwrite2 |
F I G. 72

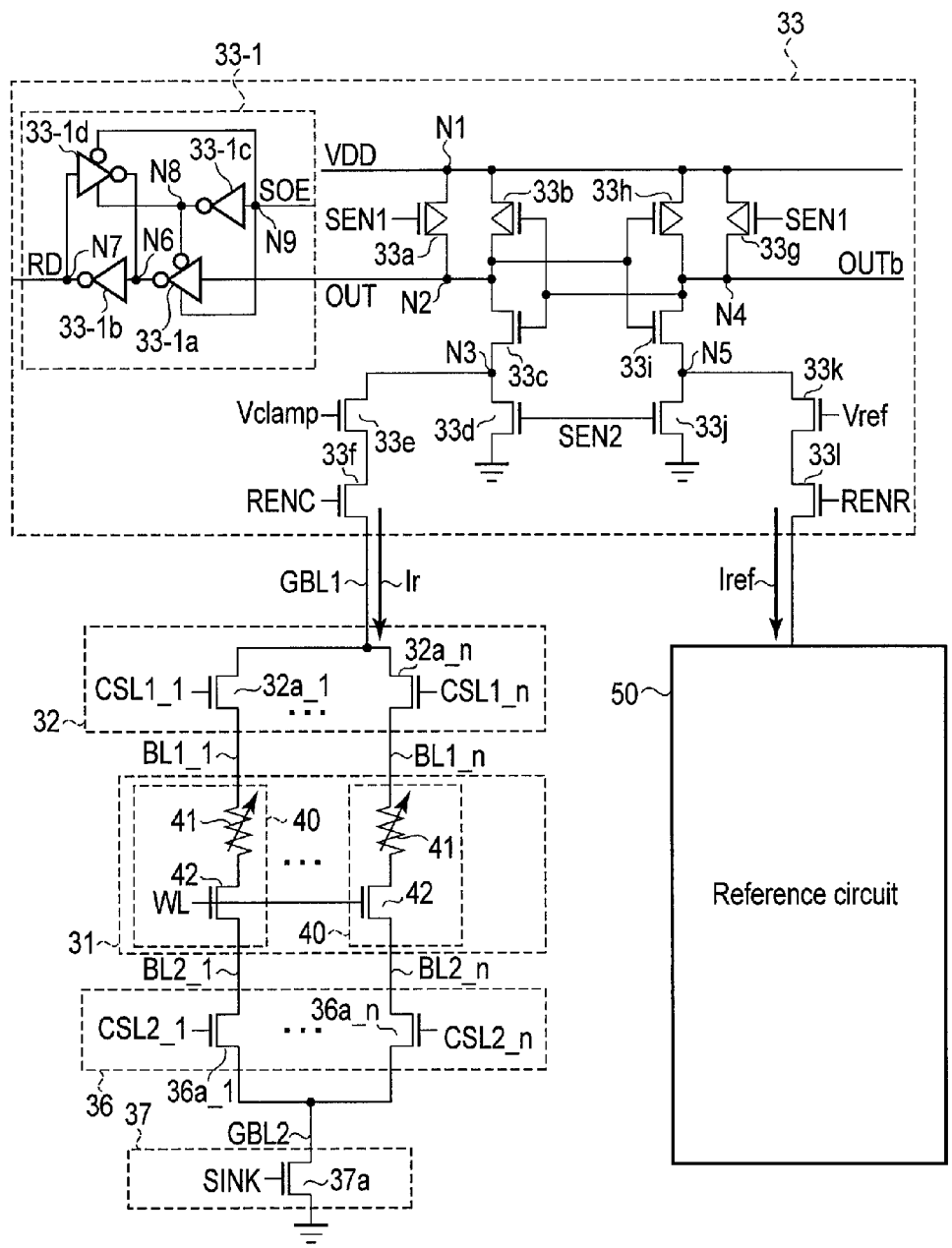
F I G. 73

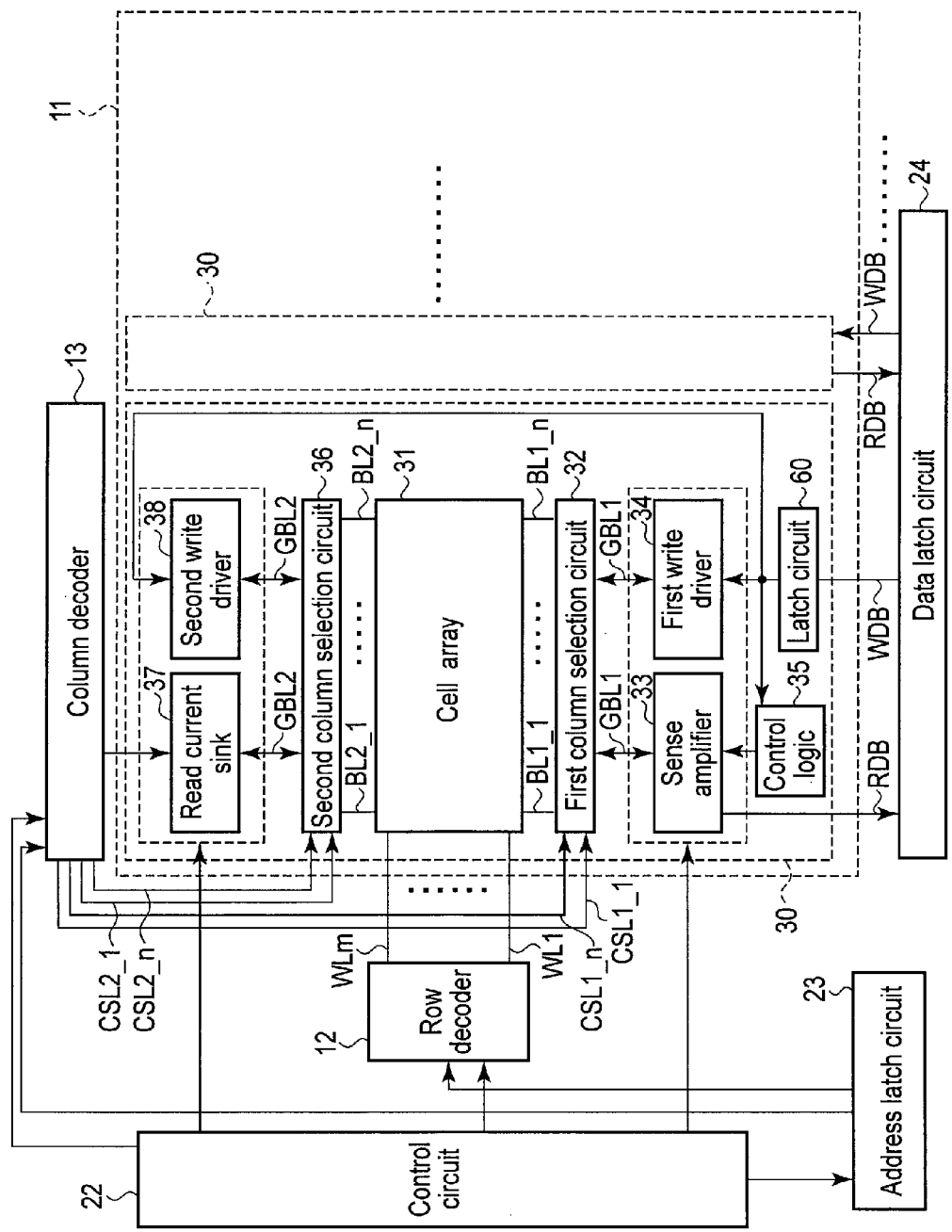
F I G. 74

SEMICONDUCTOR MEMORY DEVICE AND METHOD OF CONTROLLING SEMICONDUCTOR MEMORY DEVICE

CROSS REFERENCE TO RELATED APPLICATIONS

This application claims the benefit of U.S. Provisional Application No. 62/090,199, filed Dec. 10, 2014, the entire contents of which are incorporated herein by reference.

FIELD

Embodiments described herein relate generally to a semiconductor memory device and a method of controlling a semiconductor memory device.

BACKGROUND

An MRAM (Magnetic Random Access Memory) is one of resistance change memories. The write methods of the MRAM include a magnetic field write method and spin transfer torque write method. Of the two methods, the spin transfer torque write method has the property that a spin transfer torque current necessary for magnetization switching reduces as the size of a magnetic material decreases. This makes the method advantageous for high integration, low power consumption, and high performance.

BRIEF DESCRIPTION OF THE DRAWINGS

FIG. 1 is a block diagram schematically showing the basic arrangement of a semiconductor memory device according to the first embodiment;

FIG. 3 is a circuit diagram schematically showing the basic circuit of a cell array and its periphery according to the first embodiment;

FIG. 5 is a circuit diagram schematically showing the basic circuit of a sense amplifier and its periphery according to the first embodiment;

FIG. 6 is a circuit diagram schematically showing the basic arrangement of a control logic circuit according to the first embodiment;

FIG. 8 shows a logic table of the control logic circuit according to the first embodiment;

FIG. 9 is a waveform chart of signals when the semiconductor memory device according to the first embodiment executes "Operation 2";

FIG. 10 is a waveform chart of signals when the semiconductor memory device according to the first embodiment executes "Operation 3";

FIG. 12 is a circuit diagram schematically showing the basic arrangement of a control logic circuit according to the second embodiment;

FIG. 13 is a waveform chart of signals when a semiconductor memory device according to the second embodiment executes "Operation 1";

FIG. 14 shows a truth table of the control logic circuit according to the second embodiment;

FIG. 15 is a waveform chart of signals when the semiconductor memory device according to the second embodiment executes "Operation 2";

FIG. 17 is a waveform chart of signals when the semiconductor memory device according to the second embodiment executes "Operation 4";

FIG. 18 is a circuit diagram schematically showing the basic arrangement of a control logic circuit according to the third embodiment;

FIG. 19 is a waveform chart of signals when a semiconductor memory device according to the third embodiment executes "Operation 1";

FIG. 20 shows a truth table of the control logic circuit according to the third embodiment;

FIG. 21 is a waveform chart of signals when the semiconductor memory device according to the third embodiment executes "Operation 2";

FIG. 23 is a waveform chart of signals when the semiconductor memory device according to the third embodiment executes "Operation 4";

FIG. 24 is a circuit diagram schematically showing the basic circuit of a sense amplifier and its periphery according to the fourth embodiment;

FIG. 25 is a circuit diagram schematically showing the basic arrangement of a control logic circuit according to the fourth embodiment;

FIG. 26 is a waveform chart of signals when a semiconductor memory device according to the fourth embodiment executes "Operation 1";

FIG. 27 shows a truth table of the control logic circuit according to the fourth embodiment;

FIG. 30 is a circuit diagram schematically showing the basic arrangement of a control logic circuit according to the fifth embodiment;

FIG. 31 is a waveform chart of signals when a semiconductor memory device according to the fifth embodiment executes "Operation 1";

FIG. 32 shows a truth table of the control logic circuit according to the fifth embodiment;

FIG. 35 is a waveform chart of signals when the semiconductor memory device according to the fifth embodiment executes "Operation 4";

FIG. 36 is a block diagram schematically showing the basic arrangement of a memory area and its periphery according to the sixth embodiment;

FIG. 37 is a circuit diagram schematically showing the basic arrangement of a control logic circuit according to the sixth embodiment;

FIG. 39 shows a truth table of the control logic circuit according to the sixth embodiment;

FIG. 43 is a circuit diagram schematically showing the basic arrangement of a control logic circuit according to the seventh embodiment;

FIG. 44 is a waveform chart of signals when a semiconductor memory device according to the seventh embodiment executes "Operation 1";

FIG. 45 shows a truth table of the control logic circuit according to the seventh embodiment;

FIG. 47 is a waveform chart of signals when the semiconductor memory device according to the seventh embodiment executes "Operation 3";

FIG. 48 is a waveform chart of signals when the semiconductor memory device according to the seventh embodiment executes "Operation 4";

FIG. 49 is a circuit diagram schematically showing the basic arrangement of a control logic circuit according to the eighth embodiment;

FIG. 51 shows a truth table of the control logic circuit according to the eighth embodiment;

FIG. 53 is a waveform chart of signals when the semiconductor memory device according to the eighth embodiment executes "Operation 3";

FIG. 55 is a circuit diagram schematically showing the basic arrangement of a control logic circuit according to the ninth embodiment;

FIG. 56 is a waveform chart of signals when a semiconductor memory device according to the ninth embodiment executes "Operation 1";

FIG. 57 shows a truth table of the control logic circuit according to the ninth embodiment;

FIG. 59 is a waveform chart of signals when the semiconductor memory device according to the ninth embodiment executes "Operation 3";

FIG. 60 is a waveform chart of signals when the semiconductor memory device according to the ninth embodiment executes "Operation 4";

FIG. 64 shows a logic table of the control logic circuits according to the 10th embodiment;

FIG. 66 is a waveform chart of signals when the semiconductor memory device according to the 10th embodiment executes "Operation 7";

FIG. 70 is a circuit diagram schematically showing the basic arrangement of a first control logic circuit according to a comparative example;

FIG. 71 is a circuit diagram schematically showing the basic arrangement of a second control logic circuit according to the comparative example;

FIG. 72 shows a truth table of the control logic circuits according to the comparative example;

FIG. 73 is a circuit diagram schematically showing the basic circuit of a sense amplifier and its periphery according to a modification; and FIG. 74 is a block diagram schematically showing the basic arrangement of a memory area and its periphery according to the modification.

DETAILED DESCRIPTION

Figure 2:
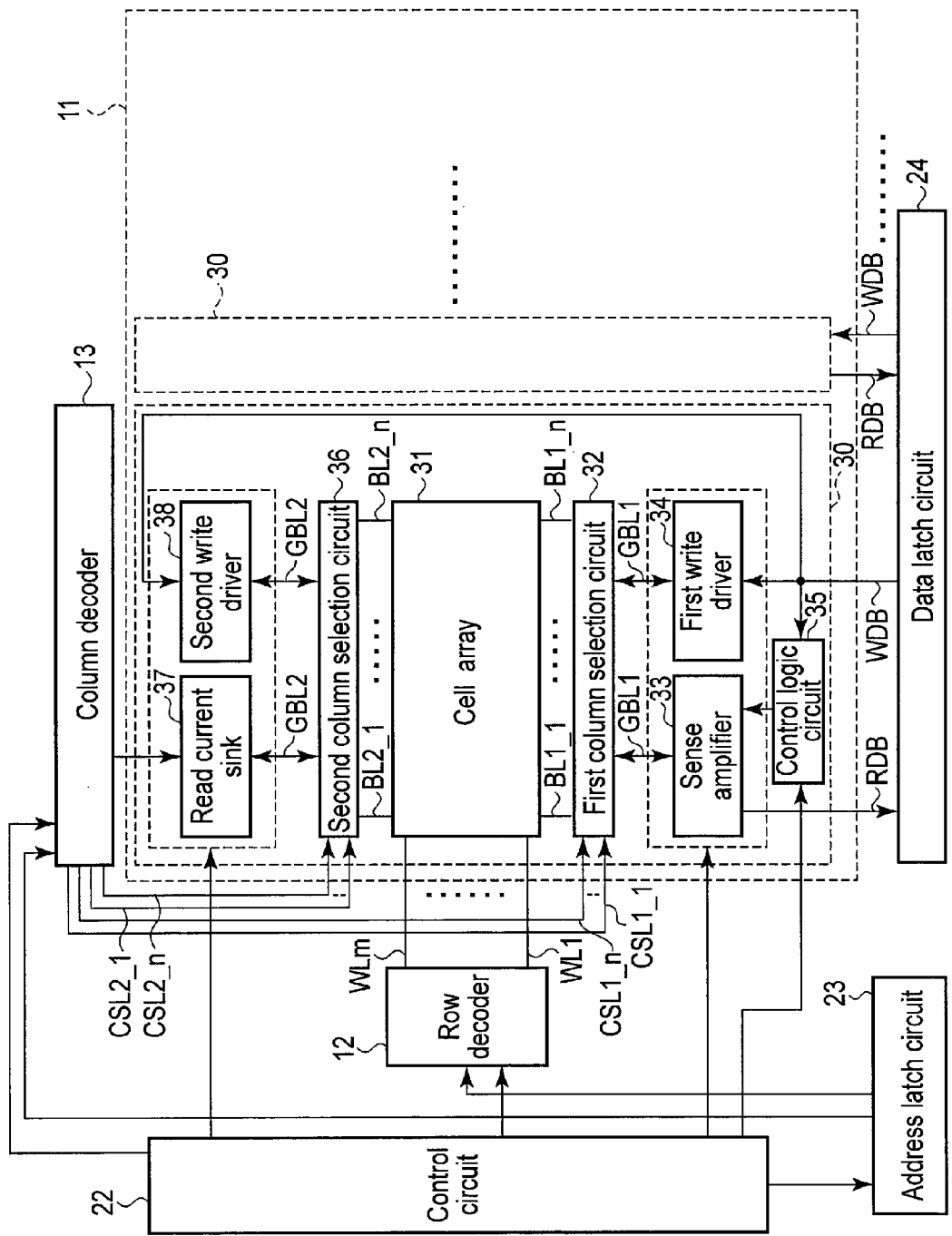
FIG. 2 is a block diagram schematically showing the basic arrangement of a memory area and its periphery according to the first embodiment.

In general, according to one embodiment, a semiconductor memory device includes a cell array including a plurality of memory cells, a reference circuit, a sense amplifier for sensing a read current flowing through the memory cell, and a reference current flowing through the reference circuit, a write driver for writing data to the memory cell, a sub cell area including the cell array, the sense amplifier, and the write driver, a memory area including a plurality of sub cell areas, and a control circuit for supplying first write data to the sub cell area including the sense amplifier which performs a first read operation of supplying the read current to a selected memory cell without supplying the reference current.

Embodiments will be explained below with reference to the accompanying drawings. Note that in the following explanation, the same reference numerals denote constituent elements having almost the same functions and arrangements, and a repetitive explanation will be made only when necessary. Note also that each embodiment to be explained below exemplifies an apparatus or method of embodying the technical idea of the embodiment, and the technical idea of the embodiment does not specify the materials, shapes, structures, layouts, and the like of constituent components to those described below. The technical idea of the embodiment can variously be changed within the scope of the appended claims.

Each functional block can be implemented as hardware, software, or a combination thereof. Therefore, each block will generally be explained from the viewpoint of its function so as to clarify that the block can be any of hardware, software, and a combination thereof. Whether the function is executed as hardware or software depends on design limitations imposed on a practical embodiment or the whole system. A person skilled in the art can implement these functions by various methods for each individual practical embodiment, but the scope of the present invention includes the determination of these implementations.

Each of the following embodiments will be explained by taking an MRAM (Magnetic Random Access Memory) as an example of the semiconductor memory device. However, each of the following embodiments can also be practiced as a resistance change memory having another hierarchical structure, e.g., a PCRAM (Phase Change Random Access Memory) or ReRAM (Resistive Random Access Memory).

First Embodiment

Outline of Semiconductor Storage Device

First, a semiconductor storage device 100 according to the first embodiment will be explained with reference to FIG. 1.

As shown in FIG. 1, the semiconductor storage device 100 includes a memory core 10 and peripheral circuit 20.

The memory core 10 includes a memory area 11, row decoder 12, and column decoder 13. The peripheral circuit 20 includes a command/address latch circuit 21, control circuit 22, address latch circuit 23, data latch circuit 24, and clock generator 25.

The memory area 11 includes a cell array 31 (not shown) in which a plurality of memory cells MC are two-dimensionally arranged in a matrix. In the cell array 31, a plurality of word lines WL and a plurality of bit lines BL run in the row direction and column direction, respectively, so as to cross each other. Two adjacent bit lines BL make a pair, and the memory cell MC is formed at the intersection of the word line WL and the bit line pair (to be referred to as a first bit line BL1 and second bit line BL2 for convenience in this embodiment).

The row decoder 12 is connected to the word lines WL in the memory area 11. The row decoder 12 decodes a row address AR<y:0> for selecting a row in the memory area 11, which is supplied from the command/address latch circuit 21. Also, the row decoder 12 includes a word line driver. This word line driver is so configured as to apply a voltage to a selected word line WL in accordance with a timing controlled by the control circuit 22 in data read or write. More specifically, the word line driver is so configured as to be able to apply a voltage to a selected word line WL in accordance with a decoded row address. The column decoder 13 is connected to bit line pairs in the memory area 11. Also, the column decoder 13 decodes a column address AC<z:0> for selecting a column in the memory area 11, which is supplied from the command/address latch circuit 21.

The peripheral circuit 20 performs data write, data read, and the like on the memory core 10. Also, the peripheral circuit 20 receives a control signal CNT for read/write, and a clock CK for controlling the operation timings of read/write, from a host 200. Furthermore, the peripheral circuit 20 is connected to the host 200 by a command/address line CA<N:0> and data line DQ<M:0>. Note that N and M are integers of 0 or more.

The control signal CNT includes a clock enable signal CKE and chip select signal CS. The clock CK is used to control the operation timings of the semiconductor storage device 100. The command/address line CA<N:0> is used to transmit commands and addresses from the host 200 to the semiconductor storage device 100. The data line DQ<M:0> is used to exchange input data and output data.

The command/address latch circuit 21 receives a command CMD and address ADD from the host 200 via the command/address line CA<N:0>, and temporarily stores them. The command/address latch circuit 21 transmits the command CMD to the control circuit 22, and the address ADD to the address latch circuit 23.

The control circuit 22 controls the internal operation of the semiconductor storage device 100 based on the control signal CNT and command CMD from the host 200.

The address latch circuit 23 latches the address ADD, transmits the row address AR<y:0> to the row decoder 12, and transmits the column address AC<z:0> to the column decoder 13. Note that y and z are integers of 0 or more.

The data latch circuit 24 temporarily stores input data which is input from the host 200 via the data line DQ<M:0>, or output data which is read from the memory area 11. The input data is written to the memory area 11.

The clock generator 25 generates an internal clock CLK based on the clock CK from the host 200. The internal clock CLK is input to the command/address latch circuit 21, control circuit 22, address latch circuit 23, and data latch circuit 24, and used to control the operation timings of these circuits.

<Outline of Memory Area>

The memory area 11 according to the first embodiment will now be explained with reference to FIG. 2. The memory area 11 includes a plurality of sub memory areas 30. The sub memory area 30 includes the cell array 31, a first column selection circuit 32, a sense amplifier 33, a first write driver 34, a control logic circuit 35, a second column selection circuit 36, a read current sink 37, and a second write driver 38.

The cell array 31 is formed by arranging the plurality of memory cells MC in a matrix. The cell array 31 includes a plurality of word lines WL1 to WLm (m is an integer of 1 or more), a plurality of first bit lines BL1_1 to BL1_n (n is an integer of 1 or more), and a plurality of second bit lines BL2_1 to BL2_n. One row of the cell array 31 is connected to one word line WL, and one column of the memory is connected to a pair of one first bit line BL1 and one second bit line BL2. Note that the word lines WL1 to WLm will simply be referred to as word lines WL when it is unnecessary to distinguish between them. Note also that the first bit lines BL1_1 to BL1_n will simply be referred to as first bit lines BL1 when it is unnecessary to distinguish between them. Likewise, the second bit lines BL2_1 to BL2_n will simply be referred to as second bit lines BL2 when it is unnecessary to distinguish between them.

The first column selection circuit 32 is connected to the cell array 31 via the plurality of first bit lines BL1_1 to BL1_n. The first column selection circuit 32 selects a first bit line BL1 based on first column selection signals CSL1_1 to CSL1_n received from the column decoder 13. Note that the first column selection signals CSL1_1 to CSL1_n will simply be referred to as first column selection signals CSL1 when it is unnecessary to distinguish between them.

The sense amplifier 33 is connected to the first column selection circuit 32 via a first global bit line GBL1. The sense amplifier 33 senses an electric current flowing through the memory cell MC connected to a selected word line WL based on a control signal received from the control circuit 22, thereby reading data stored in the memory cell. The sense amplifier 33 is connected to the data latch circuit 24 via a read data bus RDB.

The first write driver 34 is connected to the first column selection circuit 32 via the first global bit line GBL1. The first write driver 34 supplies an electric current to the memory cell MC connected to a selected word line WL based on a control signal received from the control circuit 22, and write data WD received via the data latch circuit 24 and a write data bus WDB, thereby writing data. The first write driver 34 is connected to the data latch circuit 24 via the write data bus WDB.

The control logic circuit 35 controls the sense amplifier 33 based on a signal received from the control circuit 22, and the write data WD received from the data latch circuit 24 via the write data bus WDB.

The second column selection circuit 36 is connected to the cell array 31 via the plurality of second bit lines BL2_1 to BL2_n. The second column selection circuit 36 selects a second bit line BL2 based on second column selection signals CSL2_1 to CSL2_n received from the column decoder 13. Note that the second column selection signals CSL2_1 to CSL2_n will simply be referred to as second column selection signals CSL2 when it is unnecessary to distinguish between them.

The read current sink 37 is connected to the second column selection circuit 36 via a second global bit line GBL2. The read current sink 37 sets a selected second bit line BL2 at a ground voltage GND based on control signals received from the control circuit 22 and column decoder 13.

The second write driver 38 is connected to the second column selection circuit 36 via the second global bit line GBL2. The second write driver 38 supplies an electric current to the memory cell MC connected to a selected word line WL based on a control signal received from the control circuit 22, and the write data WD received via the write data bus WDB, thereby writing data. The second write driver 38 is connected to the data latch circuit 24 via the write data bus WDB.

<Outline of Cell Array>

Next, the circuits of the cell array 31 will be explained with reference to FIG. 3.

As shown in FIG. 3, each memory cell MC has a hierarchical structure, and includes an MTJ element 41 and cell transistor 42. The MTJ element 41 is a magnetic tunnel junction element in which data can be written in accordance with the change in resistance state, and the stored data is programmable by using an electric current. The cell transistor 42 is formed for a corresponding MTJ element 41, and is so configured as to be turned on when supplying an electric current to the corresponding MTJ element 41.

The plurality of word lines WL and the plurality of bit lines BL are arranged in the row direction and column direction, respectively, so as to cross each other. The first bit line BL1 and second bit line BL2 adjacent to each other make a pair, and the memory cell MC is formed at the intersection of the word line WL and the bit line pair. The MTJ element 41 and cell transistor 42 of each memory cell MC are connected in series between the pair of bit lines (e.g., the first and second bit lines BL1 and BL2). Also, the gate electrode of the cell transistor 42 is connected to the word line WL.

The first column selection circuit 32 includes switch transistors 32a_1 to 32a_n each having a current path whose one end is connected to each first bit line BL1. The first global bit line GBL1 is connected to the other end of the current path of each of the switch transistors 32a_1 to 32a_n, and the column selection signals CSL1_1 to CSL1_n are connected to the gate electrodes of the switch transistors 32a_1 to 32a_n.

The second column selection circuit 36 includes switch transistors 36a_1 to 36a_n each having a current path whose one end is connected to each second bit line BL2. The second global bit line GBL2 is connected to the other end of the current path of each of the switch transistors 36a_1 to 36a_n, and the column selection signals CSL2_1 to CSL2_n are connected to the gate electrodes of the switch transistors 36a_1 to 36a_n.

<Write Operation of Memory Cell MC>

An outline of the write operation of the memory cell MC according to the embodiment will be explained below with reference to FIG. 4.

Figure 4:
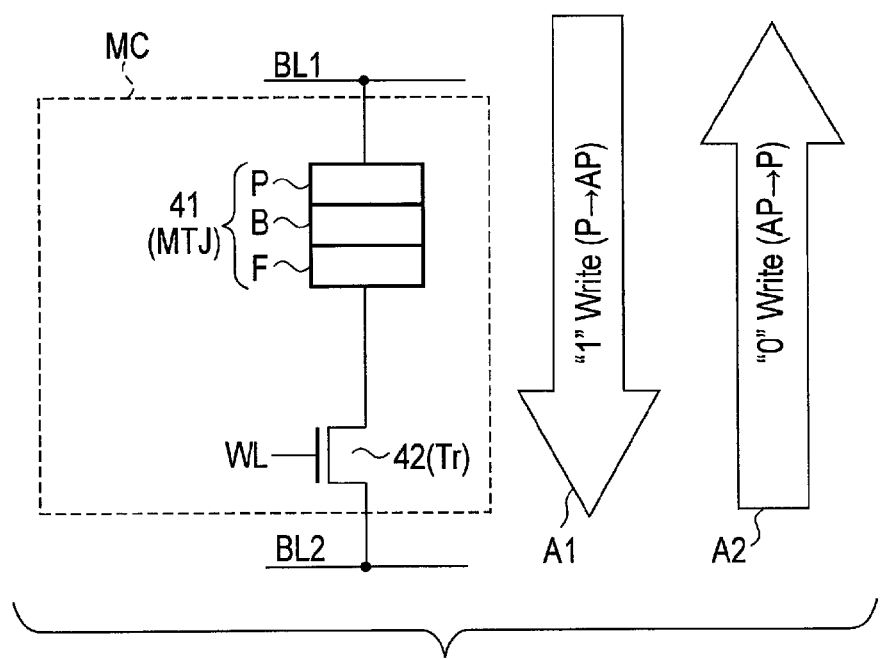
FIG. 4 is a view showing a memory cell write operation according to the first embodiment.

As shown in FIG. 4, the MTJ element 41 of the memory cell MC according to the embodiment has one terminal connected to the first bit line BL1, and the other terminal connected to one end of the current path of the cell transistor 42. The other end of the current path of the cell transistor 42 is connected to the second bit line BL2. The MTJ element 41 using the TMR (Tunneling Magneto Resistive) effect has a multilayered structure including two ferromagnetic layers F and P and a nonmagnetic layer (tunnel insulating layer) B sandwiched between them, and stores digital data by the change in magnetic resistance caused by the spin polarized tunneling effect. The MTJ element 41 can take low and high resistance states in accordance with the magnetization arrangements in the two ferromagnetic layers F and P. For example, 1-bit data can be recorded in the MTJ element 41 by defining the low resistance state as data "0" (also called "L" level data), and the high resistance state as data "1" (also called "H" level data). It is, of course, also possible to define the low resistance state as data "1", and the high resistance state as data "0".

For example, the MTJ element 41 is formed by sequentially stacking a fixed layer (pinned layer) P, tunnel barrier layer B, and recording layer (free layer) F. The pinned layer P and free layer F are made of a ferromagnetic material, and the tunnel barrier layer B is made of an insulating film (e.g., $Al_2O_3$ or MgO). The pinned layer P is a layer in which the direction of the magnetization arrangement is fixed, and the free layer F is a layer in which the direction of the magnetization arrangement is variable, and stores data in accordance with the magnetization direction.

When an electric current is supplied in the direction of an arrow A1 in a write operation, the magnetization direction in the free layer F is set in an antiparallel state (AP state) with respect to that in the pinned layer P, and the high resistance state (data "1") is set. When an electric current is supplied in the direction of an arrow A2 in a write operation, the magnetization directions in the pinned layer P and free layer F are set in a parallel state (P state), and the low resistance state (data "0") is set. Thus, different data can be written to the MTJ element in accordance with the electric current supply direction.

<Outline of Sense Amplifier>

An example of the sense amplifier 33 according to the first embodiment will be explained below with reference to FIG. 5. The sense amplifier 33 includes PMOS transistors 33a, 33b, 33g, and 33h, NMOS transistors 33c, 33d, 33e, 33f, 33i, 33j, 33k, and 33l, and a read data bus buffer 33-1.

The PMOS transistor 33a which functions as a read current source circuit has a current path having one end connected to a node N1 connected to the supply source of a power supply voltage VDD, and the other end connected to a node N2, and includes a gate electrode to which a signal SEN1 is input. The PMOS transistor 33b has a current path having one end connected to the node N1, and the other end connected to the node N2, and includes a gate electrode to which a node N4 is connected. The NMOS transistor 33c has a current path having one end connected to the node N2, and the other end connected to a node N3, and includes a gate electrode to which the node N4 is connected. The NMOS transistor 33d has a current path having one end connected to the node N3, and the other end connected to a ground voltage GND, and includes a gate electrode to which a signal SEN2 is input.

The NMOS transistor 33e which functions as a bias transistor has a current path having one end connected to the node N3, and includes a gate electrode to which a clamp voltage Vclamp is input. The NMOS transistor 33f which functions as a read enable switch has a current path having one end connected to the other end of the current path of the NMOS transistor 33e, and the other end connected to the first global bit line GBL1, and includes a gate electrode to which a signal RENC is input. The signal RENC is supplied from the control logic circuit 35.

The PMOS transistor 33g which functions as a read current source circuit has a current path having one end connected to the node N1, and the other end connected to the node N4, and includes a gate electrode to which the signal SEN1 is input. The PMOS transistor 33h has a current path having one end connected to the node N1, and the other end connected to the node N4, and includes a gate electrode to which the node N2 is connected. The NMOS transistor 33i has a current path having one end connected to the node N4, and the other end connected to a node N5, and includes a gate electrode to which the node N2 is connected. The NMOS transistor 33j has a current path having one end connected to the node N5, and the other end connected to the ground voltage GND, and includes a gate electrode to which the signal SEN2 is input.

The NMOS transistor 33k which functions as a bias transistor has a current path having one end connected to the node N5, and includes a gate electrode to which a reference voltage Vref is input. The NMOS transistor 33l which functions as a read enable switch has a current path having one end connected to the other end of the current path of the NMOS transistor 33k, and includes a gate electrode to which a signal RENR is input. The signal RENR is supplied from the control logic circuit 35.

The read data buffer 33-1 includes inverters 33-1a, 33-1b, 33-1c, and 33-1d. The clocked inverter 33-1a has an input terminal to which the node N2 which outputs a signal OUT is connected, an inverting output terminal to which a node N6 is connected, and a control input terminal having one end to which a node N8 is connected in an inverted state, and the other end to which a node N9 which outputs a signal SOE is connected. The inverter 33-1b has an input terminal to which the node N6 is connected, and an inverting output terminal to which a node N7 connected to the read data bus RDB is connected. The inverter 33-1c has an input terminal to which the signal SOE is connected, and an inverting output terminal to which the node N8 is connected. The clocked inverter 33-1d has an input terminal to which the data bus RDB is connected, an inverting output terminal to which the node N6 is connected, and a control input terminal having one end to which the control signal SOE is connected in an inverted state, and the other end to which the node N8 is connected. Note that the control circuit 22 commonly controls the above described signals input to the sense amplifier 33 in the operation unit of the sense amplifier.

The other end of the current path of the NMOS transistor 33f is connected to one end of the current path of each of the NMOS transistors 32a_1 to 32a_n of the first column selection circuit 32 via the first global bit line GBL1. The other end of the current path of each of the NMOS transistors 32a_1 to 32a n is connected to the cell array 31 via a corresponding one of the first bit lines BL1_1 to BL1_n. One end of the current path of each of the NMOS transistors 36a_1 to 36a_n of the second column selection circuit 36 is connected to a corresponding one of the second bit lines BL2_1 to BL2_n, and the other end of the current path of each of the NMOS transistors 36a_1 to 36a_n is connected to the second global bit line GBL2. An NMOS transistor 37a of the read current sink 37 has a current path having one end connected to the second global bit line GBL2, and the other end connected to the ground voltage GND, and includes a gate electrode to which a signal SINK is input. Note that a circuit from the first global bit line GBL1 connected to the other end of the current path of the NMOS transistor 33f to the NMOS transistor 37a will be called a memory circuit or the like. Note also that an electric current flowing through the memory circuit (cell array 31) via the NMOS transistor 33f will be called a cell read current Ir.

To read data stored in the memory cell MC, the sense amplifier 33 must detect the resistance state of the memory cell MC. To detect the resistance state of the memory cell MC, the sense amplifier 33 according to this embodiment compares the cell read current Ir with a reference current Iref.

Accordingly, a reference circuit which generates the reference current Iref is connected to the other end of the current path of the NMOS transistor 33l. For example, the reference circuit according to this embodiment uses parts of the first column selection circuit 32, cell array 31, second column selection circuit 36, and read current sink 37.

More specifically, the other end of the current path of the NMOS transistor 33l is connected to a first reference global bit line RGBL1. One end of the current path of each of the NMOS transistors 32b_1 to 32b_n of the first column selection circuit 32 is connected to the first reference global bit line GBL1, and the other end of the current path of each of the NMOS transistors 32b_1 to 32b_n is connected the cell array 31 via a corresponding one of first reference bit lines RBL1_1 to RBL1_n. Reference column selection signals RCSL1_1 to RCSL1_n are respectively input to the gates of the NMOS transistors 32b_1 to 32b_n.

In the cell array 31, reference memory cells RC having the same structure as that of the memory cells MC are arranged in the same manner as that for the memory cells MC. Like the memory cell MC, the reference memory cell RC includes an MTJ element 44 having one terminal connected to the first reference bit line RBL1, and the other terminal connected to one end of the current path of a cell transistor 45. The other end of the current path of the cell transistor 45 is connected to a second reference bit line RBL2, and the gate electrode of the cell transistor 45 is connected to a reference word line RWL.

One end of the current path of each of the NMOS transistors 36b_1 to 36b_n of the second column selection circuit 36 is connected to a corresponding one of second reference bit lines RBL2_1 to RBL2_n, and the other end of the current path of each of the NMOS transistors 36b_1 to 36b_n is connected to a second reference global bit line RGBL2. An NMOS transistor 37b of the read current sink 37 has a current path having one end connected to the second reference global bit line RGBL2, and the other end connected to the ground voltage GND, and includes a gate electrode to which a signal RSINK is input. An electric current flowing through the reference cell RC via the NMOS transistor 33l will be called a reference current Iref.

<Outline of Control Logic Circuit>

An arrangement example of the control logic circuit 35 will be explained below with reference to FIG. 6. As shown in FIG. 6, the control logic circuit 35 generates signals RENC and RENR based on signals REN, TM_SELSAb (Test signal for Sense amplifier selection operation), TM_RENCDIS (Test signal for disable the memory cell), and TM_RENRDIS (Test signal for disable the reference cell), and write data WD.

More specifically, the control logic circuit 35 includes an OR circuit 35a, a NAND circuit 35b, and NOR circuits 35c and 35d. The OR circuit 35a has a first input terminal to which the write data WD is input, and a second input terminal to which the test signal TM_SELSAb for a sense amplifier selection operation is input. The OR circuit 35a outputs the operation result from the output terminal. The NAND circuit 35b has a first input terminal to which the signal REN is connected, and a second input terminal connected to the output terminal of the OR circuit 35a. The NAND circuit 35b outputs the operation result from the output terminal. The NOR circuit 35c has a first input terminal to which the test signal TM_RENCDIS is input, and a second input terminal connected to the output terminal of the NAND circuit 35b. The NOR circuit 35c outputs the operation result as the signal RENC from the output terminal. The NOR circuit 35d has a first input terminal to which the test signal TM_RENRDIS is input, and a second input terminal connected to the output terminal of the NAND circuit 35b. The NOR circuit 35d outputs the operation result as the signal RENR from the output terminal.

<Outline of Operation of Semiconductor Storage Device According to this Embodiment>

An outline of the operation of the semiconductor storage device according to this embodiment will be explained below. In general, the semiconductor storage device 100 according to this embodiment performs the following four read operations.

[Operation 1 (Normal Read Operation)]

In "Operation 1", the control circuit 22 simultaneously operates the plurality of sense amplifiers 33, and reads data stored in the plurality of cell arrays 31.

[Operation 2 (Read Test Mode 1 (Normal Read Operation Only on Selected Sense Amplifier))]

In "Operation 2", the control circuit 22 selectively operates a specific sense amplifier 33, and reads data stored in a given cell array 31.

[Operation 3 (Read Test Mode 2 (Current Ir Measuring Operation Only on Selected Sense Amplifier))]

In "Operation 3", the control circuit 22 selectively operates a specific sense amplifier 33, and forms a current path to a given memory cell MC. In this case, no current path is formed for the reference cell RC. This operation is used to test the characteristics of the memory cell MC.

[Operation 4 (Read Test Mode 3 (Current Iref Measuring Operation Only on Selected Sense Amplifier))]

In "Operation 4", the control circuit 22 selectively operates a specific sense amplifier 33, and forms a current path to a given reference cell RC. In this case, no current path is formed for the memory cell MC. This operation is used to test the characteristics of the reference cell RC.

<"Operation 1">

Figure 7:
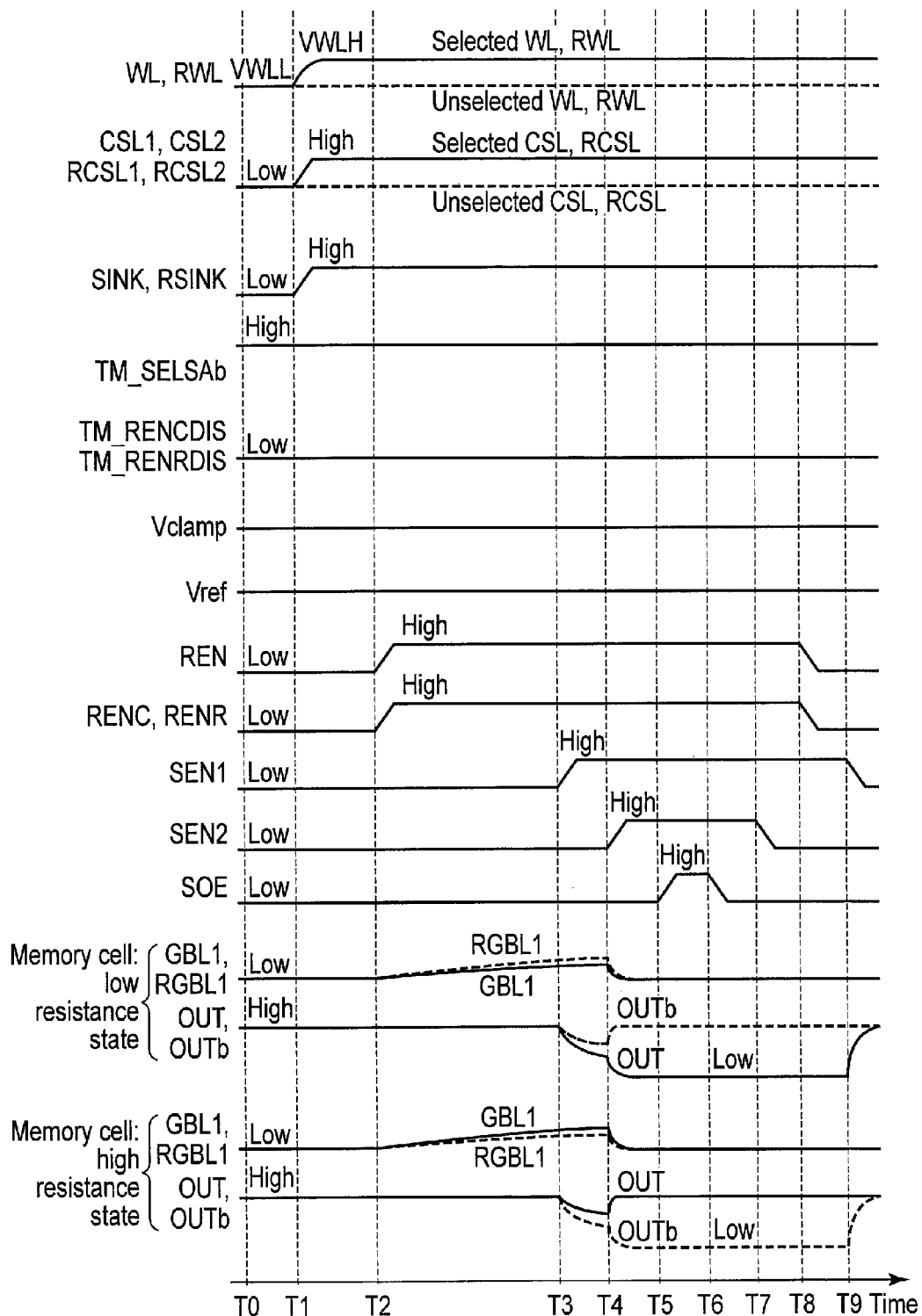
FIG. 7 is a waveform chart of signals when the semiconductor memory device according to the first embodiment executes "Operation 1"

Next, the operation of the semiconductor storage device 100 in above described "Operation 1" will be explained with reference to FIG. 7.

[Time T0]

The row decoder 12 sets the voltages of the word line WL and reference word line RWL at "VWLL". The control circuit 22 sets the voltages of the signals CSL1, CSL2, RCSL1, RCSL2, SINK, RSINK, TM_RENCDIS, TM_RENRDIS, REN, SEN1, SEN2, and SOE at "L (Low)" level. The control circuit 22 also sets the voltage of the test signal TM_SELSAb for a sense amplifier selection operation (an inverted signal of the signal TM_SELSA) at "H (High)" level.

The operation of the control logic circuit 35 will now be explained with reference to FIGS. 6 and 8. As shown in FIGS. 6 and 8, the control circuit 22 sets the test signal TM_SELSAb for a sense amplifier selection operation at "H" level, and the test signals TM_RENCDIS and TM_RENRDIS at "L" level. In the control logic circuit 35 as described above, the signals RENC and RENR are set at "L" or "H" level in accordance with the driving signal REN supplied from the control circuit 22, regardless of the write data WD. At time T0, the signal REN is at "L" level, so the signals RENC and RENR are at "L" level. Since the PMOS transistors 33a and 33g are turned on and the NMOS transistors 33d, 33f, 33j, and 33l are turned off, the signals OUT and OUTb are charged to "H" level.

[Time T1]

In accordance with the row address, the row decoder 12 raises the voltages of a selected word line WL (Selected) and selected reference word line RWL (Selected) from a voltage VWLL to a voltage VWLH (VWLL<VWLH). Also, the row decoder 12 maintains the voltages of an unselected word line WL (Unselected) and unselected reference word line RWL (Unselected) at the voltage VWLL.

In addition, in accordance with the column address, the column decoder 13 raises the voltages of a selected first column selection signal CSL1 (Selected), selected first reference column selection signal RCSL1 (Selected), selected second column selection signal CSL2 (Selected), and selected second reference column selection signal RCSL2 (Selected) from "L" level to "H" level. Also, the column decoder 13 maintains the voltages of an unselected first column selection signal CSL1 (Unselected), unselected first reference column selection signal RCSL1 (Unselected), unselected second column selection signal CSL2 (Unselected), and unselected second reference column selection signal RCSL2 (Unselected) at "L" level. Note that the control circuit 22 controls the operations of the row decoder 12 and column decoder 13.

Furthermore, the control circuit 22 raises the voltages of the signals SINK and RSINK from "L" level to "H" level.

Consequently, a selected memory cell MC is electrically connected to the first and second global bit lines GBL1 and GBL2. Note that the reference voltage Vref is desirably set to be intermediate between the cell read currents Ir when the memory cell MC is in the high- and low resistance states.

[Time T2]

The control circuit 22 raises the voltage of the signal REN from "L" level to "H" level. Accordingly, as explained with reference to FIGS. 6 and 8, the control logic circuit 35 raises the voltage of the signals RENC and RENR from "L" level to "H" level. Consequently, the sense amplifier 33 is connected to the first and second global bit lines GBL1 and GBL2, and the first and second global bit lines GBL1 and GBL2 are charged. Similarly, the sense amplifier 33 is connected to the first and second reference global bit lines RGBL1 and RGBL2, and the first and second reference global bit lines RGBL1 and RGBL2 are charged.

[Time T3]

The control circuit 22 raises the voltage of the signal SEN1 from "L" level to "H" level. As a consequence, the PMOS transistors 33a and 33g are turned off, and the cell read current Ir and reference current Iref discharge the signals OUT and OUTb. If the memory cell MC is in the low resistance state (cell read current Ir>reference current Iref), the voltage level of the signal OUT becomes lower than that of the signal OUTb (OUT<OUTb). If the memory cell MC is in the high resistance state (cell read current Ir<reference current Iref), the voltage level of the signal OUT becomes higher than that of the signal OUTb (OUT>OUTb). That is, a voltage difference is produced between the signals OUT and OUTb in accordance with the magnitudes of the cell read current Ir and reference current Iref.

[Time T4]

After an appropriate time has elapsed from time T3, the control circuit 22 raises the voltage of the signal SEN2 from "L" level to "H" level. As a consequence, the NMOS transistors 33d and 33j are turned on, and the voltage difference between the signals OUT and OUTb increases. Accordingly, the output voltage is determined.

[Time T5]

The control circuit 22 raises the voltage of the signal SOE from "L" level to "H" level. Therefore, the control circuit 22 can transfer the signal OUT to the read data bus RDB.

[Time T6]

The control circuit 22 lowers the voltage of the signal SOE from "H" level to "L" level.

[Time T7]

The control circuit 22 lowers the voltage of the signal SEN2 from "H" level to "L" level. Consequently, the NMOS transistors 33d and 33j are turned off.

[Time T8]

The control circuit 22 lowers the signal REN from "H" level to "L" level. Consequently, the NMOS transistors 33f and 33l are turned off. Therefore, the sense amplifier 33 is electrically disconnected from the global bit line GBL1 and reference global bit line RGBL1.

[Time T9]

The control circuit 22 lowers the voltage of the signal SEN1 from "H" level to "L" level. As a consequence, the PMOS transistors 33a and 33g are turned on, and the NMOS transistors 33d, 33f, 33j, and 33l are turned off, so the signals OUT and OUTb are charged to "H" level.

The semiconductor storage device 100 according to this embodiment executes "Operation 1" as described above.

<"Operation 2">

The operation of the semiconductor storage device 100 in above described "Operation 2" will be explained below with reference to FIG. 9. The control circuit 22 executes read test mode 1 as follows.

First, the control circuit 22 enters a write test mode (also called write test mode A or the like) for inhibiting a write operation to the memory cell MC. In write test mode A, write data input to the data latch circuit 24 via the data line DQ<M:0> is loaded to the write data bus WDB, and no write operation to the memory cell MC is performed.

In this operation, a write data pattern is input to the data latch circuit such that data "1" is input to the data bus WDB corresponding to a memory cell MC, reference cell RC, or sense amplifier as a target of a selective read operation, and data "0" is input to the data bus WDB corresponding to a sense amplifier which is not a target of the read operation. Subsequently, the control circuit 22 supplies data "1" from the data latch circuit 24 to the write data bus WDB belonging to a memory cell MC or reference cell RC as a read operation target, and data "0" to the write data bus WDB belonging to the cell array 31 which is not a read operation target.

Then, the control circuit 22 enters a test mode (also called read test mode A) which makes the test signal TM_SELSAb active ("L" level).

After that, the control circuit 22 executes a read test mode operation on the selected cell array 31 as follows.

[Time T0]

The row decoder 12 sets the voltages of the word line WL and reference word line RWL at "VWLL". The control circuit 22 sets the voltages of the signals CSL1, CSL2, RCSL1, RCSL2, SINK, RSINK, TM_SELSAb, TM_RENCDIS, TM_RENRDIS, REN, SEN1, SEN2, and SOE at "L" level.

Also, the control circuit 22 supplies "H" level data from the data latch circuit 24 to the write data bus WDB corresponding to the sense amplifier 33 as a test mode target. In addition, the control circuit 22 supplies "L" level data from the data latch circuit 24 to the data bus WDB corresponding to the sense amplifier 33 which is not a test mode target.

The control logic circuit 35 in "Operation 2" will now be explained with reference to FIGS. 6 and 8. "L" level write data WD is input to the control logic circuit 35 corresponding to a sense amplifier which is not a target of the test operation of "Operation 2". In the control logic circuit 35, therefore, the signals RENC and RENR change to "L" level regardless of the test signals TM_RENCDIS and TM_RENRDIS and the signal REN.

Also, "H" level write data WD is input to the control logic circuit 35 corresponding to a sense amplifier as a target of the test operation of "Operation 2". Consequently, the signals RENC and RENR change to "L" or "H" level in accordance with the driving signal REN supplied from the control circuit 22. At time T0, the signal REN is at "L" level, so the signals RENC and RENR change to "L" level.

In the sense amplifier as a target of the test operation, therefore, the PMOS transistors 33a and 33g are turned on, and the NMOS transistors 33d, 33f, 33j, and 33l are turned off, so the signals OUT and OUTb are charged to "H" level.

[Time T1]

The operation of the semiconductor storage device 100 at time T1 is the same as that of the semiconductor storage device 100 at time T1 in "Operation 1".

[Time T2]

The control circuit 22 raises the voltage of the signal REN from "L" level to "H" level. Consequently, as explained with reference to FIGS. 6 and 8, the control logic circuit 35 to which the "H" level write data WD is supplied raises the voltages of the signals RENC and RENR from "L" level to "H" level.

Also, the control logic circuit 35 to which the "L" level write data WD is supplied maintains the voltages of the signals RENC and RENR at "L" level. In this example as described above, the control circuit 22 can select the cell array 31 as a target of the test operation by controlling data to be supplied to the write data bus WDB.

[Times T3-T9]

The operations of the semiconductor storage device 100 at times T3 to T9 are the same as those of the semiconductor storage device 100 at times T3 to T9 in "Operation 1".

<"Operation 3">

The operation of the semiconductor storage device 100 in above described "Operation 3" will be explained below with reference to FIG. 10. The control circuit 22 executes read test mode 2 as follows.

First, the control circuit 22 enters write test mode A.

Subsequently, the control circuit 22 supplies data "1" to the write data bus WDB belonging to the cell array 31 in which the memory cell MC or reference cell RC as a current measurement target exists, and data "0" to the write data bus WDB belonging to the cell array 31 which is not a current measurement target.

Then, the control circuit 22 enters read test mode A. In addition, the control circuit 22 enters a test mode (also called read test mode B) which maintains the ON state of each transistor in the sense amplifier 33 in a read operation. Furthermore, the control circuit 22 enters a test mode (read test mode C) which measures an electric current by applying the power supply voltage of the sense amplifier 33 from an external PAD (not shown).

After that, the control circuit 22 executes a test mode which forms a current path to the selected memory cell MC as follows.

[Time T0]

The row decoder 12 sets the voltages of the word line WL and reference word line RWL at "VWLL". The control circuit 22 sets the voltages of the signals CSL1, CSL2, RCSL1, RCSL2, SINK, RSINK, TM_SELSAb, TM_RENCDIS, REN, SEN1, SEN2, and SOE at "L" level. The control circuit 22 also sets the voltage of the signal TM_RENRDIS at "H" level.

Furthermore, the control circuit 22 supplies "H" level data to the write data bus WDB corresponding to the sense amplifier 33 as a test mode target. In addition, the control circuit 22 supplies "L" level data to the data bus WDB corresponding to the sense amplifier 33 which is not a test mode target.

The operation of the control logic circuit 35 in "Operation 3" will now be explained with reference to FIGS. 6 and 8. In the control logic circuit 35 corresponding to a sense amplifier as a target of the test operation of "Operation 3", the control circuit 22 sets the test signals TM_SELSAb and TM_RENCDIS at "L" level. Also, the control circuit 22 sets the test signal TM_RENRDIS and write data WD at "H" level. When the signal REN is at "H" level in the control logic circuit 35, therefore, the signal RENC changes to "H" level, and the signal RENR changes to "L" level. At time T0, the signal REN is at "L" level, so the signals RENC and RENR change to "L" level.

In the control logic circuit 35 corresponding to a sense amplifier which is not a target of the test operation of "Operation 3", the control circuit 22 sets the test signals TM_SELSAb and TM_RENCDIS and write data WD at "L" level. Also, the control circuit 22 sets the test signal TM_RENRDIS at "H" level. As a consequence, the signals RENC and RENR change to "L" level regardless of the signal REN.

Accordingly, the PMOS transistors 33a and 33g are turned on, and the NMOS transistors 33d, 33f, 33j, and 33l are turned off, so the signals OUT and OUTb are charged to "H" level.

[Time T1]

The operation of the semiconductor storage device 100 at time T1 is the same as that of the semiconductor storage device 100 at time T1 in "Operation 1".

[Time T2]

The control circuit 22 raises the voltage of the signal REN from "L" level to "H" level. Consequently, as explained with reference to FIGS. 6 and 8, the control logic circuit 35 to which the "H" level write data WD is supplied raises the voltage of the signal RENC from "L" level to "H" level. In this case, the control logic circuit 35 maintains the voltage of the signal RENR at "L" level.

Also, the control logic circuit 35 to which the "L" level write data WD is supplied maintains the voltages of the signals RENC and RENR at "L" level. In this example as described above, the control circuit 22 can select the cell array 31 as a target of the test operation, and measure only the cell read current Ir flowing through a predetermined memory cell MC, by controlling data to be supplied to the write data bus WDB, and the test signals TM_SELSAb, TM_RENCDIS, and TM_RENRDIS.

Note that when measuring the cell read current Ir, the state after the operation at time T2 is maintained, and the electric current of the power supply voltage VDD (the node N1) of the sense amplifier 33 can be measured by DC measurement from an external PAD.

<"Operation 4">

Figure 11:
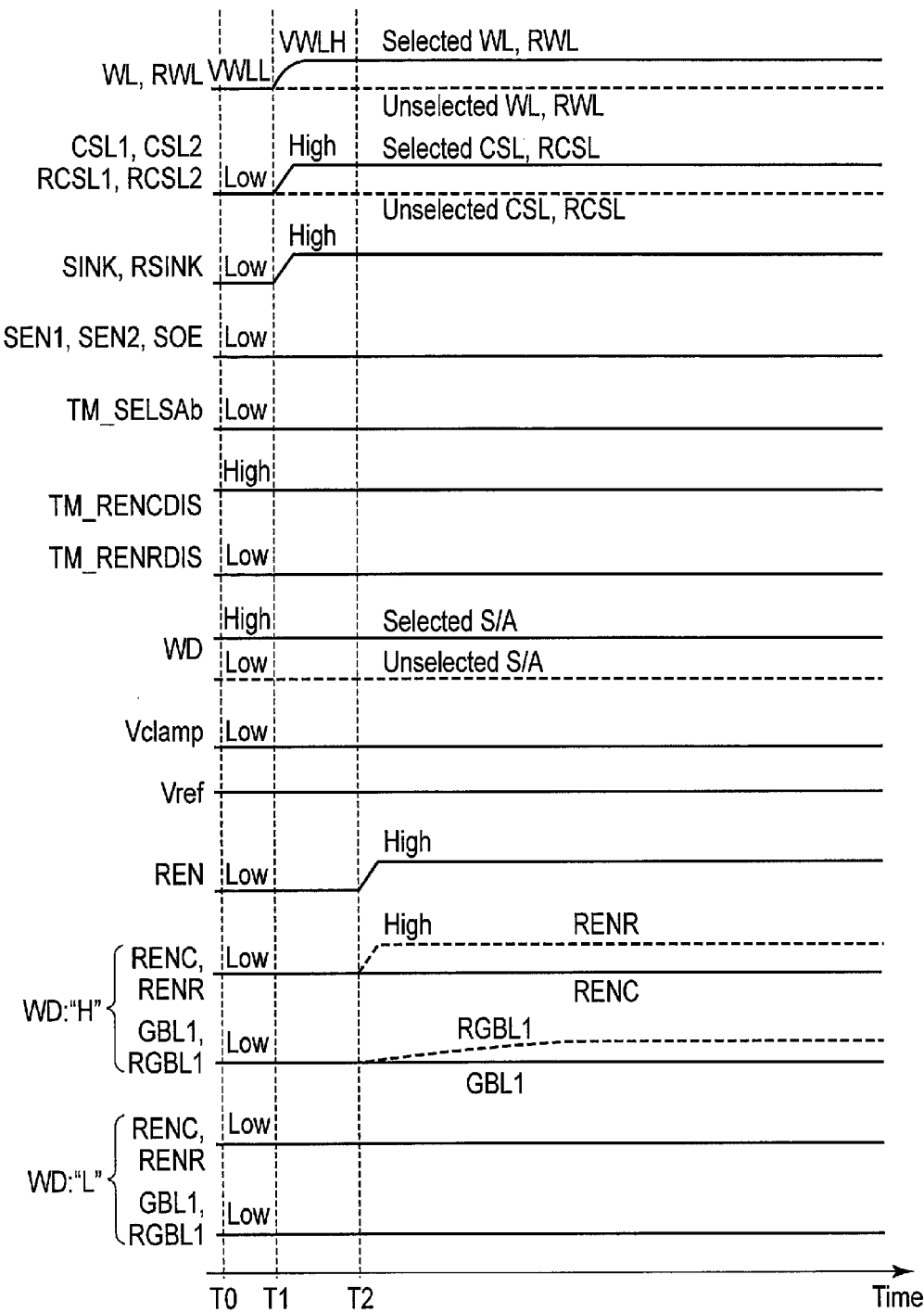
FIG. 11 is a waveform chart of signals when the semiconductor memory device according to the first embodiment executes "Operation 4"

The operation of the semiconductor storage device 100 in above described "Operation 4" will be explained below with reference to FIG. 11. The control circuit 22 executes read test mode 3 as follows.

First, the control circuit 22 enters write test mode A.

Subsequently, the control circuit 22 supplies data "1" to the write data bus WDB belonging to the cell array 31 in which the memory cell MC or reference cell RC as a current measurement target exists, and data "0" to the write data bus WDB belonging to the cell array 31 which is not a current measurement target.

Then, the control circuit 22 enters read test modes A, B, and C.

After that, the control circuit 22 forms a current path to the selected reference cell RC as follows.

[Time T0]

The row decoder 12 sets the voltages of the word line WL and reference word line RWL at "VWLL". The control circuit 22 sets the voltages of the signals CSL1, CSL2, RCSL1, RCSL2, SINK, RSINK, TM_SELSAb, TM_RENRDIS, REN, SEN1, SEN2, and SOE at "L" level. The control circuit 22 also sets the voltage of the signal TM_RENCDIS at "H" level.

The operation of the control logic circuit 35 in "Operation 4" will now be explained with reference to FIGS. 6 and 8. In the control logic circuit 35 corresponding to a sense amplifier as a target of the test operation of "Operation 4", the control circuit 22 sets the test signals TM_SELSAb and TM_RENRDIS at "L" level. Also, the control circuit 22 sets the test signal TM_RENCDIS and write data WD at "H" level. When the signal REN is at "H" level in the control logic circuit 35, therefore, the signal RENR changes to "H" level, and the signal RENC changes to "L" level. At time T0, the signal REN is at "L" level, so the signals RENC and RENR change to "L" level.

In the control logic circuit 35 corresponding to a sense amplifier which is not a target of the test operation of "Operation 4", the control circuit 22 sets the test signals TM_SELSAb and TM_RENRDIS and write data WD at "L" level. Also, the control circuit 22 sets the test signal TM_RENCDIS at "H" level. As a consequence, the signals RENC and RENR change to "L" level regardless of the signal REN.

Accordingly, the PMOS transistors 33a and 33g are turned on, and the NMOS transistors 33d, 33f, 33j, and 33l are turned off, so the signals OUT and OUTb are charged to "H" level.

In addition, the control circuit 22 supplies "H" level data to the write data bus WDB corresponding to the sense amplifier 33 as a test mode target. Also, the control circuit 22 supplies "L" level data to the write data bus WDB corresponding to the sense amplifier 33 which is not a test mode target.

[Time T1]

The operation of the semiconductor storage device 100 at time T1 is the same as that of the semiconductor storage device 100 at time T1 in "Operation 1".

[Time T2]

The control circuit 22 raises the voltage of the signal REN from "L" level to "H" level. Consequently, as explained with reference to FIGS. 6 and 8, the control logic circuit 35 to which the "H" level write data WD is supplied raises the voltage of the signal RENR from "L" level to "H" level. In this case, the control logic circuit 35 maintains the voltage of the signal RENC at "L" level.

Also, the control logic circuit 35 to which the "L" level write data WD is supplied maintains the voltages of the signals RENC and RENR at "L" level. In this example as described above, the control circuit 22 can select the cell array 31 as a target of the test operation, and measure only the reference current Iref, by controlling data to be supplied to the write data bus WDB, and the test signals TM_SELSAb, TM_RENCDIS, and TM_RENRDIS.

Note that when measuring the reference current Iref, the state after the operation at time T2 is maintained, and the electric current of the power supply voltage VDD (the node N1) of the sense amplifier 33 can be measured.

Effects of First Embodiment

In the embodiment described above, in the semiconductor storage device 100 in which a plurality of sense amplifiers simultaneously perform read operations, write data is supplied on the write data bus WDB in accordance with the memory cell MC or reference RC as a read target in a read test mode. The semiconductor storage device 100 has the arrangement which selects a given sense amplifier as an operation target in accordance with the write data, thereby forming a read current path.

To explain the effects of this embodiment, a semiconductor storage device including no control logic circuit 35 will be explained as a comparative example.

A sub memory area 30 according to this comparative example includes no control logic circuit 35. Therefore, the same signal REN is input to the gate electrodes of the NMOS transistors 33f and 33l. Since the semiconductor storage device according to the comparative example does not include the control logic circuit 35 according to this embodiment, the device cannot select a sense amplifier as an operation target by write data in a read operation.

Generally, to increase the read speed of a semiconductor storage device, data is read from the memory cell MC by simultaneously operating a plurality of sense amplifiers by receiving a read operation command. This may generate noise in, e.g., the power supply voltages VDD and VSS, clamp voltage Vclamp, and reference voltage Vref, thereby causing a read operation error.

When analyzing the cause of the operation error like this, it is desirable to individually measure the cell read current Ir flowing through the memory cell MC, or the reference current Iref flowing through the reference cell RC. As described above, however, signals input from the control circuit to the sense amplifier are commonly controlled for each sense amplifier operation. In addition, the semiconductor storage device according to the comparative example does not include the control logic circuit which generates a control signal for the sense amplifier by using write data as disclosed in the first embodiment. In the semiconductor storage device according to the comparative example, a plurality of sense amplifiers simultaneously operate, so no arbitrary electric current can be measured without increasing address signals.

In the semiconductor storage device 100, however, write data corresponding to the memory cell MC or reference cell RC as a measurement target is loaded to the write data bus WDB before the read test operation. Subsequently, the semiconductor storage device 100 operates only a sense amplifier designated by the write data by performing the read test operation in the test mode, thereby forming a read current path to a given memory cell MC or reference cell RC. In this case, the read current of the target memory cell MC or reference cell RC can be measured by measuring the electric current of the power supply voltage. That is, the number of sense amplifiers to be operated at the same time can be controlled by performing a read operation by using write data, without increasing the number of address signals required in a normal operation.

In addition, since the semiconductor storage device 100 according to this embodiment can freely control the number of sense amplifiers to be operated, it is also possible to check the influences of various noises (e.g., the power supply and bit line coupling) by operating a plurality of sense amplifiers.

Second Embodiment

The second embodiment will be explained below. The differences of a semiconductor storage device according to the second embodiment from the semiconductor storage device according to the first embodiment are the arrangement of a control logic circuit 35 and a read operation. Note that the basic arrangement and basic operation of the storage device according to the second embodiment are the same as those of the storage device according to the above described first embodiment. Therefore, an explanation of items explained in the above described first embodiment and items readily analogizable from the above described first embodiment will be omitted.

<Outline of Sense Amplifier>

First, an example of a sense amplifier according to the second embodiment will be explained below. In the sense amplifier 33 according to the first embodiment, the signal RENC is input to the gate electrode of the NMOS transistor 33f, and the signal RENR is input to the gate electrode of the NMOS transistor 33l. The sense amplifier according to the second embodiment differs from the sense amplifier according to the first embodiment in that a signal RENT is input to the gate electrodes of NMOS transistors 33f and 33l.

<Outline of Control Logic Circuit>

An arrangement example of the control logic circuit 35 according to the second embodiment will be explained below with reference to FIG. 12. As shown in FIG. 12, the control logic circuit 35 generates the signal RENT based on signals REN and TM_SELSAb, and write data WD.

More specifically, the control logic circuit 35 includes an OR circuit 35e, NAND circuit 35f, and inverter 35g. The OR circuit 35e has a first input terminal to which the write data WD is input, and a second input terminal to which the test signal TM_SELSAb for a sense amplifier selection operation is input. The OR circuit 35e outputs the operation result from the output terminal. The NAND circuit 35f has a first input terminal to which the signal REN is input, and a second input terminal connected to the output terminal of the OR circuit 35e. The NAND circuit 35f outputs the operation result from the output terminal. The inverter 35g has an input terminal connected to the output terminal of the NAND circuit 35f, and outputs the signal RENT as an operation result from the output terminal.

<"Operation 1">

Next, the operation of the semiconductor storage device according to the second embodiment in "Operation 1" will be explained with reference to FIG. 13.

[Time T0]

A row decoder 12 sets the voltages of a word line WL and reference word line RWL at "VWLL". The control circuit 22 sets the voltages of signals CSL1, CSL2, RCSL1, RCSL2, SINK, RSINK, REN, SEN1, SEN2, and SOE at "L (Low)" level. The control circuit 22 also sets the voltage of the signal TM_SELSAb at "H (High)" level.

The operation of the control logic circuit 35 will now be explained with reference to FIGS. 12 and 14. As shown in FIGS. 12 and 14, the control circuit 22 sets the test signal TM_SELSAb at "H" level. In the control logic circuit 35 as described above, the signal RENT changes to "L" or "H" level in accordance with the driving signal REN supplied from the control circuit 22, regardless of the write data WD. At time T0, the signal REN is at "L" level, so the signal RENT changes to "L" level. Since PMOS transistors 33a and 33g are turned on and NMOS transistors 33d, 33f, 33j, and 33l are turned off, signals OUT and OUTb are charged to "H" level.

[Time T1]

The operation of the semiconductor storage device 100 at time T1 is the same as that of the semiconductor storage device 100 at time T1 in "Operation 1" explained in the first embodiment.

[Time T2]

The control circuit 22 raises the voltage of the signal REN from "L" level to "H" level. Accordingly, as explained with reference to FIG. 14, the control logic circuit 35 raises the voltage of the signal RENT from "L" level to "H" level. Consequently, the sense amplifier 33 is electrically connected to first and second global bit lines GBL1 and GBL2, and the first and second global bit lines GBL1 and GBL2 are charged. Similarly, the sense amplifier 33 is electrically connected to first and second reference global bit lines RGBL1 and RGBL2, and the first and second reference global bit lines RGBL1 and RGBL2 are charged.

[Times T3-T9]

The operations of the semiconductor storage device 100 at times T3 to T9 are the same as those of the semiconductor storage device 100 at times T3 to T9 in "Operation 1" explained in the first embodiment.

<"Operation 2">

The operation of the semiconductor storage device according to the second embodiment in "Operation 2" will be explained below with reference to FIG. 15. The control circuit 22 executes read test mode 1 as follows.

First, the control circuit 22 enters write test mode A. Subsequently, the control circuit 22 supplies data "1" to a write data bus WDB belonging to a cell array 31 in which the memory cell MC or reference cell RC as a read operation target exists, and data "0" to the write data bus WDB belonging to the cell array 31 which is not a read operation target.

Then, the control circuit 22 enters read test mode A. After that, the control circuit 22 executes a read operation on the selected cell array 31 as follows.

[Time T0]

The row decoder 12 sets the voltages of the word line WL and reference word line RWL at "VWLL". The control circuit 22 sets the voltages of the signals CSL1, CSL2, RCSL1, RCSL2, SINK, RSINK, TM_SELSAb, REN, SENT, SEN2, and SOE at "L" level.

The control logic circuit 35 in "Operation 2" will now be explained with reference to FIGS. 12 and 14. The write data WD is set at "L" level in the control logic circuit 35 corresponding to a sense amplifier which is not a target of the test operation of "Operation 2". In the control logic circuit 35, therefore, the signal RENT changes to "L" level regardless of the signal REN.

Also, in the control logic circuit 35 corresponding to a sense amplifier as a target of the test operation of "Operation 2", the control circuit 22 sets the write data WD at "H" level. Consequently, the signal RENT changes to "L" or "H" level in accordance with the driving signal REN supplied from the control circuit 22. At time T0, the signal REN is at "L" level, so the signal RENT changes to "L" level.

Accordingly, the PMOS transistors 33a and 33g are turned on, and the NMOS transistors 33d, 33f, 33j, and 33l are turned off, so the signals OUT and OUTb are charged to "H" level.

In addition, the control circuit 22 supplies "H" level write data WD to the write data bus WDB corresponding to the sense amplifier 33 as a test mode target. Also, the control circuit 22 supplies "L" level write data WD to the write data bus WDB corresponding to the sense amplifier 33 which is not a test mode target.

[Time T1]

The operation of the semiconductor storage device 100 at time T1 is the same as that of the semiconductor storage device 100 at time T1 in "Operation 1" explained in the first embodiment.

[Time T2]

The control circuit 22 raises the voltage of the signal REN from "L" level to "H" level. Consequently, as explained with reference to FIGS. 12 and 14, the control logic circuit 35 to which the "H" level write data WD is supplied raises the voltage of the signal RENT from "L" level to "H" level.

Also, the control logic circuit 35 to which the "L" level write data WD is supplied maintains the voltage of the signal RENT at "L" level. In this example as described above, the control circuit 22 can select the cell array 31 as a target of the test operation by controlling data to be supplied to the write data bus WDB.

[Times T3-T9]

The operations of the semiconductor storage device 100 at times T3 to T9 are the same as those of the semiconductor storage device 100 at times T3 to T9 in "Operation 1" explained in the first embodiment.

<"Operation 3">

Figure 16:
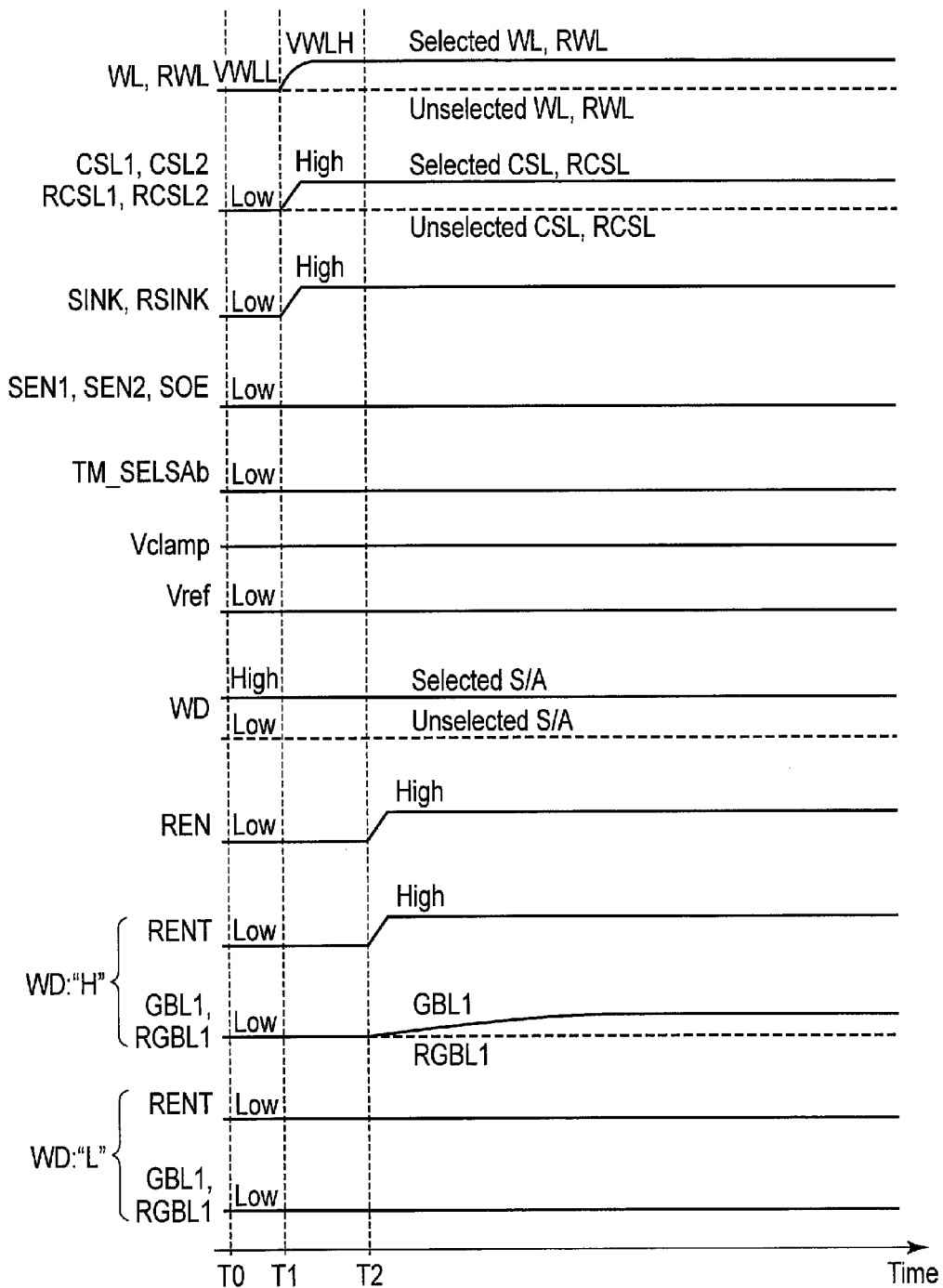
FIG. 16 is a waveform chart of signals when the semiconductor memory device according to the second embodiment executes "Operation 3"

The operation of the semiconductor storage device according to the second embodiment in "Operation 3" will be explained below with reference to FIG. 16. The control circuit 22 executes read test mode 2 as follows.

First, the control circuit 22 enters write test mode A. Subsequently, the control circuit 22 supplies data "1" to the write data bus WDB belonging to the cell array 31 in which the memory cell MC or reference cell RC as a current measurement target exists, and data "0" to the write data bus WDB belonging to the cell array 31 which is not a current measurement target. In addition, the control circuit 22 sets the reference voltage Vref at "L (Low)" level not to form the current path of a reference current Iref.

Then, the control circuit 22 enters read test modes A, B, and C. After that, the control circuit 22 forms a current path to the selected memory cell MC as follows.

[Times T0 & T1]

The operations of the semiconductor storage device 100 at times T0 and T1 are the same as those of the semiconductor storage device at times T0 and T1 in "Operation 2" explained in the second embodiment.

[Time T2]

The control circuit 22 raises the voltage of the signal REN from "L" level to "H" level. Consequently, as explained with reference to FIGS. 12 and 14, the control logic circuit 35 to which the "H" level write data WD is supplied raises the voltage of the signal RENT from "L" level to "H" level.

Also, the control logic circuit 35 to which the "L" level write data WD is supplied maintains the voltage of the signal RENT at "L" level. In this example as described above, the control circuit 22 can select the cell array 31 as a target of the test operation, and measure only the cell read current Ir flowing through a predetermined memory cell MC, by controlling data to be supplied to the write data bus WDB, and the clamp voltage Vclamp and reference voltage Vref.

<"Operation 4">

The operation of the semiconductor storage device according to the second embodiment in "Operation 4" will be explained below with reference to FIG. 17. The control circuit 22 executes read test mode 3 as follows.

First, the control circuit 22 enters write test mode A. Subsequently, the control circuit 22 supplies data "1" to the write data bus WDB belonging to the cell array 31 in which the memory cell MC or reference cell RC as a current measurement target exists, and data "0" to the write data bus WDB belonging to the cell array 31 which is not a current measurement target. In addition, the control circuit 22 sets the clamp voltage Vclamp at "L (Low)" level not to form the current path of a cell read current Ir.

Then, the control circuit 22 enters read test modes A, B, and C. After that, the control circuit 22 forms a current path to the selected reference cell RC as follows.

[Times T0 & T1]

The operations of the semiconductor storage device 100 at times T0 and T1 are the same as those of the semiconductor storage device at times T0 and T1 in "Operation 2" explained in the second embodiment.

[Time T2]

The control circuit 22 raises the voltage of the signal REN from "L" level to "H" level. Consequently, as explained with reference to FIGS. 12 and 14, the control logic circuit 35 to which the "H" level write data WD is supplied raises the voltage of the signal RENT from "L" level to "H" level.

Also, the control logic circuit 35 to which the "L" level write data WD is supplied maintains the voltage of the signal RENT at "L" level. In this example as described above, the control circuit 22 can select the cell array 31 as a target of the test operation, and measure only the reference current Iref flowing through a predetermined reference cell RC, by controlling data to be supplied to the write data bus WDB, and the clamp voltage Vclamp and reference voltage Vref.

Effects of Second Embodiment

In the embodiment described above, the semiconductor storage device 100 controls the clamp voltage Vclamp and reference voltage Vref in a read operation. This makes it possible to implement a control logic circuit having a circuit configuration smaller than that of the control logic circuit of the first embodiment, and achieve the same effects as those of the first embodiment.

Third Embodiment

The third embodiment will be explained below. A semiconductor storage device according to the third embodiment differs from the semiconductor storage device according to the first embodiment in that a control logic circuit controls PMOS transistors 33a and 33g. Note that the basic arrangement and basic operation of the storage device according to the third embodiment are the same as those of the storage device according to the above described first embodiment. Therefore, an explanation of items explained in the above described first embodiment and items readily analogizable from the above described first embodiment will be omitted.

<Outline of Sense Amplifier>

First, an example of a sense amplifier according to the third embodiment will be explained below. In the sense amplifier 33 according to the first embodiment, the signal RENC is input to the gate electrode of the NMOS transistor 33f, and the signal RENR is input to the gate electrode of the NMOS transistor 33l. The sense amplifier according to the third embodiment differs from the sense amplifier according to the first embodiment in that a signal REN is input to the gate electrodes of NMOS transistors 33f and 33l. Also, in the sense amplifier 33 according to the first embodiment, the signal SEN1 is input to the gate electrodes of the PMOS transistors 33a and 33g. The sense amplifier according to the third embodiment differs from the sense amplifier according to the first embodiment in that a signal SEN1T is input to the gate electrodes of the PMOS transistors 33a and 33g.

<Outline of Control Logic Circuit>

An arrangement example of the control logic circuit 35 according to the third embodiment will be explained below with reference to FIG. 18. As shown in FIG. 18, the control logic circuit 35 generates the signal SEN1T based on a signal SEN1b (an inverted signal of a signal SEN1) and a signal TM_SELSAb supplied from a control circuit 22, and write data WD supplied from a write data bus WDB.

More specifically, the control logic circuit 35 includes an OR circuit 35h and NAND circuit 35i. The OR circuit 35h has a first input terminal to which the write data WD is input, and a second input terminal to which the test signal TM_SELSAb for a sense amplifier selection operation is input. The OR circuit 35h outputs the operation result from the output terminal. The NAND circuit 35i has a first input terminal to which the signal SEN1b is input, and a second input terminal connected to the output terminal of the OR circuit 35h. The NAND circuit 35i outputs the operation result from the output terminal.

<"Operation 1">

Next, the operation of the semiconductor storage device according to the third embodiment in "Operation 1" will be explained with reference to FIG. 19.

[Time T0]

A row decoder 12 sets the voltages of a word line WL and reference word line RWL at "VWLL". The control circuit 22 sets the voltages of signals CSL1, CSL2, RCSL1, RCSL2, SINK, RSINK, REN, SEN2, and SOE at "L (Low)" level. The control circuit 22 also sets the voltages of the signal TM_SELSAb and SEN1b at "H (High)" level.

The operation of the control logic circuit 35 will now be explained with reference to FIGS. 18 and 20. As shown in FIGS. 18 and 20, the control circuit 22 sets the test signal TM_SELSAb at "H" level. In the control logic circuit 35 as described above, the signal SEN1T changes to "L" or "H" level in accordance with the signal SEN1b supplied from the control circuit 22, regardless of the write data WD. At time T0, the signal SEN1b is at "H" level, so the signal SEN1T changes to "L" level. Since the PMOS transistors 33a and 33g are turned on and NMOS transistors 33d, 33f, 33j, and 33l are turned off, signals OUT and OUTb are charged to "H" level.

[Times T1 & T2]

The operations of the semiconductor storage device 100 at times T1 and T2 are the same as those of the semiconductor storage device 100 at times T1 and T2 in "Operation 1" explained in the first embodiment.

[Time T3]

The control circuit 22 lowers the voltage of the signal SEN1b from "H" level to "L" level. Accordingly, as explained with reference to FIGS. 18 and 20, the control logic circuit 35 raises the voltage of the signal SEN1T from "L" level to "H" level. As a consequence, the PMOS transistors 33a and 33g are turned off, and a cell read current Ir and reference current Iref discharge the signals OUT and OUTb. If a memory cell MC is in the low resistance state (cell read current Ir>reference current Iref), the voltage level of the signal OUT becomes lower than that of the signal OUTb (OUT<OUTb). If the memory cell MC is in the high resistance state (cell read current Ir<reference current Iref), the voltage level of the signal OUT becomes higher than that of the signal OUTb (OUT>OUTb).

[Times T4-T9]

The operations of the semiconductor storage device 100 at times T4 to T9 are the same as those of the semiconductor storage device 100 at times T4 to T9 in "Operation 1" explained in the first embodiment.

<"Operation 2">

The operation of the semiconductor storage device according to the third embodiment in "Operation 2" will be explained below with reference to FIG. 21. The control circuit 22 executes read test mode 1 as follows.

First, the control circuit 22 enters write test mode A. Subsequently, the control circuit 22 supplies data "1" to a write data bus WDB belonging to a cell array 31 in which the memory cell MC or a reference cell RC as a read operation target exists, and data "0" to the write data bus WDB belonging to the cell array 31 which is not a read operation target.

Then, the control circuit 22 enters read test mode A. After that, the control circuit 22 executes a read operation on the selected cell array 31 as follows.

[Time T0]

The row decoder 12 sets the voltages of the word line WL and reference word line RWL at "VWLL". The control circuit 22 sets the voltages of the signals CSL1, CSL2, RCSL1, RCSL2, SINK, RSINK, TM_SELSAb, REN, SEN2, and SOE at "L" level. The control circuit 22 also sets the voltage of the signal SEN1b at "H (High)" level.

The control logic circuit 35 in "Operation 2" will now be explained with reference to FIGS. 18 and 20. The write data WD is set at "L" level in the control logic circuit 35 corresponding to a sense amplifier which is not a target of the test operation of "Operation 2". In the control logic circuit 35, therefore, the signal SEN1T change to "H" level regardless of the signal SEN1b.

Also, in the control logic circuit 35 corresponding to a sense amplifier as a target of the test operation of "Operation 2", the control circuit 22 sets the write data WD at "H" level. Consequently, the signal SEN1T changes to "L" or "H" level in accordance with the signal SEN1b supplied from the control circuit 22. At time T0, the signal SEN1b is at "H" level, so the signal SEN1T changes to "L" level.

Accordingly, in a sense amplifier as a target of the test operation, the PMOS transistors 33a and 33g are turned on, and the NMOS transistors 33d, 33f, 33j, and 33l are turned off, so the signals OUT and OUTb are charged to "H" level.

In addition, in a sense amplifier which is not a target of the test operation, the PMOS transistors 33a and 33g are turned off.

[Times T1 & T2]

The operations of the semiconductor storage device 100 at times T1 and T2 are the same as those of the semiconductor storage device 100 at times T1 and T2 in "Operation 1" explained in the first embodiment.

[Time T3]

The control circuit 22 lowers the voltage of the signal SEN1b from "H" level to "L" level. Accordingly, as explained with reference to FIGS. 18 and 20, the control logic circuit 35 to which "H" level write data WD is supplied raises the voltage of the signal SEN1T from "L" level to "H" level.

Also, the control logic circuit 35 to which "L" level write data WD is supplied maintains the voltage of the signal SEN1T at "H" level. As a consequence, the PMOS transistors 33a and 33g are kept OFF, so neither the cell read current Ir nor the reference current Iref flows. In this example as described above, the control circuit 22 can select the cell array 31 as a target of the test operation by controlling data to be supplied to the write data bus WDB.

[Times T4-T9]

The operations of the semiconductor storage device 100 at times T4 to T9 are the same as those of the semiconductor storage device 100 at times T4 to T9 in "Operation 1" explained in the first embodiment.

<"Operation 3">

Figure 22:
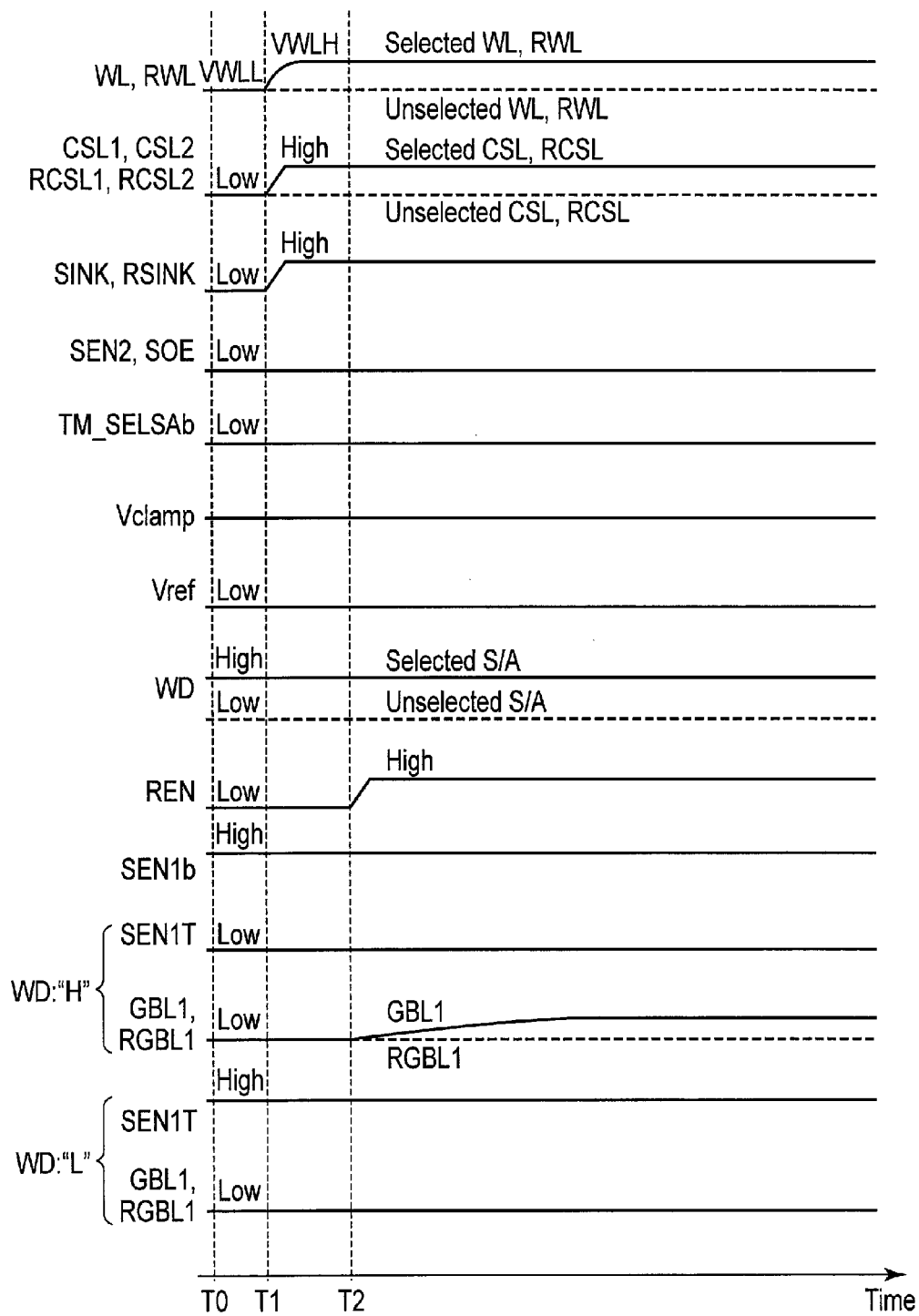
FIG. 22 is a waveform chart of signals when the semiconductor memory device according to the third embodiment executes "Operation 3"

The operation of the semiconductor storage device according to the third embodiment in "Operation 3" will be explained below with reference to FIG. 22. The control circuit 22 executes read test mode 2 as follows.

First, the control circuit 22 enters write test mode A. Subsequently, the control circuit 22 supplies data "1" to the write data bus WDB belonging to the cell array 31 in which the memory cell MC or reference cell RC as a current measurement target exists, and data "0" to the write data bus WDB belonging to the cell array 31 which is not a current measurement target. In addition, the control circuit 22 sets the reference voltage Vref at "L (Low)" level not to form the current path of a reference current Iref.

Then, the control circuit 22 enters read test modes A, B, and C. After that, the control circuit 22 forms a current path to the selected memory cell MC as follows.

[Times T0 & T1]

The operations of the semiconductor storage device 100 at times T0 and T1 are the same as those of the semiconductor storage device 100 at times T0 and T1 in "Operation 2" explained in the third embodiment.

[Time T2]

The control logic circuit 35 to which the "L" level write data WD is supplied maintains the voltage of the signal SENT at "H" level. In this example as described above, the control circuit 22 can select the cell array 31 as a target of the test operation, and measure only the cell read current Ir flowing through a predetermined memory cell MC, by controlling data to be supplied to the write data bus WDB, and the clamp voltage Vclamp and reference voltage Vref.

<"Operation 4">

The operation of the semiconductor storage device according to the third embodiment in "Operation 4" will be explained below with reference to FIG. 23. The control circuit 22 executes read test mode 3 as follows.

First, the control circuit 22 enters write test mode A. Subsequently, the control circuit 22 supplies data "1" to the write data bus WDB belonging to the cell array 31 in which the memory cell MC or reference cell RC as a current measurement target exists, and data "0" to the write data bus WDB belonging to the cell array 31 which is not a current measurement target. In addition, the control circuit 22 sets the clamp voltage Vclamp at "L (Low)" level not to form the current path of a cell read current Ir.

Then, the control circuit 22 enters read test modes A, B, and C. After that, the control circuit 22 forms a current path to the selected reference cell RC as follows.

[Times T0 & T1]

The operations of the semiconductor storage device 100 at times T0 and T1 are the same as those of the semiconductor storage device at times T0 and T1 in "Operation 2" explained in the third embodiment.

[Time T2]

The control logic circuit 35 to which the "L" level write data WD is supplied maintains the voltage of the signal SEN1T at "H" level. In this example as described above, the control circuit 22 can select the cell array 31 as a target of the test operation, and measure only the reference current Iref flowing through a predetermined reference cell RC, by controlling data to be supplied to the write data bus WDB, and the clamp voltage Vclamp and reference voltage Vref.

Effects of Third Embodiment

In the embodiment described above, the semiconductor storage device 100 controls the clamp voltage Vclamp and reference voltage Vref in a read operation. This makes it possible to implement a control logic circuit having a circuit configuration smaller than that of the control logic circuit of the first embodiment, and achieve the same effects as those of the first embodiment.

Fourth Embodiment

The fourth embodiment will be explained below. The difference of a semiconductor storage device according to the fourth embodiment from the semiconductor storage device according to the first embodiment is an additional read current source circuit. Note that the basic arrangement and basic operation of the storage device according to the fourth embodiment are the same as those of the storage device according to the above described first embodiment. Therefore, an explanation of items explained in the above described first embodiment and items readily analogizable from the above described first embodiment will be omitted.

<Outline of Sense Amplifier>

First, an example of a sense amplifier 33 according to the fourth embodiment will be explained below with reference to FIG. 24. When compared to the sense amplifier 33 according to the first embodiment, the sense amplifier 33 according to the fourth embodiment further includes PMOS transistors 33m and 33n which function as the additional read current source circuit. The PMOS transistor 33m has a current path having one end connected to a node N10 to which a power supply voltage VDDx is supplied, and the other end connected to a node N2, and includes a gate electrode to which a signal SEN1T is input. Also, PMOS transistor 33n has a current path having one end connected to the node N10 to which the power supply voltage VDDx is supplied, and the other end connected to a node N4, and includes a gate electrode to which the signal SEN1T is input.

Also, in the sense amplifier 33 according to the first embodiment, the signal RENC is input to the gate electrode of the NMOS transistor 33f, and the signal RENR is input to the gate electrode of the NMOS transistor 33l. In the sense amplifier 33 according to the fourth embodiment, a signal REN is input to the gate electrodes of NMOS transistors 33f and 33l.

Note that the power supply voltage VDDx can be a test monitoring power supply voltage, but may also be a power supply voltage of a first write driver 34 or second write driver 38. That is, it is only necessary to apply a voltage from an external PAD and measure the electric current by DC measurement.

<Outline of Control Logic Circuit>

An arrangement example of a control logic circuit 35 according to the fourth embodiment will be explained below with reference to FIG. 25. As shown in FIG. 25, the control logic circuit 35 generates a signal SEN1T based on a signal TM_SELSA and write data WD.

More specifically, the control logic circuit 35 includes a NAND circuit 35j. The NAND circuit 35j has a first input terminal to which the write data WD is input, and a second input terminal to which the test signal TM_SELSA for a sense amplifier selection operation is input. The NAND circuit 35j outputs the signal SEN1T as the operation result from the output terminal.

<"Operation 1">

Next, the operation of the semiconductor storage device 100 in "Operation 1" will be explained with reference to FIG. 26.

[Time T0]

A row decoder 12 sets the voltages of a word line WL and reference word line RWL at "VWLL". A control circuit 22 sets the voltages of signals CSL1, CSL2, RCSL1, RCSL2, SINK, RSINK, TM_SELSA, REN, SEN1, SEN2, and SOE at "L (Low)" level.

The operation of the control logic circuit 35 will now be explained with reference to FIGS. 25 and 27. As shown in FIGS. 25 and 27, the control circuit 22 sets the test signal TM_SELSA at "L" level. In the control logic circuit 35 as described above, the signal SEN1T changes to "H" level regardless of the write data WD.

Accordingly, PMOS transistors 33a and 33g are turned on, the PMOS transistors 33m and 33n are turned off, and NMOS transistors 33d, 33f, 33j, and 33l are turned off, so signals OUT and OUTb are charged to "H" level.

[Time T1]

The operation of the semiconductor storage device 100 at time T1 is the same as that of the semiconductor storage device 100 at time T1 in "Operation 1" explained in the first embodiment.

[Time T2]

The control circuit 22 raises the voltage of the signal REN from "L" level to "H" level. The sense amplifier 33 is electrically connected to first and second global bit lines GBL1 and GBL2, and the first and second global bit lines GBL1 and GBL2 are charged. Similarly, the sense amplifier 33 is electrically connected to first and second reference global bit lines RGBL1 and RGBL2, and the first and second reference global bit lines RGBL1 and RGBL2 are charged.

[Times T3-T9]

The operations of the semiconductor storage device 100 at times T3 to T9 are the same as those of the semiconductor storage device 100 at times T3 to T9 in "Operation 1" explained in the first embodiment.

<"Operation 3">

Figure 28:
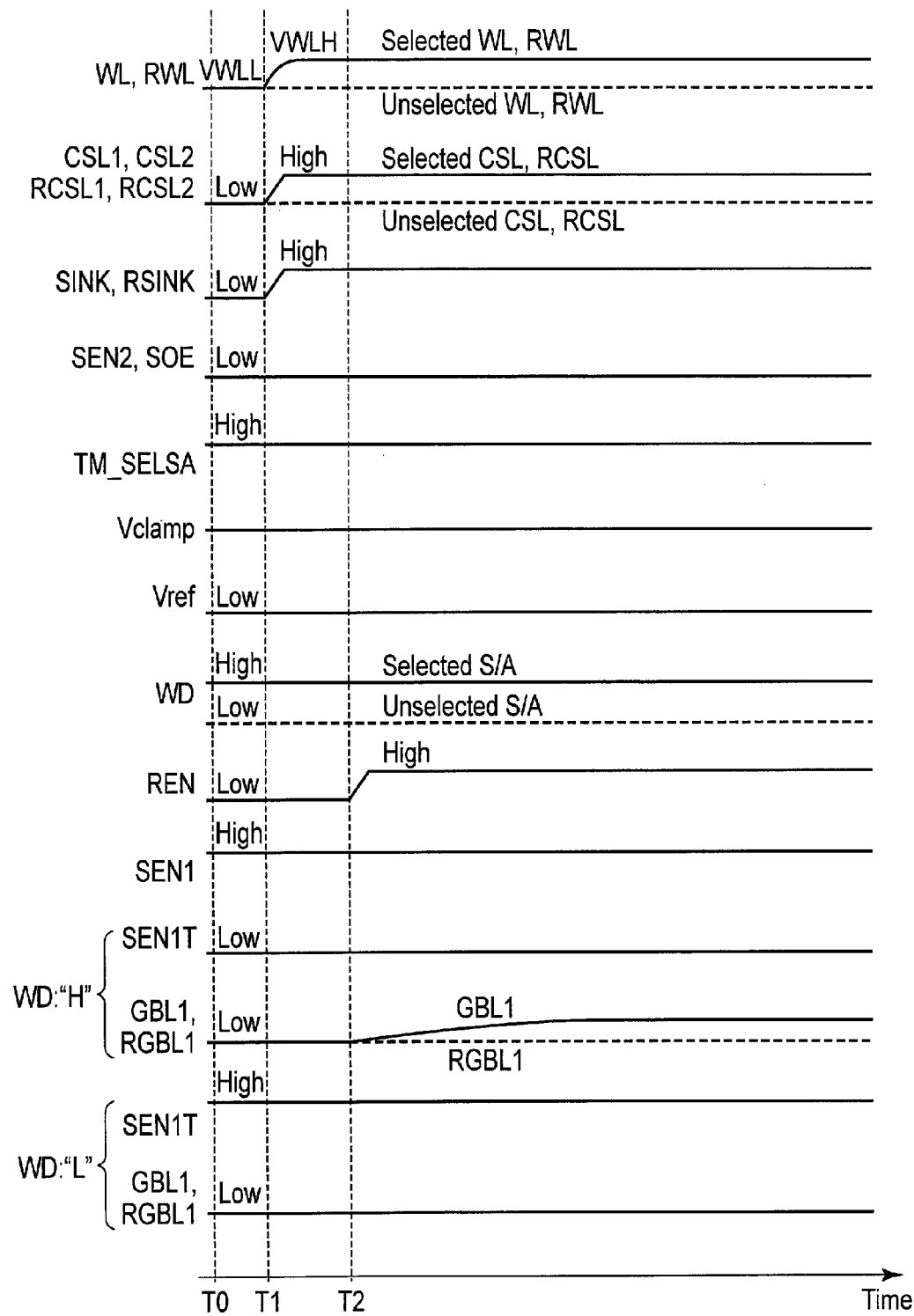
FIG. 28 is a waveform chart of signals when the semiconductor memory device according to the fourth embodiment executes "Operation 3"

The operation of the semiconductor storage device 100 in "Operation 3" will be explained below with reference to FIG. 28. The control circuit 22 executes read test mode 2 as follows.

First, the control circuit 22 enters write test mode A. Subsequently, the control circuit 22 supplies data "1" to a write data bus WDB belonging to a cell array 31 in which a memory cell MC or reference cell RC as a current measurement target exists, and data "0" to the write data bus WDB belonging to the cell array 31 which is not a current measurement target. In addition, the control circuit 22 sets the reference voltage Vref at "L (Low)" level not to form the current path of a reference current Iref.

Then, the control circuit 22 enters read test modes A, B, and C. After that, the control circuit 22 forms a current path to the selected memory cell MC as follows.

[Time T0]

The row decoder 12 sets the voltages of the word line WL and reference word line RWL at "VWLL". The control circuit 22 sets the voltages of the signals CSL1, CSL2, RCSL1, RCSL2, SINK, RSINK, REN, SEN2, and SOE at "L" level. The control circuit 22 also sets the voltage of the signal TM_SELSA and SEN1 at "H" level.

Furthermore, the control circuit 22 supplies "H" level data to the write data bus WDB corresponding to the sense amplifier 33 as a test mode target. In addition, the control circuit 22 supplies "L" level data to the data bus WDB corresponding to the sense amplifier 33 which is not a test mode target.

The operation of the control logic circuit 35 in "Operation 3" will now be explained with reference to FIGS. 25 and 27. In the control logic circuit 35 corresponding to a sense amplifier as a target of the test operation of "Operation 3", the control circuit 22 sets the write data WD at "H" level. In the control logic circuit 35, therefore, the signal SEN1T changes to "L" level.

In the control logic circuit 35 corresponding to a sense amplifier which is not a target of the test operation of "Operation 3", the control circuit 22 sets the write data WD at "L" level. As a consequence, the signal SEN1T changes to "H" level.

Accordingly, in the sense amplifier 33 as a test mode target, the PMOS transistors 33*m* and 33*n* are turned on, and the PMOS transistors 33*a* and 33*g* and NMOS transistors 33*d*, 33*f*, 33*j*, and 33*l* are turned off, so the signals OUT and OUTb are charged from the power supply voltage VDDx to "H" level.

Also, the control circuit 22 supplies "H" level data to the write data bus WDB corresponding to the sense amplifier 33 as a test mode target. In addition, the control circuit 22 supplies "L" level data to the write data bus WDB corresponding to the sense amplifier 33 which is not a test mode target.

[Time T1]

The operation of the semiconductor storage device 100 at time T1 is the same as that of the semiconductor storage device 100 at time T1 in "Operation 1" explained in the first embodiment.

[Time T2]

The control circuit 22 raises the voltage of the signal REN from "L" level to "H" level.

In this example as described above, the control circuit 22 can select the cell array 31 as a target of the test operation, and measure only the cell read current Ir flowing through a predetermined memory cell MC, by controlling data to be supplied to the write data bus WDB, and the clamp voltage Vclamp and reference voltage Vref. The cell read current Ir flowing through the predetermined memory cell MC can be measured by applying VDDx from an external PAD and measuring the electric current by DC measurement.

<"Operation 4">

Figure 29:
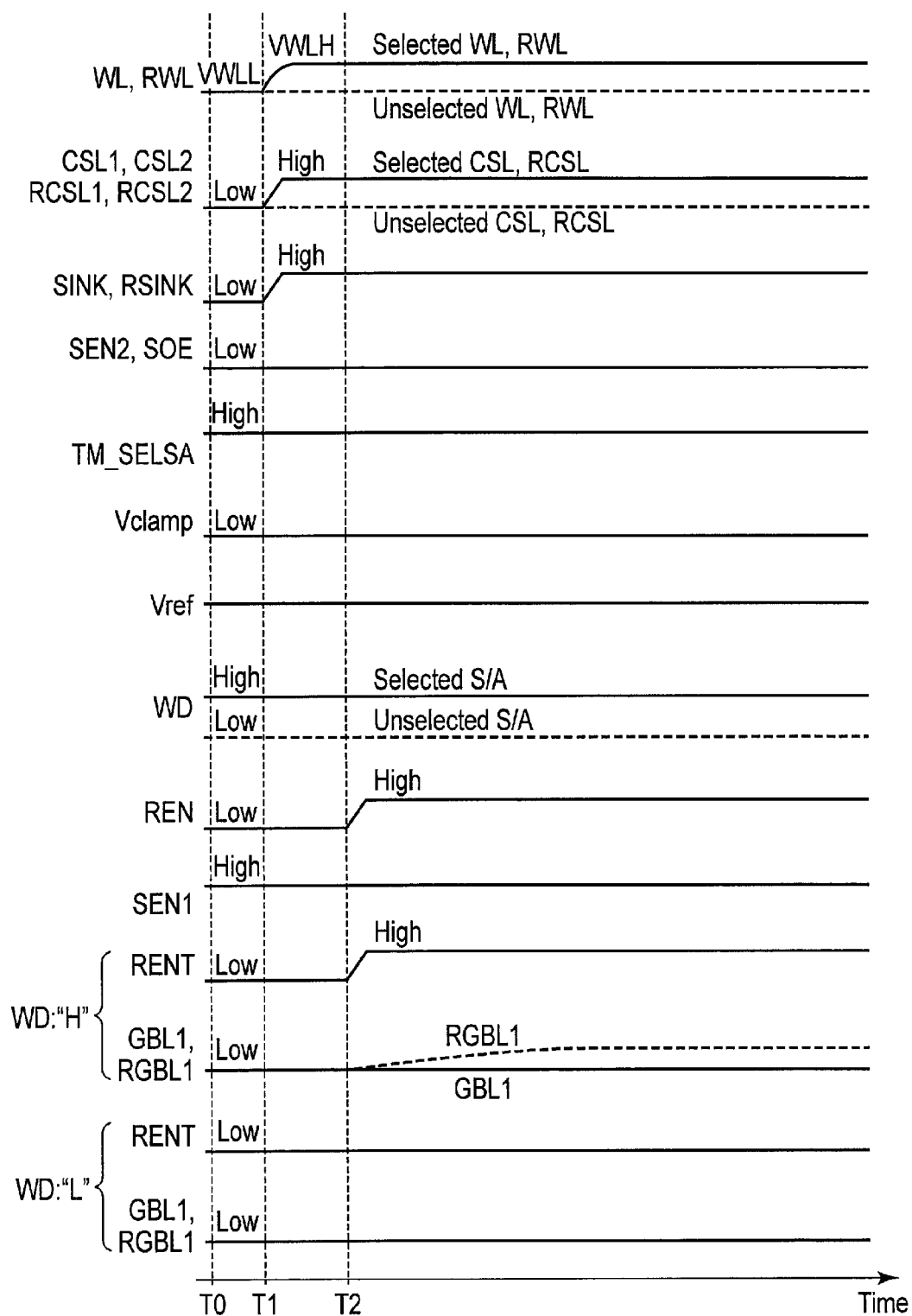
FIG. 29 is a waveform chart of signals when the semiconductor memory device according to the fourth embodiment executes "Operation 4"

The operation of the semiconductor storage device 100 according to the fourth embodiment in "Operation 4" will be explained below with reference to FIG. 29. The control circuit 22 executes read test mode 3 as follows.

First, the control circuit 22 enters write test mode A. Subsequently, the control circuit 22 supplies data "1" to the write data bus WDB belonging to the cell array 31 in which the memory cell MC or reference cell RC as a current measurement target exists, and data "0" to the write data bus WDB belonging to the cell array 31 which is not a current measurement target. In addition, the control circuit 22 sets the clamp voltage Vclamp at "L (Low)" level not to form the current path of a cell read current Ir.

Then, the control circuit 22 enters read test modes A, B, and C. After that, the control circuit 22 forms a current path to the selected reference cell RC as follows.

[Times T0 & T1]

The operations of the semiconductor storage device 100 at times T0 and T1 are the same as those of the semiconductor storage device at times T0 and T1 in "Operation 3" explained in the fourth embodiment.

[Time T2]

The control circuit 22 raises the voltage of the signal REN from "L" level to "H" level.

In this example as described above, the control circuit 22 can select the cell array 31 as a target of the test operation, and measure only the reference current Iref flowing through a predetermined reference cell RC, by controlling data to be supplied to the write data bus WDB, and the clamp voltage Vclamp and reference voltage Vref. The reference current Iref flowing through the predetermined reference cell RC can be measured by applying VDDx from an external PAD and measuring the electric current by DC measurement.

Effects of Fourth Embodiment

In the embodiment described above, the semiconductor storage device 100 controls the clamp voltage Vclamp and reference voltage Vref in a read operation. This makes it possible to implement a control logic circuit having a circuit configuration smaller than that of the control logic circuit of the first embodiment, and achieve the same effects as those of the first embodiment. There is another advantage that when the number of elements to be connected and the off leakage current for the power supply voltage VDDx are smaller than those of the power supply voltage VDD, the measurement accuracy increases.

Fifth Embodiment

The fifth embodiment will be explained below. The difference of a semiconductor storage device according to the fifth embodiment from the semiconductor storage device according to the fourth embodiment is a control logic circuit. Note that the basic arrangement and basic operation of the storage device according to the fifth embodiment are the same as those of the storage device according to the above described fourth embodiment. Therefore, an explanation of items explained in the above described fourth embodiment and items readily analogizable from the above described fourth embodiment will be omitted.

<Outline of Sense Amplifier>

First, an example of a sense amplifier 33 according to the fifth embodiment will be explained below. In the sense amplifier 33 according to the fourth embodiment, the signal SEN1 is input to the gate electrodes of the PMOS transistors 33a and 33g. In the sense amplifier 33 according to the fifth embodiment, however, a signal SEN1N supplied from a control logic circuit 35 is input to the gate electrodes of PMOS transistors 33a and 33g.

<Outline of Control Logic Circuit>

An arrangement example of the control logic circuit 35 according to the fifth embodiment will be explained below with reference to FIG. 30. As shown in FIG. 30, the control logic circuit 35 generates a signal SEN1T and the signal SEN1N based on signals SEN1b and TM_SELSAb, and write data WD.

More specifically, the control logic circuit 35 includes an inverter 35k, a NOR circuit 35l, and NAND circuits 35m and 35n. The inverter 35k has an input terminal to which the write data WD is input, and an output terminal from which an inverted signal of the write data WD is output. The NOR circuit 35l has a first input terminal connected to the output terminal of the inverter 35k, and a second input terminal to which the test signal TM_SELSAb for a sense amplifier selection operation is input. The NOR circuit 35l outputs the operation result from the output terminal. The NAND circuit 35m has a first input terminal to which the test signal TM_SELSAb for a sense amplifier selection operation is input, and a second input terminal to which a signal SEN1b is input. The NAND circuit 35m outputs the signal SEN1N as the operation result from the output terminal. The NAND circuit 35n has a first input terminal connected to the output terminal of the NOR circuit 35l, and a second input terminal to which the signal SEN1b is input. The NAND circuit 35n outputs the signal SEN1T as the operation result from the output terminal.

<"Operation 1">

Next, the operation of the semiconductor storage device 100 in above described "Operation 1" will be explained with reference to FIG. 31.

[Time T0]

A row decoder 12 sets the voltages of a word line WL and reference word line RWL at "VWLL". A control circuit 22 sets the voltages of signals CSL1, CSL2, RCSL1, RCSL2, SINK, RSINK, REN, SEN2, and SOE at "L (Low)" level. The control circuit 22 also sets the voltages of the signals TM_SELSAb and SEN1b at "H (High)" level.

The operation of the control logic circuit 35 will now be explained with reference to FIGS. 30 and 32. As shown in FIGS. 30 and 32, the control circuit 22 sets the test signal TM_SELSAb at "H" level. In the control logic circuit 35 as described above, the signal SEN1N changes to "L" or "H" level in accordance with the driving signal SEN1b supplied from the control circuit 22, regardless of the write data WD. Also, the signal SEN1T is at "H" level regardless of the driving signal SEN1b.

At time T0, the signal SEN1b is at "H" level, so the signal SEN1N changes to "L" level. Since PMOS transistors 33a and 33g are turned on and the PMOS transistors 33m and 33n and NMOS transistors 33d, 33f, 33j, and 33l are turned off, signals OUT and OUTb are charged to "H" level.

[Times T1 & T2]

The operations of the semiconductor storage device 100 at times T1 and T2 are the same as those of the semiconductor storage device 100 at times T1 and T2 in "Operation 1" explained in the fourth embodiment.

[Time T3]

The control circuit 22 lowers the voltage of the signal SEN1b from "H" level to "L" level. Accordingly, as shown in FIGS. 30 and 32, the control logic circuit 35 raises the voltage of the signal SEN1N from "L" level to "H" level. As a consequence, the PMOS transistors 33a and 33g are turned off, and a cell read current Ir and reference current Iref discharge the signals OUT and OUTb. If a memory cell MC is in the low resistance state (cell read current Ir>reference current Iref), the voltage level of the signal OUT becomes lower than that of the signal OUTb (OUT<OUTb). If the memory cell MC is in the high resistance state (cell read current Ir<reference current Iref), the voltage level of the signal OUT becomes higher than that of the signal OUTb (OUT>OUTb).

[Times T4-T8]

The operations of the semiconductor storage device 100 at times T4 to T8 are the same as those of the semiconductor storage device 100 at times T4 to T8 in "Operation 1" explained in the first embodiment.

[Time T9]

The control circuit 22 raises the voltage of the signal SEN1b from "L" level to "H" level. Therefore, the control circuit 35 lowers the voltage of the signal SEN1N from "H" level to "L" level. As a consequence, the PMOS transistors 33a and 33g are turned on, and the PMOS transistors 33m and 33n and NMOS transistors 33d, 33f, 33j, and 33l are turned off, so the signals OUT and OUTb are charged to "H" level.

<"Operation 2">

Figure 33:
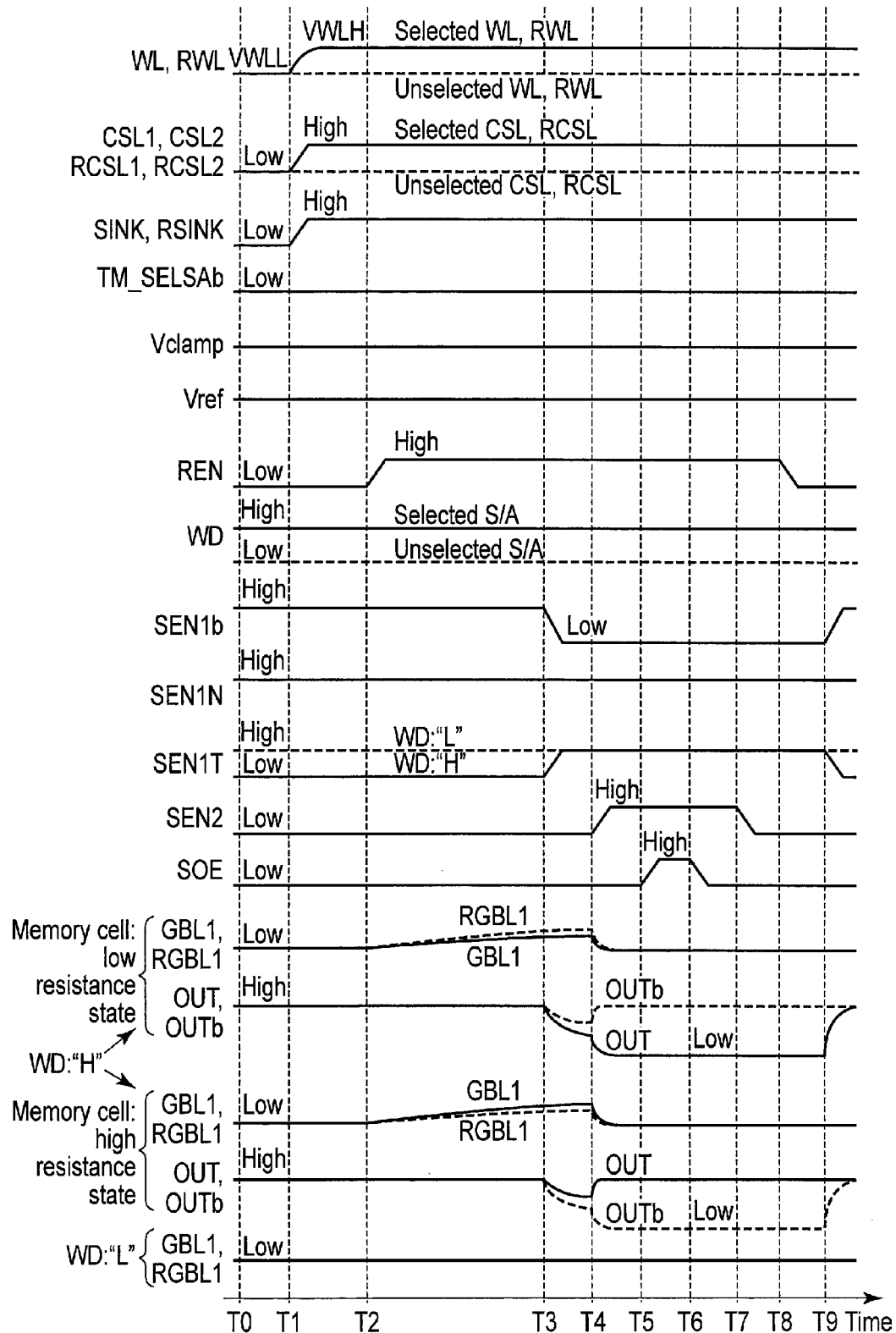
FIG. 33 is a waveform chart of signals when the semiconductor memory device according to the fifth embodiment executes "Operation 2"

The operation of the semiconductor storage device 100 in above described "Operation 2" will be explained below with reference to FIG. 33. The control circuit 22 executes read test mode 1 as follows.

First, the control circuit 22 enters write test mode A. Subsequently, the control circuit 22 supplies data "1" to a write data bus WDB belonging to a cell array 31 in which the memory cell MC or a reference cell RC as a read operation target exists, and data "0" to the write data bus WDB belonging to the cell array 31 which is not a read operation target.

Then, the control circuit 22 enters read test mode A. After that, the control circuit 22 executes a read operation on the selected cell array 31 as follows.

[Time T0]

The row decoder 12 sets the voltages of the word line WL and reference word line RWL at "VWLL". The control circuit 22 sets the voltages of the signals CSL1, CSL2, RCSL1, RCSL2, SINK, RSINK, TM_SELSAb, REN, SEN2, and SOE at "L" level. The control circuit 22 also sets the voltage of the signal SEN1b at "H" level.

Furthermore, the control circuit 22 supplies "H" level data to the write data bus WDB corresponding to the sense amplifier 33 as a test mode target. In addition, the control circuit 22 supplies "L" level data to the write data bus WDB corresponding to the sense amplifier 33 which is not a test mode target.

The control logic circuit 35 in "Operation 2" will now be explained with reference to FIGS. 30 and 32. Since the signal TM_SELSAb is at "L" level, the signal SEN1N is at "H" level regardless of the write data WD. Also, the write data WD is set at "L" level in the control logic circuit 35 corresponding to a sense amplifier which is not a target of the test operation of "Operation 2". In the control logic circuit 35, therefore, the signal SEN1T changes to "H" level regardless of the signal SEN1b.

Also, in the control logic circuit 35 corresponding to a sense amplifier as a target of the test operation of "Operation 2", the control circuit 22 sets the write data WD at "H" level. Consequently, the signal SEN1T changes to "L" or "H" level in accordance with the signal SEN1b supplied from the control circuit 22. At time T0, the signal REN is at "L" level. In addition, the signal SEN1N changes to "H" level regardless of the signal SEN1b.

Accordingly, in a sense amplifier as a target of the test operation, the PMOS transistors 33m and 33n are turned on, and the PMOS transistors 33a and 33g and NMOS transistors 33d, 33f, 33j, and 33l are turned off, so the signals OUT and OUTb are charged to "H" level.

In addition, in a sense amplifier which is not a target of the test operation, the PMOS transistors 33m and 33n are turned off, so the signals OUT and OUTb are not charged to "H" level.

[Times T1 & T2]

The operations of the semiconductor storage device 100 at times T1 and T2 are the same as those of the semiconductor storage device 100 at times T1 and T2 in "Operation 1" explained in the fifth embodiment.

[Time T3]

The control circuit 22 lowers the voltage of the signal SEN1b from "H" level to "L" level. Accordingly, as shown in FIGS. 30 and 32, the control logic circuit 35 raises the voltage of the signal SEN1T from "L" level to "H" level. As a consequence, the PMOS transistors 33m and 33n are turned off, and the cell read current Ir and reference current Iref discharge the signals OUT and OUTb. If the memory cell MC is in the low resistance state (cell read current Ir>reference current Iref), the voltage level of the signal OUT becomes lower than that of the signal OUTb (OUT<OUTb). If the memory cell MC is in the high resistance state (cell read current Ir<reference current Iref), the voltage level of the signal OUT becomes higher than that of the signal OUTb (OUT>OUTb).

[Times T4-T8]

The operations of the semiconductor storage device 100 at times T4 to T8 are the same as those of the semiconductor storage device 100 at times T4 to T8 in "Operation 1" explained in the first embodiment.

[Time T9]

The control circuit 22 raises the voltage of the signal SEN1b from "L" level to "H" level. Therefore, the control circuit 35 lowers the voltage of the signal SEN1T from "H" level to "L" level. As a consequence, the PMOS transistors 33m and 33n are turned on, and the PMOS transistors 33a and 33g and NMOS transistors 33d, 33f, 33j, and 33l are turned off, so the signals OUT and OUTb are charged to "H" level.

<"Operation 3">

Figure 34:
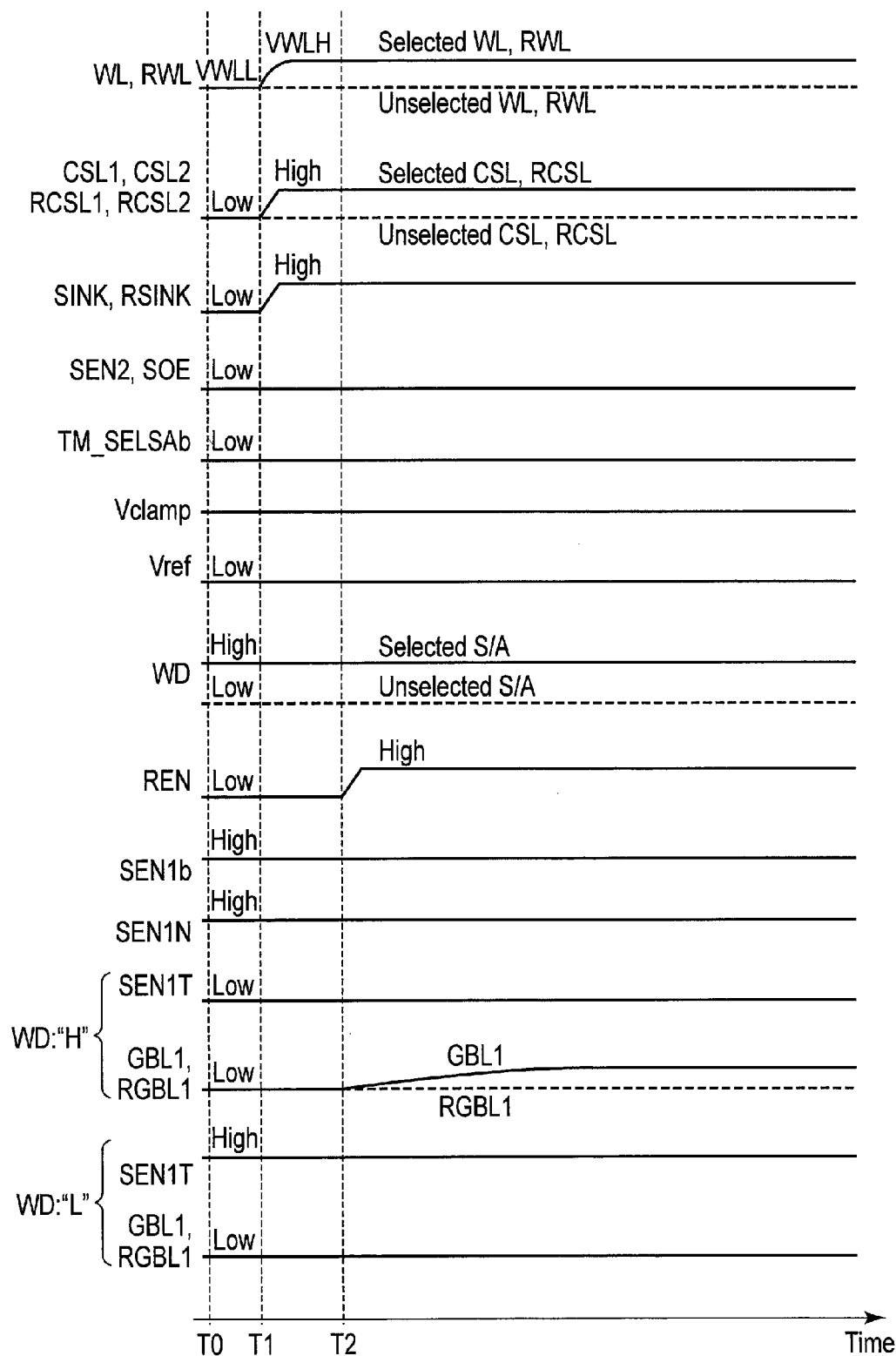
FIG. 34 is a waveform chart of signals when the semiconductor memory device according to the fifth embodiment executes "Operation 3"

The operation of the semiconductor storage device 100 in "Operation 3" will be explained below with reference to FIG. 34. The control circuit 22 executes read test mode 2 as follows.

First, the control circuit 22 enters write test mode A. Subsequently, the control circuit 22 supplies data "1" to the write data bus WDB belonging to the cell array 31 in which the memory cell MC or reference cell RC as a current measurement target exists, and data "0" to the write data bus WDB belonging to the cell array 31 which is not a current measurement target. In addition, the control circuit 22 sets the reference voltage Vref at "L (Low)" level not to form the current path of a reference current Iref.

Then, the control circuit 22 enters read test modes A, B, and C. After that, the control circuit 22 forms a current path to the selected memory cell MC as follows.

[Time T0]

The row decoder 12 sets the voltages of the word line WL and reference word line RWL at "VWLL". The control circuit 22 sets the voltages of the signals CSL1, CSL2, RCSL1, RCSL2, SINK, RSINK, TM_SELSAb, REN, SEN2, and SOE at "L" level. The control circuit 22 also sets the voltage of the signal SEN1b at "H" level.

Furthermore, the control circuit 22 supplies "H" level data to the write data bus WDB corresponding to the sense amplifier 33 as a test mode target. In addition, the control circuit 22 supplies "L" level data to the data bus WDB corresponding to the sense amplifier 33 which is not a test mode target.

The operation of the control logic circuit 35 in "Operation 3" will now be explained with reference to FIGS. 30 and 32. In the control logic circuit 35 corresponding to a sense amplifier as a target of the test operation of "Operation 3", the control circuit 22 sets the write data WD at "H" level. In the control logic circuit 35, therefore, the signal SEN1T changes to "L" level.

In the control logic circuit 35 corresponding to a sense amplifier which is not a target of the test operation of "Operation 3", the control circuit 22 sets the write data WD at "L" level. As a consequence, the signal SEN1T changes to "H" level.

Accordingly, in the sense amplifier 33 as a test mode target, the PMOS transistors 33m and 33n are turned on, and the PMOS transistors 33a and 33g and NMOS transistors 33d, 33f, 33j, and 33l are turned off, so the signals OUT and OUTb are charged to "H" level.

Also, in a sense amplifier which is not a target of the test operation, the PMOS transistors 33m and 33n are turned off, so the signals OUT and OUTb are not charged to "H" level.

[Times T1 & T2]

The operations of the semiconductor storage device 100 at times T1 and T2 are the same as those of the semiconductor storage device 100 at times T1 and T2 in "Operation 3" explained in the fourth embodiment.

In this example as described above, the control circuit 22 can select the cell array 31 as a target of the test operation, and measure only the cell read current Ir flowing through a predetermined memory cell MC, by controlling data to be supplied to the write data bus WDB, and the clamp voltage Vclamp and reference voltage Vref. The cell read current Ir flowing through the predetermined memory cell MC can be measured by applying VDDx from an external PAD and measuring the electric current by DC measurement.

<"Operation 4">

The operation of the semiconductor storage device 100 in "Operation 4" will be explained below with reference to FIG. 35. The control circuit 22 executes read test mode 3 as follows.

First, the control circuit 22 enters write test mode A. Subsequently, the control circuit 22 supplies data "1" to the write data bus WDB belonging to the cell array 31 in which the memory cell MC or reference cell RC as a current measurement target exists, and data "0" to the write data bus WDB belonging to the cell array 31 which is not a current measurement target. In addition, the control circuit 22 sets the clamp voltage Vclamp at "L (Low)" level not to form the current path of a cell read current Ir.

Then, the control circuit 22 enters read test modes A, B, and C. After that, the control circuit 22 forms a current path to the selected reference cell RC as follows.

[Times T0]

The operation of the semiconductor storage device 100 at time T0 is the same as that of the semiconductor storage device 100 at time T0 in "Operation 3" explained in the fifth embodiment.

[Times T1 & T2]

The operations of the semiconductor storage device 100 at times T1 and T2 are the same as those of the semiconductor storage device 100 at times T1 and T2 in "Operation 3" explained in the fourth embodiment.

In this example as described above, the control circuit 22 can select the cell array 31 as a target of the test operation, and measure only the reference current Iref flowing through a predetermined reference cell RC, by controlling data to be supplied to the write data bus WDB, and the clamp voltage Vclamp and reference voltage Vref. The reference current Iref flowing through the predetermined reference cell RC can be measured by applying VDDx from an external PAD and measuring the electric current by DC measurement.

Effects of Fifth Embodiment

In the embodiment described above, the semiconductor storage device 100 controls the clamp voltage Vclamp and reference voltage Vref in a read operation. This makes it possible to achieve the same effects as those of the fourth embodiment. There is another advantage that the semiconductor storage device 100 according to this embodiment can perform a power supply voltage sensitivity test on the sense amplifier 33 by changing VDDx.

Sixth Embodiment

The sixth embodiment will be explained below. A semiconductor storage device according to the sixth embodiment differs from the first embodiment in that a control logic circuit controls a read current sink instead of a sense amplifier. Note that the basic arrangement and basic operation of the storage device according to the sixth embodiment are the same as those of the storage device according to the above described first embodiment. Therefore, an explanation of items explained in the above described first embodiment and items readily analogizable from the above described first embodiment will be omitted.

<Outline of Memory Area>

A memory area 11 according to the sixth embodiment will be explained below with reference to FIG. 36. The memory area 11 according to the sixth embodiment does not include the control logic circuit 35 included in the memory area 11 according to the first embodiment. When compared to the memory area 11 according to the first embodiment, the memory area 11 according to the sixth embodiment further includes a control logic circuit 39 which is connected to a write data bus WDB and controls a read current sink 37.

<Outline of Sense Amplifier>

First, an example of a sense amplifier according to the sixth embodiment will be explained below. In the sense amplifier 33 according to the first embodiment, the signal RENC is input to the gate electrode of the NMOS transistor 33$f$, and the signal RENR is input to the gate electrode of the NMOS transistor 33$l$. The sense amplifier according to the sixth embodiment differs from the sense amplifier according to the first embodiment in that a signal REN is input to the gate electrodes of NMOS transistors 33$f$ and 33$l$.

Also, in the read current sink 37 according to the first embodiment, the signal SINK is input to the gate electrode of the NMOS transistor 37$a$, and the signal RSINK is input to the gate electrode of the NMOS transistor 37$b$. The read current sink 37 according to the sixth embodiment differs from the read current sink 37 according to the first embodiment in that a signal SINKT is input to the gate electrode of an NMOS transistor 37$a$, and a signal RSINKT is input to the gate electrode of an NMOS transistor 37$b$. The signals SINKT and RSINKT are signals supplied from the control logic circuit 39.

<Outline of Control Logic Circuit>

An arrangement example of the control logic circuit 39 according to the sixth embodiment will be explained below with reference to FIG. 37. As shown in FIG. 37, the control logic circuit 39 generates the signals SINKT and RSINKT based on a signal TM_SELSINKb (an inverted signal of a signal TM_SELSINKb), signals SINK and RSINK, and write data WD.

More specifically, the control logic circuit 39 includes OR circuits 39$a$ and 39$d$, NAND circuits 39$b$ and 39$e$, and inverters 39$c$ and 39$f$. The OR circuit 39$a$ has a first input terminal to which the write data WD is input, and a second input terminal to which the test signal TM_SELSINKb for a sink selection operation is input. The OR circuit 39$a$ outputs the operation result from the output terminal. The NAND circuit 39$b$ has a first input terminal to which the signal SINK is input, and a second input terminal connected to the output terminal of the OR circuit 39$a$. The NAND circuit 39$b$ outputs the operation result from the output terminal. The inverter 39$c$ receives the output signal from the NAND circuit 39$b$, and outputs, from the output terminal, an inverted signal of the output signal from the NAND circuit 39$b$ as the signal SINKT.

The OR circuit 39$d$ has a first input terminal to which the write data WD is input, and a second input terminal to which the test signal TM_SELSINKb for a sink selection operation is input. The OR circuit 39$d$ outputs the operation result from the output terminal. The NAND circuit 39$e$ has a first input terminal to which the signal RSINK is input, and a second input terminal connected to the output terminal of the OR circuit 39$d$. The NAND circuit 39$e$ outputs the operation result from the output terminal. The inverter 39$f$ receives the output signal from the NAND circuit 39$e$, and outputs, from the output terminal, an inverted signal of the output signal from the NAND circuit 39$e$ as the signal RSINKT.

<"Operation 1">

Figure 38:
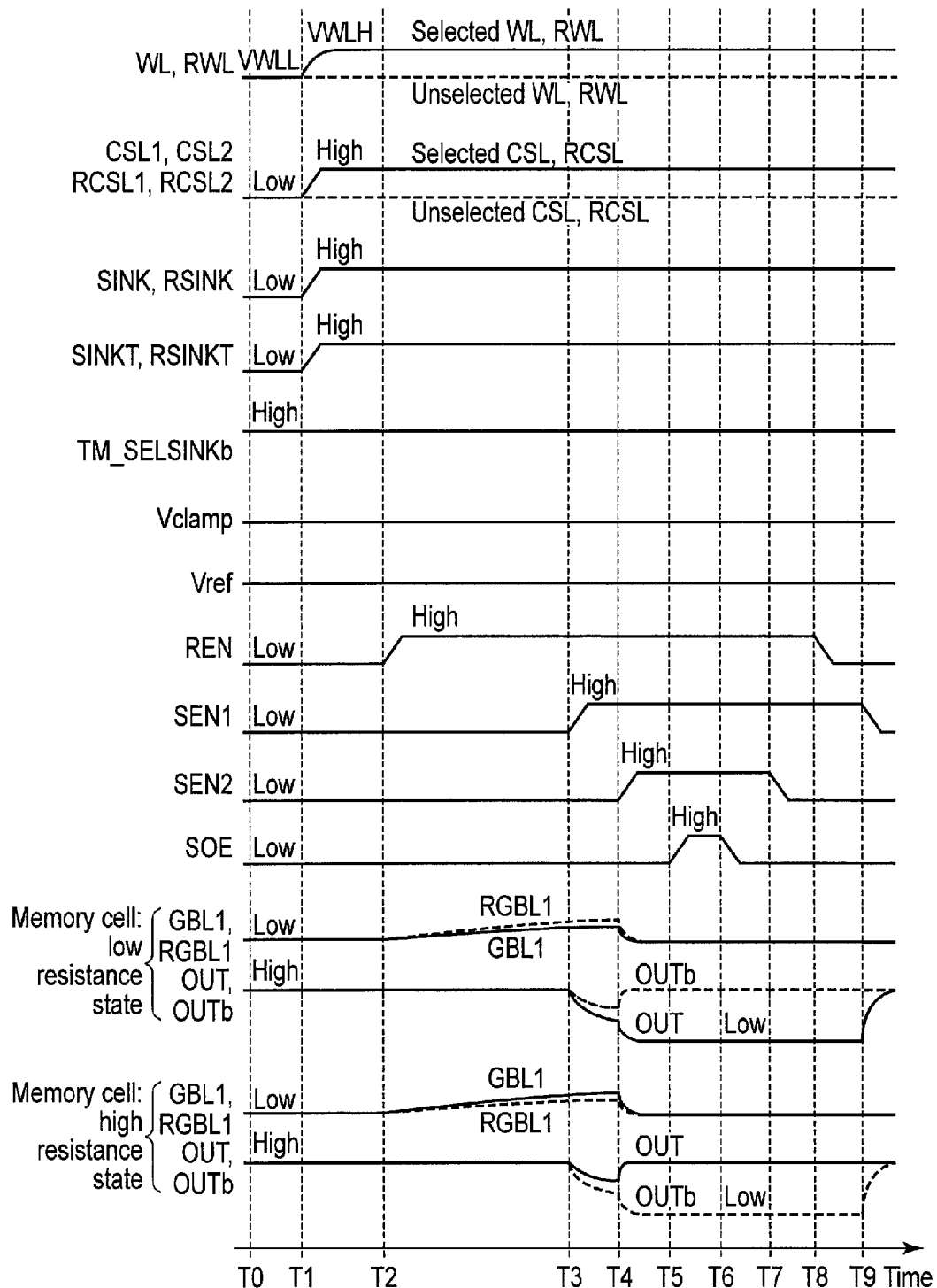
FIG. 38 is a waveform chart of signals when a semiconductor memory device according to the sixth embodiment executes "Operation 1"

Next, the operation of the semiconductor storage device 100 in above described "Operation 1" will be explained with reference to FIG. 38.

[Time T0]

A row decoder 12 sets the voltages of a word line WL and reference word line RWL at "VWLL". A control circuit 22 sets the voltages of signals CSL1, CSL2, RCSL1, RCSL2, SINK, RSINK, REN, SEN1, SEN2, and SOE at "L (Low)" level. The control circuit 22 also sets the voltage of the signal TM_SELSINKb at "H (High)" level.

The operation of the control logic circuit 39 will now be explained with reference to FIGS. 37 and 39. As shown in FIGS. 37 and 39, the control circuit 22 sets the test signal TM_SELSINKb at "H" level. In the control logic circuit 39 as described above, the signals SINKT and RSINKT change to "L" or "H" level in accordance with the driving signals SINK and RSINK supplied from the control circuit 22, regardless of the write data WD. At time T0, the signals SINK and RSINK are at "L" level, so the signals SINKT and RSINKT change to "L" level.

Note that PMOS transistors 33$a$ and 33$g$ are turned on, and NMOS transistors 33$d$, 33$f$, 33$j$, and 33$l$ are turned off, so signals OUT and OUTb are charged to "H" level.

[Time T1]

In accordance with the row address, the row decoder 12 raises the voltages of a selected word line WL (Selected) and selected reference word line RWL (Selected) from a voltage VWLL to a voltage VWLH (VWLL<VWLH). Also, the row decoder 12 maintains the voltages of an unselected word line WL (Unselected) and unselected reference word line RWL (Unselected) at the voltage VWLL.

In addition, in accordance with the column address, a column decoder 13 raises the voltages of a selected first column selection signal CSL1 (Selected), selected first reference column selection signal RCSL1 (Selected), selected second column selection signal CSL2 (Selected), and selected second reference column selection signal RCSL2 (Selected) from "L" level to "H" level. Also, the column decoder 13 maintains the voltages of an unselected first column selection signal CSL1 (Unselected), unselected first reference column selection signal RCSL1 (Unselected), unselected second column selection signal CSL2 (Unselected), and unselected second reference column selection signal RCSL2 (Unselected) at "L" level.

Furthermore, the control circuit 22 raises the voltages of the signals SINK and RSINK from "L" level to "H" level.

As shown in FIGS. 37 and 39, the control logic circuit 39 sets the signals SINKT and RSINKT at "H" level in accordance with the driving signals SINK and RSINK supplied from the control circuit 22.

Consequently, a selected memory cell MC is electrically connected to first and second global bit lines GBL1 and GBL2. Also, the second global bit line GBL2 and a second reference global bit line RGBL2 are electrically connected to GND.

[Time T2]

The control circuit 22 raises the voltage of the signal REN from "L" level to "H" level. Consequently, the sense amplifier 33 is connected to the first and second global bit lines GBL1 and GBL2, and the first and second global bit lines GBL1 and GBL2 are charged. Similarly, the sense amplifier 33 is connected to a first reference global line RGBL1 and the second reference global bit line RGBL2, and the first and second reference global bit lines RGBL1 and RGBL2 are charged.

[Times T3-T9]

The operations of the semiconductor storage device 100 at times T3 to T9 are the same as those of the semiconductor storage device 100 at times T3 to T9 in "Operation 1" explained in the first embodiment.

<"Operation 2">

Figure 40:
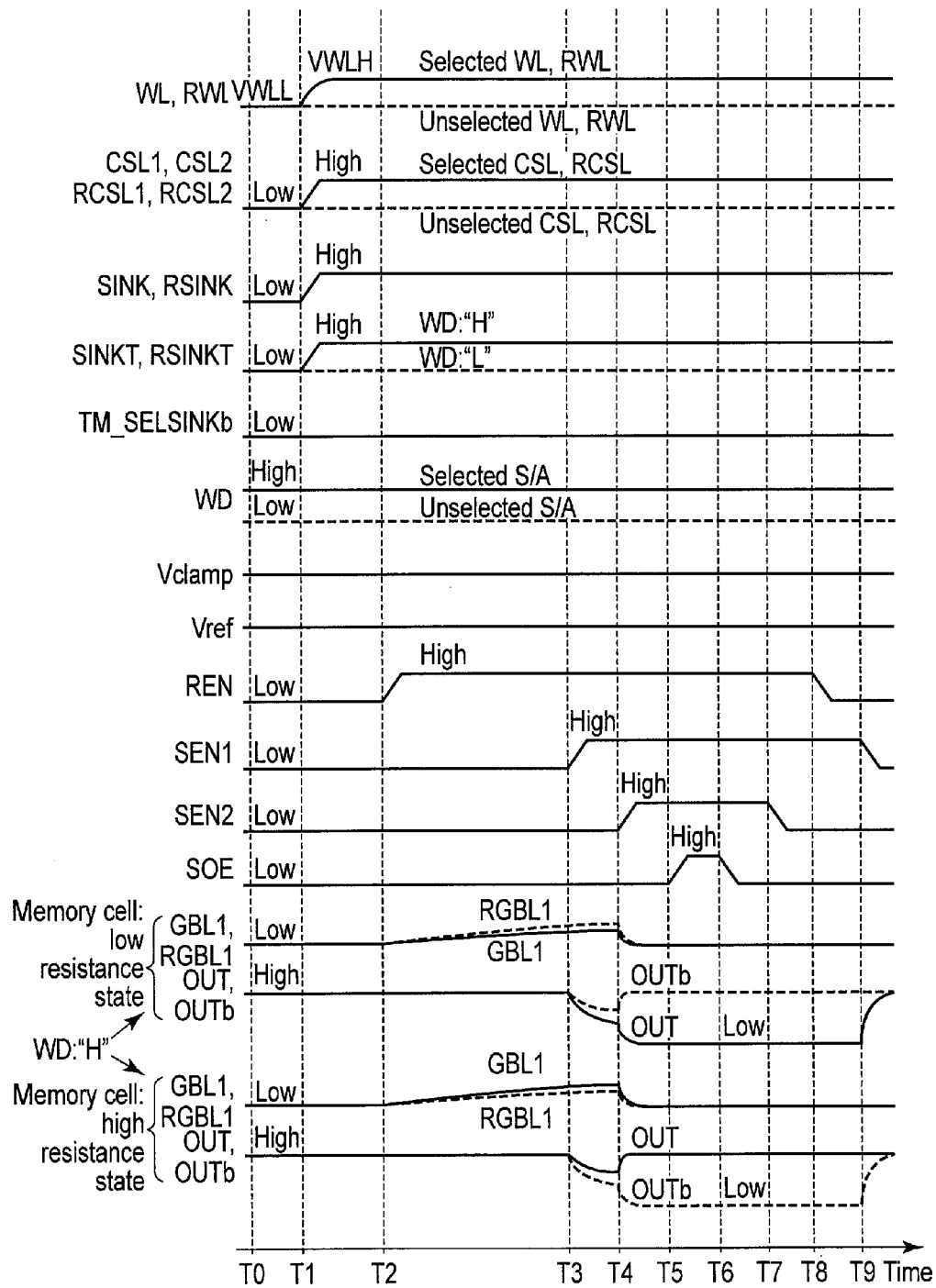
FIG. 40 is a waveform chart of signals when the semiconductor memory device according to the sixth embodiment executes "Operation 2"

The operation of the semiconductor storage device 100 in above described "Operation 2" will be explained below with reference to FIG. 40. The control circuit 22 executes read test mode 1 as follows.

First, the control circuit 22 enters write test mode A. Subsequently, the control circuit 22 supplies data "1" to the write data bus WDB belonging to a cell array 31 in which a memory cell MC or reference cell RC as a read operation target exists, and data "0" to the write data bus WDB belonging to the cell array 31 which is not a read operation target.

Then, the control circuit 22 enters read test mode A. After that, the control circuit 22 executes a read operation on the selected cell array 31 as follows.

[Time T0]

The row decoder 12 sets the voltages of the word line WL and reference word line RWL at "VWLL". The control circuit 22 sets the voltages of the signals CSL1, CSL2, RCSL1, RCSL2, SINK, RSINK, TM_SELSINKb, REN, SEN1, SEN2, and SOE at "L (Low)" level.

Also, the control circuit 22 supplies "H" level data to the write data bus WDB corresponding to the read current sink 37 as a test mode target. In addition, the control circuit 22 supplies "L" level data to the write data bus WDB corresponding to the read current sink 37 which is not a test mode target.

The control logic circuit 39 in "Operation 2" will now be explained with reference to FIGS. 37 and 39. "L" level write data WD is input to the control logic circuit corresponding to a read current sink which is not a target of the test operation of "Operation 2". In the control logic circuit 39, therefore, the signals SINKT and RSINKT change to "L" level regardless of the signals SINK and RSINK.

Also, "H" level write data WD is input to the control logic circuit 39 corresponding to a read current sink as a target of the test operation of "Operation 2". Consequently, the signals SINKT and RSINKT change to "L" or "H" level in accordance with the signals SINK and RSINK supplied from the control circuit 22. At time T0, the signals SINK and RSINK are at "L" level, so the signals SINKT and RSINKT change to "L" level.

Note that the PMOS transistors 33a and 33g are turned on, and the NMOS transistors 33d, 33f, 33j, and 33l are turned off, so the signals OUT and OUTb are charged to "H" level.

[Time T1]

In accordance with the row address, the row decoder 12 raises the voltages of a selected word line WL (Selected) and selected reference word line RWL (Selected) from the voltage VWLL to the voltage VWLH (VWLL<VWLH). Also, the row decoder 12 maintains the voltages of an unselected word line WL (Unselected) and unselected reference word line RWL (Unselected) at the voltage VWLL.

In addition, in accordance with the column address, the column decoder 13 raises the voltages of a selected first column selection signal CSL1 (Selected), selected first reference column selection signal RCSL1 (Selected), selected second column selection signal CSL2 (Selected), and selected second reference column selection signal RCSL2 (Selected) from "L" level to "H" level. Also, the column decoder 13 maintains the voltages of an unselected first column selection signal CSL1 (Unselected), unselected first reference column selection signal RCSL1 (Unselected), unselected second column selection signal CSL2 (Unselected), and unselected second reference column selection signal RCSL2 (Unselected) at "L" level.

Furthermore, the control circuit 22 raises the voltages of the signals SINK and RSINK from "L" level to "H" level.

As shown in FIGS. 37 and 39, the control logic circuit 39 raises the signals SINKT and RSINKT from "L" level to "H" level in accordance with the driving signals SINK and RSINK supplied from the control circuit 22.

Consequently, a selected memory cell MC corresponding to a read current sink as a target of the test operation is electrically connected to the first global bit line GBL1, second global bit line GBL2, and GND. Also, a selected reference cell RC corresponding to a read current sink as a target of the test operation is electrically connected to the first reference global bit line RGBL1, second reference global bit line RGBL2, and GND.

[Times T2-T9]

The operations of the semiconductor storage device 100 at times T2 to T9 are the same as those of the semiconductor storage device 100 at times T2 to T9 in "Operation 1" explained in the sixth embodiment.

<"Operation 3">

Figure 41:
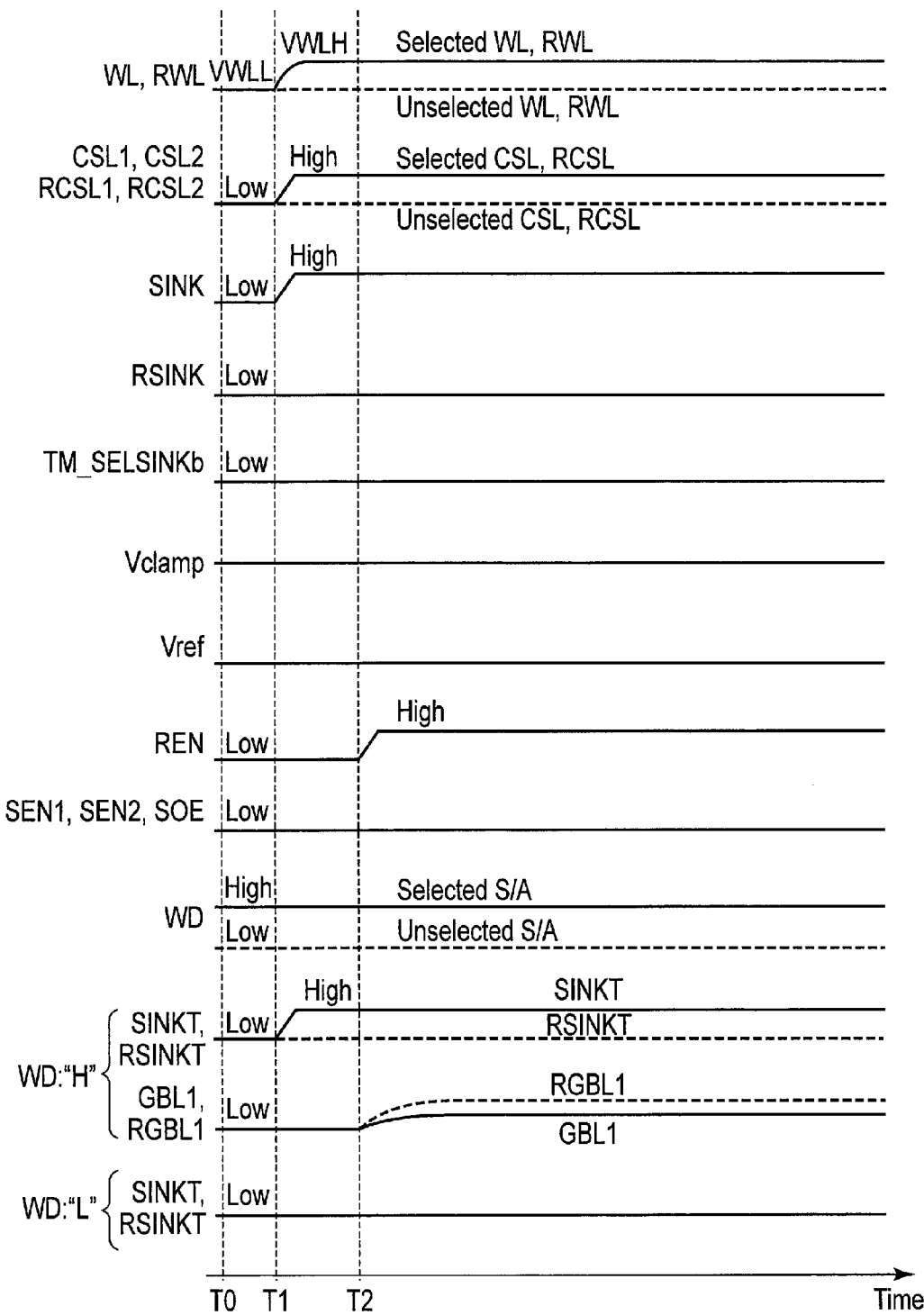
FIG. 41 is a waveform chart of signals when the semiconductor memory device according to the sixth embodiment executes "Operation 3"

The operation of the semiconductor storage device 100 in "Operation 3" will be explained below with reference to FIG. 41. The control circuit 22 executes read test mode 2 as follows.

First, the control circuit 22 enters write test mode A. Subsequently, the control circuit 22 supplies data "1" to the write data bus WDB belonging to the cell array 31 in which the memory cell MC or reference cell RC as a current measurement target exists, and data "0" to the write data bus WDB belonging to the cell array 31 which is not a current measurement target.

Then, the control circuit 22 enters read test modes A, B, and C. After that, the control circuit 22 forms a current path to the selected memory cell MC as follows.

[Time T0]

The row decoder 12 sets the voltages of the word line WL and reference word line RWL at "VWLL". The control circuit 22 sets the voltages of the signals CSL1, CSL2, RCSL1, RCSL2, SINK, RSINK, TM_SELSINKb, REN, SEN1, SEN2, and SOE at "L (Low)" level.

Also, the control circuit 22 supplies "H" level data to the write data bus WDB corresponding to the read current sink 37 as a test mode target. In addition, the control circuit 22 supplies "L" level data to the data bus WDB corresponding to the read current sink 37 which is not a test mode target.

The operation of the control logic circuit 39 in "Operation 3" will now be explained with reference to FIGS. 37 and 39. "L" level write data WD is input to the control logic circuit 39 corresponding to a read current sink which is not a target of the test operation of "Operation 3". In the control logic circuit 39, therefore, the signals SINKT and RSINKT change to "L" level regardless of the signals SINK and RSINK.

Also, "H" level write data WD is input to the control logic circuit 39 corresponding to a read current sink as a target of the test operation of "Operation 3". As a consequence, the signals SINKT and RSINKT change to "L" or "H" level in accordance with the driving signals SINK and RSINK supplied from the control circuit 22. At time T0, the signals SINK and RSINK are at "L" level, so the signals SINKT and RSINKT change to "L" level.

Note that the PMOS transistors 33a and 33g are turned on, and the NMOS transistors 33d, 33f, 33j, and 33l are turned off.

[Time T1]

In accordance with the row address, the row decoder 12 raises the voltages of a selected word line WL (Selected) and selected reference word line RWL (Selected) from the voltage VWLL to the voltage VWLH (VWLL<VWLH). Also, the row decoder 12 maintains the voltages of an unselected word line WL (Unselected) and unselected reference word line RWL (Unselected) at the voltage VWLL.

In addition, in accordance with the column address, the column decoder 13 raises the voltages of a selected first column selection signal CSL1 (Selected), selected first reference column selection signal RCSL1 (Selected), selected second column selection signal CSL2 (Selected), and selected second reference column selection signal RCSL2 (Selected) from "L" level to "H" level. Also, the column decoder 13 maintains the voltages of an unselected first column selection signal CSL1 (Unselected), unselected first reference column selection signal RCSL1 (Unselected), unselected second column selection signal CSL2 (Unselected), and unselected second reference column selection signal RCSL2 (Unselected) at "L" level.

Furthermore, the control circuit 22 raises the voltage of the signal SINK from "L" level to "H" level, and maintains the voltage of the signal RSINK at "L" level.

As shown in FIGS. 37 and 39, the control logic circuit 39 raises the signal SINKT from "L" level to "H" level in accordance with the driving signal SINK supplied from the control circuit 22.

Consequently, only the selected memory cell MC corresponding to a read current sink as a target of the test operation is electrically connected to the first global bit line GBL1, second global bit line GBL2, and GND.

[Time T2]

The control circuit 22 raises the voltage of the signal REN from "L" level to "H" level.

In this example as described above, the control circuit 22 can select the cell array 31 as a target of the test operation, and measure only the cell read current Ir flowing through a predetermined memory cell MC, by controlling data to be supplied to the write data bus WDB, and the signals SINK and RSINK. The cell read current Ir flowing through the predetermined memory cell MC can be measured by applying VDD from an external PAD and measuring the electric current by DC measurement.

<"Operation 4">

Figure 42:
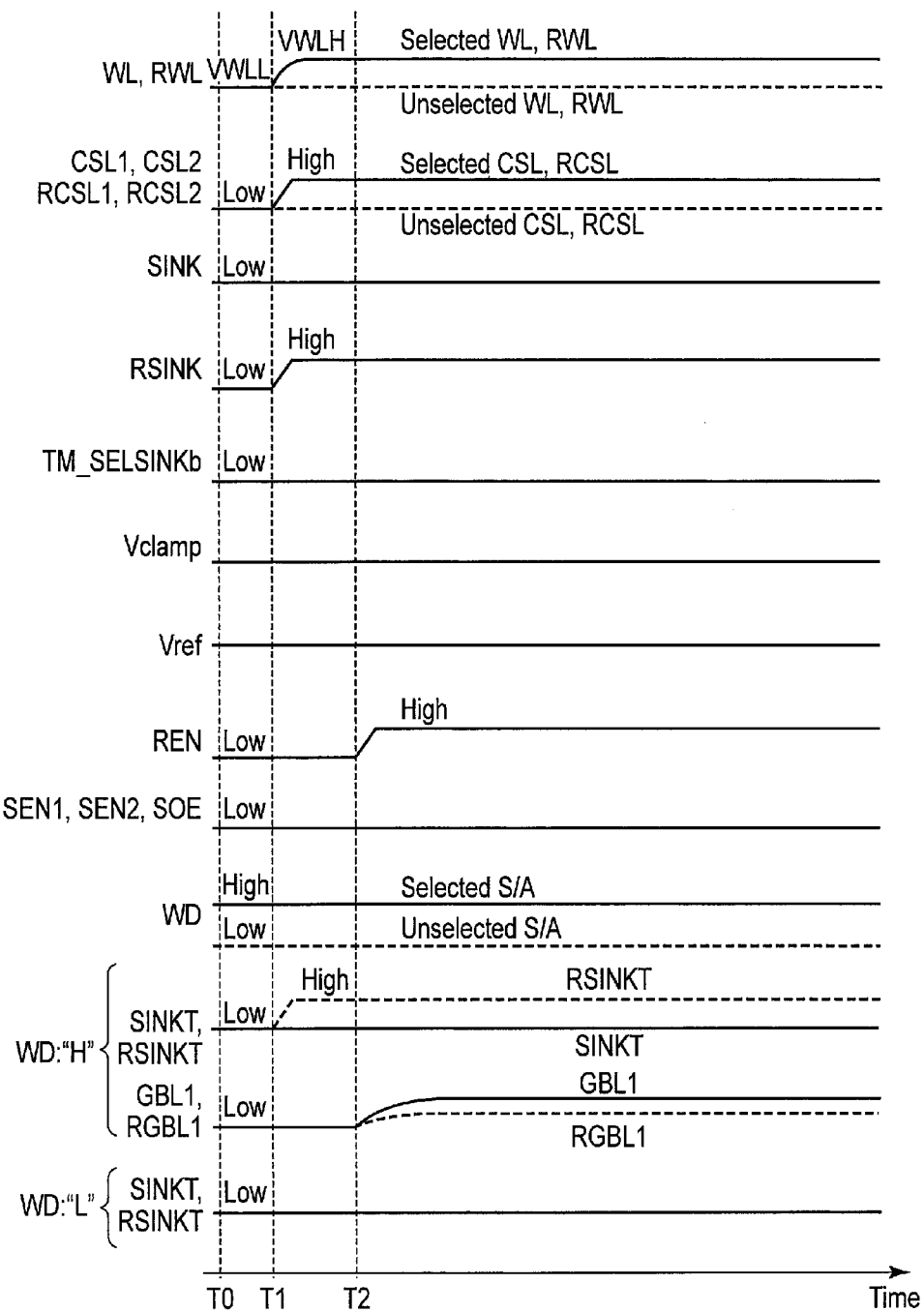
FIG. 42 is a waveform chart of signals when the semiconductor memory device according to the sixth embodiment executes "Operation 4"

The operation of the semiconductor storage device 100 in above described "Operation 4" will be explained below with reference to FIG. 42. The control circuit 22 executes read test mode 3 as follows.

First, the control circuit 22 enters write test mode A. Subsequently, the control circuit 22 supplies data "1" to the write data bus WDB belonging to the cell array 31 in which the memory cell MC or reference cell RC as a current measurement target exists, and data "0" to the write data bus WDB belonging to the cell array 31 which is not a current measurement target.

Then, the control circuit 22 enters read test modes A, B, and C. After that, the control circuit 22 forms a current path to the selected reference cell RC as follows.

[Times T0]

The operation of the semiconductor storage device 100 at time T0 is the same as that of the semiconductor storage device 100 at time T0 in "Operation 3" explained in the sixth embodiment.

[Time T1]

In accordance with the row address, the row decoder 12 raises the voltages of a selected word line WL (Selected) and selected reference word line RWL (Selected) from the voltage VWLL to the voltage VWLH (VWLL<VWLH). Also, the row decoder 12 maintains the voltages of an unselected word line WL (Unselected) and unselected reference word line RWL (Unselected) at the voltage VWLL.

In addition, in accordance with the column address, the column decoder 13 raises the voltages of a selected first column selection signal CSL1 (Selected), selected first reference column selection signal RCSL1 (Selected), selected second column selection signal CSL2 (Selected), and selected second reference column selection signal RCSL2 (Selected) from "L" level to "H" level. Also, the column decoder 13 maintains the voltages of an unselected first column selection signal CSL1 (Unselected), unselected first reference column selection signal RCSL1 (Unselected), unselected second column selection signal CSL2 (Unselected), and unselected second reference column selection signal RCSL2 (Unselected) at "L" level.

Furthermore, the control circuit 22 raises the voltage of the signal RSINK from "L" level to "H" level, and maintains the voltage of the signal SINK at "L" level.

As shown in FIGS. 37 and 39, the control logic circuit 39 sets the signal RSINKT at "H" level in accordance with the driving signal RSINK supplied from the control circuit 22.

Consequently, only the selected reference cell RC corresponding to a read current sink as a target of the test operation is electrically connected to the first reference global bit line RGBL1, second reference global bit line RGBL2, and GND.

[Time T2]

The control circuit 22 raises the voltage of the signal REN from "L" level to "H" level.

In this example as described above, the control circuit 22 can select the cell array 31 as a target of the test operation, and measure only the reference current Iref flowing through a predetermined reference cell RC, by controlling data to be supplied to the write data bus WDB, and the signals SINK and RSINK. The reference current Iref flowing through the predetermined reference cell RC can be measured by applying VDD from an external PAD and measuring the electric current by DC measurement.

Effects of Sixth Embodiment

In the embodiment described above, the semiconductor storage device 100 can achieve the same effects as those of the first embodiment by controlling the signals SINK and RSINK in a read operation.

Seventh Embodiment

The seventh embodiment will be explained below. A semiconductor storage device according to the seventh embodiment includes a control logic circuit different from that of the sixth embodiment. Note that the basic arrangement and basic operation of the storage device according to the seventh embodiment are the same as those of the storage device according to the above described sixth embodiment. Therefore, an explanation of items explained in the above described sixth embodiment and items readily analogizable from the above described sixth embodiment will be omitted.

<Outline of Control Logic Circuit>

An arrangement example of a control logic circuit 39 according to the seventh embodiment will be explained below with reference to FIG. 43. As shown in FIG. 43, the control logic circuit 39 generates signals SINKT and RSINKT based on a signal TM_SELSINKb, a signal SINKb (an inverted signal of a signal SINK), a signal RSINKb (an inverted signal of a signal RSINK), and write data WD.

More specifically, the control logic circuit 39 includes NOR circuits 39g, 39h, and 39i. The NOR circuit 39g has a first input terminal to which the write data WD is input, and a second input terminal to which the test signal TM_SELSINKb for a sink selection operation is input. The NOR circuit 39g outputs the operation result from the output terminal. The NOR circuit 39h has a first input terminal to which the signal SINKb is connected, and a second input terminal connected to the output terminal of the NOR circuit 39g. The NOR circuit 39h outputs the signal SINKT as the operation result from the output terminal. The NOR circuit 39i has a first input terminal to which the signal RSINKb is connected, and a second input terminal connected to the output terminal of the NOR circuit 39g. The OR circuit 39i outputs the signal RSINKT as the operation result from the output terminal.

<"Operation 1">

Next, the operation of the semiconductor storage device 100 in above described "Operation 1" will be explained with reference to FIG. 44.

[Time T0]

A row decoder 12 sets the voltages of a word line WL and reference word line RWL at "VWLL". A control circuit 22 sets the voltages of signals CSL1, CSL2, RCSL1, RCSL2, REN, SEN1, SEN2, and SOE at "L (Low)" level. The control circuit 22 also sets the voltages of the signals TM_SELSINKb, SINKb, and RSINKb at "H (High)" level.

The operation of the control logic circuit 39 will now be explained with reference to FIGS. 43 and 45. As shown in FIGS. 43 and 45, the control circuit 22 sets the test signal TM_SELSINKb at "H" level. In the control logic circuit 39 as described above, the signals SINKT and RSINKT change to "L" or "H" level in accordance with the driving signals SINKb and RSINKb supplied from the control circuit 22, regardless of the write data WD. At time T0, the signals SINKb and RSINKb are at "H" level, so the signals SINKT and RSINKT change to "L" level.

Note that PMOS transistors 33a and 33g are turned on, and NMOS transistors 33d, 33f, 33j, and 33l are turned off, so signals OUT and OUTb are charged to "H" level.

[Time T1]

In accordance with the row address, the row decoder 12 raises the voltages of a selected word line WL (Selected) and selected reference word line RWL (Selected) from a voltage VWLL to a voltage VWLH (VWLL<VWLH). Also, the row decoder 12 maintains the voltages of an unselected word line WL (Unselected) and unselected reference word line RWL (Unselected) at the voltage VWLL.

In addition, in accordance with the column address, a column decoder 13 raises the voltages of a selected first column selection signal CSL1 (Selected), selected first reference column selection signal RCSL1 (Selected), selected second column selection signal CSL2 (Selected), and selected second reference column selection signal RCSL2 (Selected) from "L" level to "H" level. Also, the column decoder 13 maintains the voltages of an unselected first column selection signal CSL1 (Unselected), unselected first reference column selection signal RCSL1 (Unselected), unselected second column selection signal CSL2 (Unselected), and unselected second reference column selection signal RCSL2 (Unselected) at "L" level.

Furthermore, the control circuit 22 lowers the voltages of the signals SINKb and RSINKb from "H" level to "L" level.

As shown in FIGS. 43 and 45, the control logic circuit 39 sets the signals SINKT and RSINKT at "H" level in accordance with the driving signals SINKb and RSINKb supplied from the control circuit 22.

Consequently, the selected memory cell MC is electrically connected to a first global bit line GBL1, second global bit line GBL2, and GND.

[Times T2-T9]

The operations of the semiconductor storage device 100 at times T2 to T9 are the same as those of the semiconductor storage device 100 at times T2 to T9 in "Operation 1" explained in the sixth embodiment.

<"Operation 2">

Figure 46:
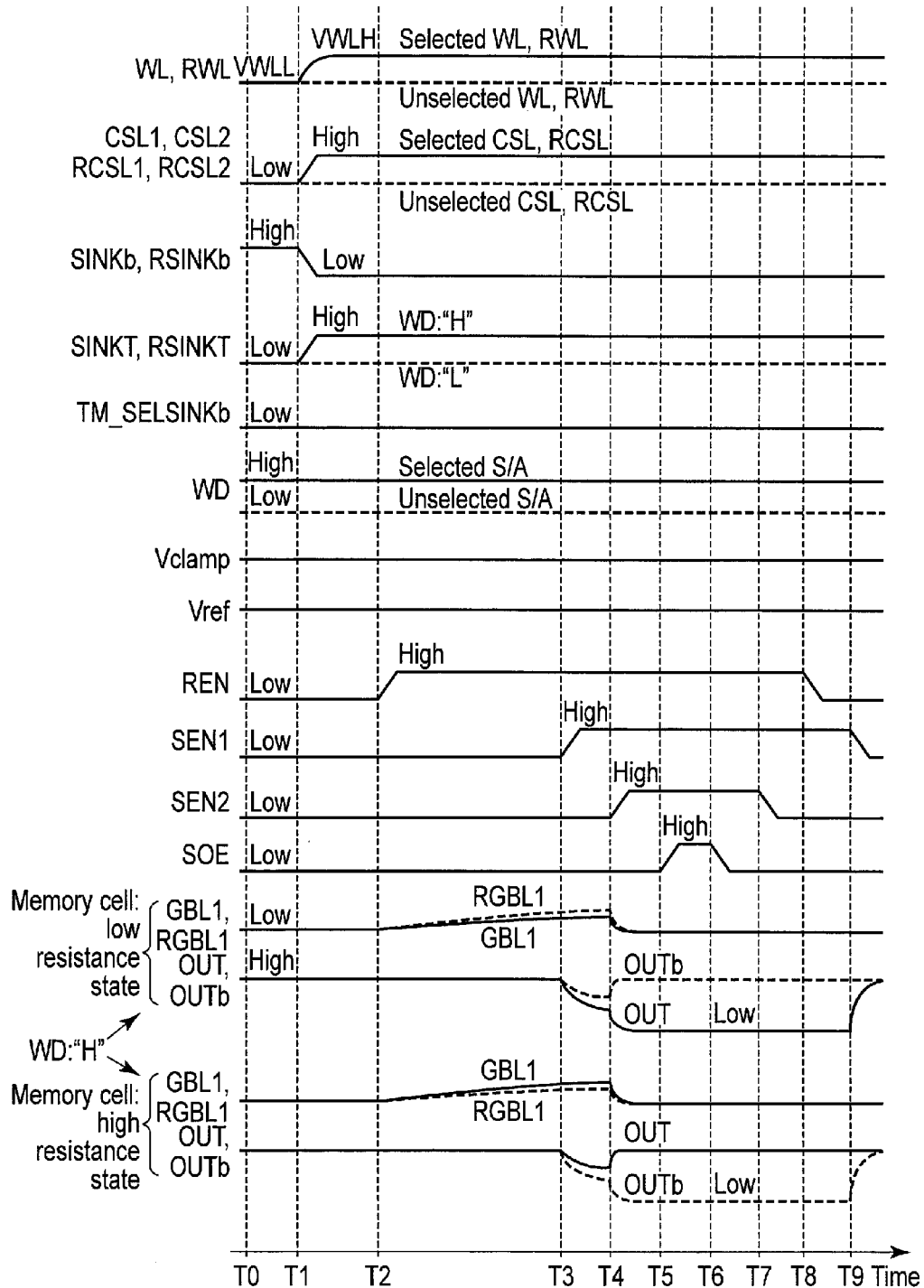
FIG. 46 is a waveform chart of signals when the semiconductor memory device according to the seventh embodiment executes "Operation 2"

The operation of the semiconductor storage device 100 in above described "Operation 2" will be explained below with reference to FIG. 46. The control circuit 22 executes read test mode 1 as follows.

First, the control circuit 22 enters write test mode A. Subsequently, the control circuit 22 supplies data "1" to the write data bus WDB belonging to a cell array 31 in which a memory cell MC or reference cell RC as a read operation target exists, and data "0" to the write data bus WDB belonging to the cell array 31 which is not a read operation target.

Then, the control circuit 22 enters read test mode A. After that, the control circuit 22 executes a read operation on the selected cell array 31 as follows.

[Time T0]

The row decoder 12 sets the voltages of the word line WL and reference word line RWL at "VWLL". The control circuit 22 sets the voltages of the signals CSL1, CSL2, RCSL1, RCSL2, TM_SELSINKb, REN, SEN1, SEN2, and SOE at "L (Low)" level. Also, the control circuit 22 sets the voltages of the signals SINKb and RSINKb at "H" level.

Furthermore, the control circuit 22 supplies "H" level data to the write data bus WDB corresponding to the read current sink 37 as a test mode target. In addition, the control circuit 22 supplies "L" level data to the write data bus WDB corresponding to read current sink 37 which is not a test mode target.

The control logic circuit 39 in "Operation 2" will now be explained with reference to FIGS. 43 and 45. "L" level write data WD is input to the control logic circuit corresponding to a read current sink which is not a target of the test operation of "Operation 2". In the control logic circuit 39, therefore, the signals SINKT and RSINKT change to "L" level regardless of the signals SINKb and RSINKb.

Also, "H" level write data WD is input to the control logic circuit 39 corresponding to a read current sink as a target of the test operation of "Operation 2". Consequently, the signals SINKT and RSINKT change to "L" or "H" level in accordance with the signals SINKb and RSINKb supplied from the control circuit 22. At time T0, the signals SINKb and RSINKb are at "H" level, so the signals SINKT and RSINKT change to "L" level.

Note that the PMOS transistors 33a and 33g are turned on, and the NMOS transistors 33d, 33f, 33j, and 33l are turned off, so the signals OUT and OUTb are charged to "H" level.

[Time T1]

In accordance with the row address, the row decoder 12 raises the voltages of a selected word line WL (Selected) and selected reference word line RWL (Selected) from the voltage VWLL to the voltage VWLH (VWLL<VWLH). Also, the row decoder 12 maintains the voltages of an unselected word line WL (Unselected) and unselected reference word line RWL (Unselected) at the voltage VWLL.

In addition, in accordance with the column address, the column decoder 13 raises the voltages of a selected first column selection signal CSL1 (Selected), selected first reference column selection signal RCSL1 (Selected), selected second column selection signal CSL2 (Selected), and selected second reference column selection signal RCSL2 (Selected) from "L" level to "H" level. Also, the column decoder 13 maintains the voltages of an unselected first column selection signal CSL1 (Unselected), unselected first reference column selection signal RCSL1 (Unselected), unselected second column selection signal CSL2 (Unselected), and unselected second reference column selection signal RCSL2 (Unselected) at "L" level.

Furthermore, the control circuit 22 lowers the voltages of the signals SINKb and RSINKb from "H" level to "L" level.

As shown in FIGS. 43 and 45, the control logic circuit 39 raises the signals SINKT and RSINKT from "L" level to "H" level in accordance with the driving signals SINKb and RSINKb supplied from the control circuit 22.

Consequently, the selected memory cell MC corresponding to a read current sink as a target of the test operation is electrically connected to the first global bit line GBL1, second global bit line GBL2, and GND. Also, a selected reference cell RC corresponding to a read current sink as a target of the test operation is electrically connected to the first reference global bit line RGBL1, second reference global bit line RGBL2, and GND.

[Times T2-T9]

The operations of the semiconductor storage device 100 at times T2 to T9 are the same as those of the semiconductor storage device 100 at times T2 to T9 in "Operation 1" explained in the seventh embodiment.

<"Operation 3">

The operation of the semiconductor storage device 100 in "Operation 3" will be explained below with reference to FIG. 47. The control circuit 22 executes read test mode 2 as follows.

First, the control circuit 22 enters write test mode A. Subsequently, the control circuit 22 supplies data "1" to the write data bus WDB belonging to the cell array 31 in which the memory cell MC or reference cell RC as a current measurement target exists, and data "0" to the write data bus WDB belonging to the cell array 31 which is not a current measurement target.

Then, the control circuit 22 enters read test modes A, B, and C. After that, the control circuit 22 forms a current path to the selected memory cell MC as follows.

[Time T0]

The row decoder 12 sets the voltages of the word line WL and reference word line RWL at "VWLL". The control circuit 22 sets the voltages of the signals CSL1, CSL2, RCSL1, RCSL2, TM_SELSINKb, REN, SEN1, SEN2, and SOE at "L (Low)" level. Also, the control circuit 22 sets the voltages of the signals SINKb and RSINKb at "H (High)" level.

Furthermore, the control circuit 22 supplies "H" level data to the write data bus WDB corresponding to the read current sink 37 as a test mode target. In addition, the control circuit 22 supplies "L" level data to the data bus WDB corresponding to the read current sink 37 which is not a test mode target.

The operation of the control logic circuit 39 in "Operation 3" will now be explained with reference to FIGS. 43 and 45. "L" level write data WD is input to the control logic circuit 39 corresponding to a read current sink which is not a target of the test operation of "Operation 3". In the control logic circuit 39, therefore, the signals SINKT and RSINKT change to "L" level regardless of the signals SINKb and RSINKb.

Also, "H" level write data WD is input to the control logic circuit 39 corresponding to a read current sink 37 as a target of the test operation of "Operation 3". As a consequence, the signals SINKT and RSINKT change to "L" or "H" level in accordance with the driving signals SINKb and RSINKb supplied from the control circuit 22. At time T0, the signals SINKb and RSINKb are at "H" level, so the signals SINKT and RSINKT change to "L" level.

Note that the PMOS transistors 33a and 33g are turned on, and the NMOS transistors 33d, 33f, 33j, and 33l are turned off, so the signals OUT and OUTb are charged to "H" level.

[Time T1]

In accordance with the row address, the row decoder 12 raises the voltages of a selected word line WL (Selected) and selected reference word line RWL (Selected) from the voltage VWLL to the voltage VWLH (VWLL<VWLH). Also, the row decoder 12 maintains the voltages of an unselected word line WL (Unselected) and unselected reference word line RWL (Unselected) at the voltage VWLL.

In addition, in accordance with the column address, the column decoder 13 raises the voltages of a selected first column selection signal CSL1 (Selected), selected first reference column selection signal RCSL1 (Selected), selected second column selection signal CSL2 (Selected), and selected second reference column selection signal RCSL2 (Selected) from "L" level to "H" level. Also, the column decoder 13 maintains the voltages of an unselected first column selection signal CSL1 (Unselected), unselected first reference column selection signal RCSL1 (Unselected), unselected second column selection signal CSL2 (Unselected), and unselected second reference column selection signal RCSL2 (Unselected) at "L" level.

Furthermore, the control circuit 22 lowers the voltage of the signal SINKb from "H" level to "L" level, and maintains the voltage of the signal RSINKb at "H" level.

As shown in FIGS. 43 and 45, the control logic circuit 39 raises the signal SINKT from "L" level to "H" level in accordance with the driving signal SINKb supplied from the control circuit 22.

Consequently, only the selected memory cell MC corresponding to a read current sink as a target of the test operation is electrically connected to the first global bit line GBL1, second global bit line GBL2, and GND.

[Time T2]

The operation of the semiconductor storage device 100 at time T2 is the same as that of the semiconductor storage device 100 at time T2 in "Operation 3" explained in the sixth embodiment.

In this example as described above, the control circuit 22 can select the cell array 31 as a target of the test operation, and measure only the cell read current Ir flowing through a predetermined memory cell MC, by controlling data to be supplied to the write data bus WDB, and the signals SINKb and RSINKb. The cell read current Ir flowing through the predetermined memory cell MC can be measured by applying VDD from an external PAD and measuring the electric current by DC measurement.

<"Operation 4">

The operation of the semiconductor storage device 100 in above described "Operation 4" will be explained below with reference to FIG. 48. The control circuit 22 executes read test mode 3 as follows.

First, the control circuit 22 enters write test mode A. Subsequently, the control circuit 22 supplies data "1" to the write data bus WDB belonging to the cell array 31 in which the memory cell MC or reference cell RC as a current measurement target exists, and data "0" to the write data bus WDB belonging to the cell array 31 which is not a current measurement target.

Then, the control circuit 22 enters read test modes A, B, and C. After that, the control circuit 22 forms a current path to the selected reference cell RC as follows.

[Times T0]

The operation of the semiconductor storage device 100 at time T0 is the same as that of the semiconductor storage device 100 at time T0 in "Operation 3" explained in the seventh embodiment.

[Time T1]

In accordance with the row address, the row decoder 12 raises the voltages of a selected word line WL (Selected) and selected reference word line RWL (Selected) from the voltage VWLL to the voltage VWLH (VWLL<VWLH). Also, the row decoder 12 maintains the voltages of an unselected word line WL (Unselected) and unselected reference word line RWL (Unselected) at the voltage VWLL.

In addition, in accordance with the column address, the column decoder 13 raises the voltages of a selected first column selection signal CSL1 (Selected), selected first reference column selection signal RCSL1 (Selected), selected second column selection signal CSL2 (Selected), and selected second reference column selection signal RCSL2 (Selected) from "L" level to "H" level. Also, the column decoder 13 maintains the voltages of an unselected first column selection signal CSL1 (Unselected), unselected first reference column selection signal RCSL1 (Unselected), unselected second column selection signal CSL2 (Unselected), and unselected second reference column selection signal RCSL2 (Unselected) at "L" level.

Furthermore, the control circuit 22 lowers the voltage of the signal RSINKb from "H" level to "L" level, and maintains the voltage of the signal SINKb at "H" level.

As shown in FIGS. 43 and 45, the control logic circuit 39 raises the signal RSINKT from "L." level to "H" level in accordance with the driving signal RSINKb supplied from the control circuit 22.

Consequently, only the selected reference cell RC corresponding to a read current sink as a target of the test operation is electrically connected to the first reference global bit line RGBL1, second reference global bit line RGBL2, and GND.

[Time T2]

The operation of the semiconductor storage device 100 at time T2 is the same as that of the semiconductor storage device 100 at time T2 in "Operation 4" explained in the sixth embodiment.

In this example as described above, the control circuit 22 can select the cell array 31 as a target of the test operation, and measure only the reference current Iref flowing through a predetermined reference cell RC, by controlling data to be supplied to the write data bus WDB, and the signals SINKb and RSINKb. The reference current Iref flowing through the predetermined reference cell RC can be measured by applying VDD from an external PAD and measuring the electric current by DC measurement.

Effects of Seventh Embodiment

In the embodiment described above, the semiconductor storage device 100 can achieve the same effects as those of the sixth embodiment by controlling the signals SINK and RSINK in a read operation.

Eighth Embodiment

The eighth embodiment will be explained below. A semiconductor storage device according to the eighth embodiment includes a control logic circuit different from that of the sixth embodiment. Note that the basic arrangement and basic operation of the storage device according to the eighth embodiment are the same as those of the storage device according to the above described sixth embodiment. Therefore, an explanation of items explained in the above described sixth embodiment and items readily analogizable from the above described sixth embodiment will be omitted.

<Outline of Control Logic Circuit>

An arrangement example of a control logic circuit 39 according to the eighth embodiment will be explained below with reference to FIG. 49. As shown in FIG. 49, the control logic circuit 39 generates signals SINKT and RSINKT based on signals TM_SELSINKb, SINK, TM_SINKDIS, and TM_RSINKDIS, and write data WD.

More specifically, the control logic circuit 39 includes an OR circuit 39j, a NAND circuit 39k, and NOR circuits 39l and 39m. The OR circuit 39j has a first input terminal to which the write data WD is input, and a second input terminal to which the test signal TM_SELSINKb for a sink selection operation is input. The OR circuit 39j outputs the operation result from the output terminal. The NAND circuit 39k has a first input terminal to which the signal SINK is connected, and a second input terminal connected to the output terminal of the OR circuit 39j. The NAND circuit 39k outputs the operation result from the output terminal. The NOR circuit 39l has a first input terminal to which the signal TM_SINKDIS is input, and a second input terminal connected to the output terminal of the NAND circuit 39k. The NOR circuit 39l outputs the signal SINKT as the operation result from the output terminal. The NOR circuit 39m has a first input terminal to which the signal TM_RSINKDIS is input, and a second input terminal connected to the output terminal of the NAND circuit 39k. The NOR circuit 39m outputs the signal RSINKT as the operation result from the output terminal.

<"Operation 1">

Figure 50:
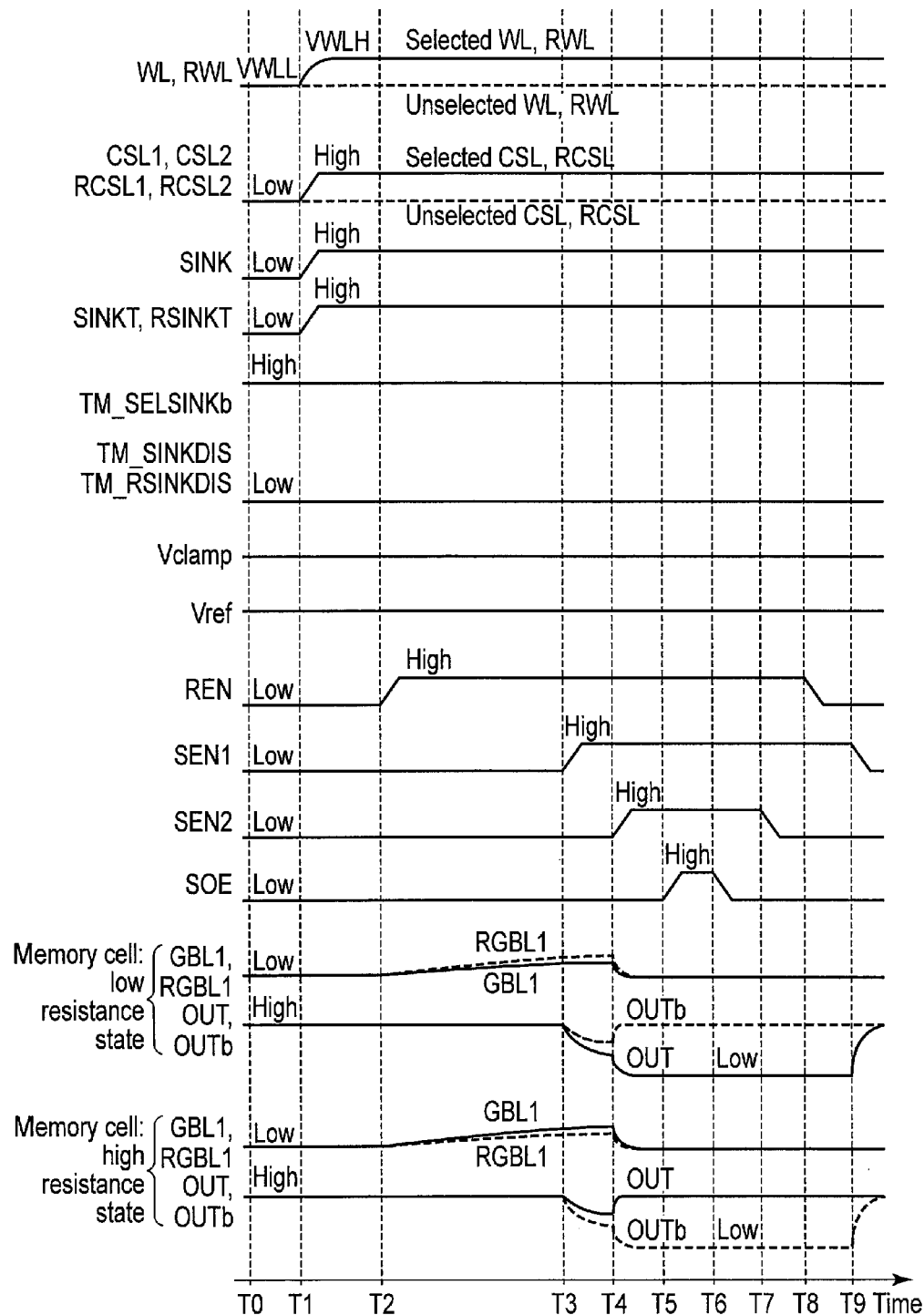
FIG. 50 is a waveform chart of signals when a semiconductor memory device according to the eighth embodiment executes "Operation 1"

Next, the operation of the semiconductor storage device 100 in above described "Operation 1" will be explained with reference to FIG. 50.

[Time T0]

A row decoder 12 sets the voltages of a word line WL and reference word line RWL at "VWLL". A control circuit 22 sets the voltages of signals CSL1, CSL2, RCSL1, RCSL2, SINK, TM_SINKDIS, TM_RSINKDIS, REN, SEN1, SEN2, and SOE at "L (Low)" level. The control circuit 22 also sets the voltage of the signal TM_SELSINKb at "H (High)" level.

The operation of the control logic circuit 39 will now be explained with reference to FIGS. 49 and 51. As shown in FIGS. 49 and 51, the control circuit 22 sets the test signal TM_SELSINKb at "H" level, and the test signals TM_SINKDIS and TM_RSINKDIS at "L" level. In the control logic circuit 39 as described above, the signals SINKT and RSINKT change to "L" or "H" level in accordance with the driving signal SINK supplied from the control circuit 22, regardless of the write data WD. At time T0, the signal SINK is at "L" level, so the signals SINKT and RSINKT change to "L" level.

Note that PMOS transistors 33a and 33g are turned on, and NMOS transistors 33d, 33f, 33j, and 33l are turned off, so signals OUT and OUTb are charged to "H" level.

[Time T1]

In accordance with the row address, the row decoder 12 raises the voltages of a selected word line WL (Selected) and selected reference word line RWL (Selected) from a voltage VWLL to a voltage VWLH (VWLL<VWLH). Also, the row decoder 12 maintains the voltages of an unselected word line WL (Unselected) and unselected reference word line RWL (Unselected) at the voltage VWLL.

In addition, in accordance with the column address, a column decoder 13 raises the voltages of a selected first column selection signal CSL1 (Selected), selected first reference column selection signal RCSL1 (Selected), selected second column selection signal CSL2 (Selected), and selected second reference column selection signal RCSL2 (Selected) from "L" level to "H" level. Also, the column decoder 13 maintains the voltages of an unselected first column selection signal CSL1 (Unselected), unselected first reference column selection signal RCSL1 (Unselected), unselected second column selection signal CSL2 (Unselected), and unselected second reference column selection signal RCSL2 (Unselected) at "L" level.

Furthermore, the control circuit 22 raises the voltage of the signal SINK from "L" level to "H" level.

As shown in FIGS. 49 and 51, the control logic circuit 39 raises the signals SINKT and RSINKT from "L" level to "H" level in accordance with the driving signal SINK supplied from the control circuit 22.

Consequently, the selected memory cell MC is electrically connected to a first global bit line GBL1, second global bit line GBL2, and GND.

[Times T2-T9]

The operations of the semiconductor storage device 100 at times T2 to T9 are the same as those of the semiconductor storage device 100 at times T2 to T9 in "Operation 1" explained in the sixth embodiment.

<"Operation 2">

Figure 52:
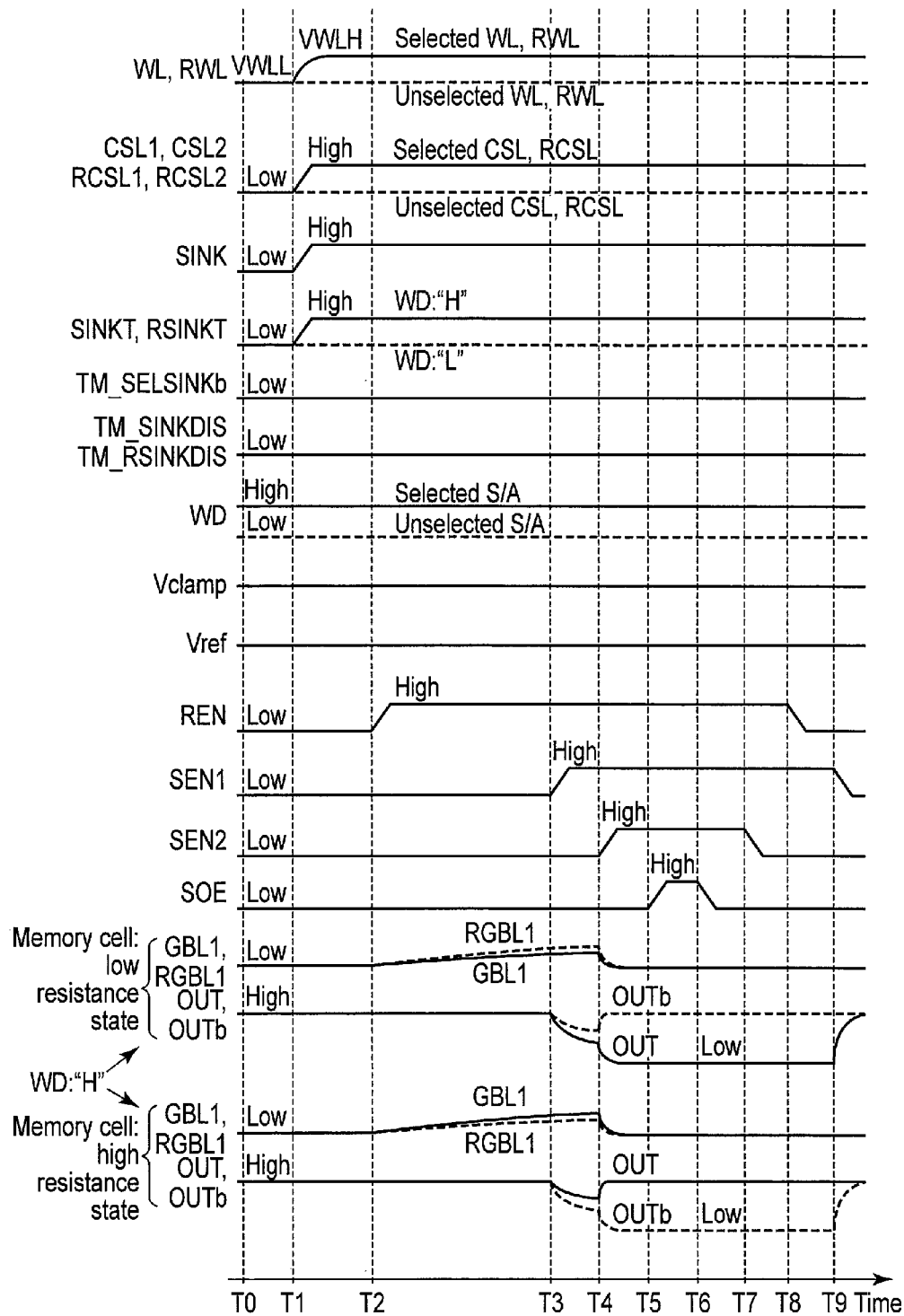
FIG. 52 is a waveform chart of signals when the semiconductor memory device according to the eighth embodiment executes "Operation 2"

The operation of the semiconductor storage device 100 in above described "Operation 2" will be explained below with reference to FIG. 52. The control circuit 22 executes read test mode 1 as follows.

First, the control circuit 22 enters write test mode A. Subsequently, the control circuit 22 supplies data "1" to the write data bus WDB belonging to a cell array 31 in which a memory cell MC or reference cell RC as a read operation target exists, and data "0" to the write data bus WDB belonging to the cell array 31 which is not a read operation target.

Then, the control circuit 22 enters read test mode A. After that, the control circuit 22 executes a read operation on the selected cell array 31 as follows.

[Time T0]

The row decoder 12 sets the voltages of the word line WL and reference word line RWL at "VWLL". The control circuit 22 sets the voltages of the signals CSL1, CSL2, RCSL1, RCSL2, SINK, RSINK, TM_SELSINKb, TM_SINKDIS, TM_RSINKDIS, REN, SEN1, SEN2, and SOE at "L (Low)" level.

Also, the control circuit 22 supplies "H" level data to the write data bus WDB corresponding to the read current sink 37 as a test mode target. In addition, the control circuit 22 supplies "L" level data to the write data bus WDB corresponding to the read current sink 37 which is not a test mode target.

The control logic circuit 39 in "Operation 2" will now be explained with reference to FIGS. 49 and 51. "L" level write data WD is input to the control logic circuit corresponding to a read current sink which is not a target of the test operation of "Operation 2". In the control logic circuit 39, therefore, the signals SINKT and RSINKT change to "L" level regardless of the signals SINK, TM_SINKDIS, and TM_RSINKDIS.

Also, "H" level write data WD is input to the control logic circuit 39 corresponding to a read current sink as a target of the test operation of "Operation 2". Consequently, the signals SINKT and RSINKT change to "L" or "H" level in accordance with the signal SINK supplied from the control circuit 22. At time T0, the signal SINK is at "L" level, so the signals SINKT and RSINKT change to "L" level.

Note that the PMOS transistors 33a and 33g are turned on, and the NMOS transistors 33d, 33f, 33j, and 33l are turned off, so the signals OUT and OUTb are charged to "H" level.

[Time T1]

In accordance with the row address, the row decoder 12 raises the voltages of a selected word line WL (Selected) and selected reference word line RWL (Selected) from the voltage VWLL to the voltage VWLH (VWLL<VWLH).

Also, the row decoder 12 maintains the voltages of an unselected word line WL (Unselected) and unselected reference word line RWL (Unselected) at the voltage VWLL.

In addition, in accordance with the column address, the column decoder 13 raises the voltages of a selected first column selection signal CSL1 (Selected), selected first reference column selection signal RCSL1 (Selected), selected second column selection signal CSL2 (Selected), and selected second reference column selection signal RCSL2 (Selected) from "L" level to "H" level. Also, the column decoder 13 maintains the voltages of an unselected first column selection signal CSL1 (Unselected), unselected first reference column selection signal RCSL1 (Unselected), unselected second column selection signal CSL2 (Unselected), and unselected second reference column selection signal RCSL2 (Unselected) at "L" level.

Furthermore, the control circuit 22 raises the voltage of the signal SINK from "L" level to "H" level.

As shown in FIGS. 49 and 51, the control logic circuit 39 raises the signals SINKT and RSINKT from "L" level to "H" level in accordance with the driving signal SINK supplied from the control circuit 22.

Consequently, the selected memory cell MC corresponding to a read current sink as a target of the test operation is electrically connected to the first global bit line GBL1, second global bit line GBL2, and GND. Also, a selected reference cell RC corresponding to a read current sink as a target of the test operation is electrically connected to the first reference global bit line RGBL1, second reference global bit line RGBL2, and GND.

[Times T2-T9]

The operations of the semiconductor storage device 100 at times T2 to T9 are the same as those of the semiconductor storage device 100 at times T2 to T9 in "Operation 1" explained in the sixth embodiment.

<"Operation 3">

The operation of the semiconductor storage device 100 in "Operation 3" will be explained below with reference to FIG. 53. The control circuit 22 executes read test mode 2 as follows.

First, the control circuit 22 enters write test mode A. Subsequently, the control circuit 22 supplies data "1" to the write data bus WDB belonging to the cell array 31 in which the memory cell MC or reference cell RC as a current measurement target exists, and data "0" to the write data bus WDB belonging to the cell array 31 which is not a current measurement target.

Then, the control circuit 22 enters read test modes A, B, and C. After that, the control circuit 22 forms a current path to the selected memory cell MC as follows.

[Time T0]

The row decoder 12 sets the voltages of the word line WL and reference word line RWL at "VWLL". The control circuit 22 sets the voltages of the signals CSL1, CSL2, RCSL1, RCSL2, SINK, TM_SELSINKb, TM_SINKDIS, REN, SEN1, SEN2, and SOE at "L (Low)" level. Also, the control circuit 22 sets the voltage of the signal TM_R-SINKDIS at "H (High)" level.

Furthermore, the control circuit 22 supplies "H" level data to the write data bus WDB corresponding to the read current sink 37 as a test mode target. In addition, the control circuit 22 supplies "L" level data to the data bus WDB corresponding to the read current sink 37 which is not a test mode target.

The operation of the control logic circuit 39 in "Operation 3" will now be explained with reference to FIGS. 49 and 51. "L" level write data WD is input to the control logic circuit 39 corresponding to a read current sink which is not a target of the test operation of "Operation 3". In the control logic circuit 39, therefore, the signals SINKT and RSINKT change to "L" level regardless of the signal SINK.

Also, "H" level write data WD is input to the control logic circuit 39 corresponding to a read current sink as a target of the test operation of "Operation 3". In addition, TM_SEL-SINKb and TM_SINKDIS are at "L" level, and TM_R-SINKDIS is at "H" level. As a consequence, the signal SINKT changes to "L" or "H" level and the signal RSINKT maintains "L" level in accordance with the driving signal SINK supplied from the control circuit 22. At time T0, the signal SINK is at "L" level, so the signals SINKT and RSINKT change to "L" level.

Note that the PMOS transistors 33*a* and 33*g* are turned on, and the NMOS transistors 33*d*, 33*f*, 33*j*, and 33*l* are turned off, so the signals OUT and OUTb are charged to "H" level.

[Time T1]

In accordance with the row address, the row decoder 12 raises the voltages of a selected word line WL (Selected) and selected reference word line RWL (Selected) from the voltage VWLL to the voltage VWLH (VWLL<VWLH). Also, the row decoder 12 maintains the voltages of an unselected word line WL (Unselected) and unselected reference word line RWL (Unselected) at the voltage VWLL.

In addition, in accordance with the column address, the column decoder 13 raises the voltages of a selected first column selection signal CSL1 (Selected), selected first reference column selection signal RCSL1 (Selected), selected second column selection signal CSL2 (Selected), and selected second reference column selection signal RCSL2 (Selected) from "L" level to "H" level. Also, the column decoder 13 maintains the voltages of an unselected first column selection signal CSL1 (Unselected), unselected first reference column selection signal RCSL1 (Unselected), unselected second column selection signal CSL2 (Unselected), and unselected second reference column selection signal RCSL2 (Unselected) at "L" level.

Furthermore, the control circuit 22 raises the voltage of the signal SINK from "L" level to "H" level.

As shown in FIGS. 49 and 51, the control logic circuit 39 raises the signal SINKT from "L" level to "H" level in accordance with the driving signal SINK supplied from the control circuit 22.

Consequently, only the selected memory cell MC corresponding to a read current sink as a target of the test operation is electrically connected to the first global bit line GBL1, second global bit line GBL2, and GND.

[Time T2]

The operation of the semiconductor storage device 100 at time T2 is the same as that of the semiconductor storage device 100 at time T2 in "Operation 3" explained in the sixth embodiment.

<"Operation 4">

Figure 54:
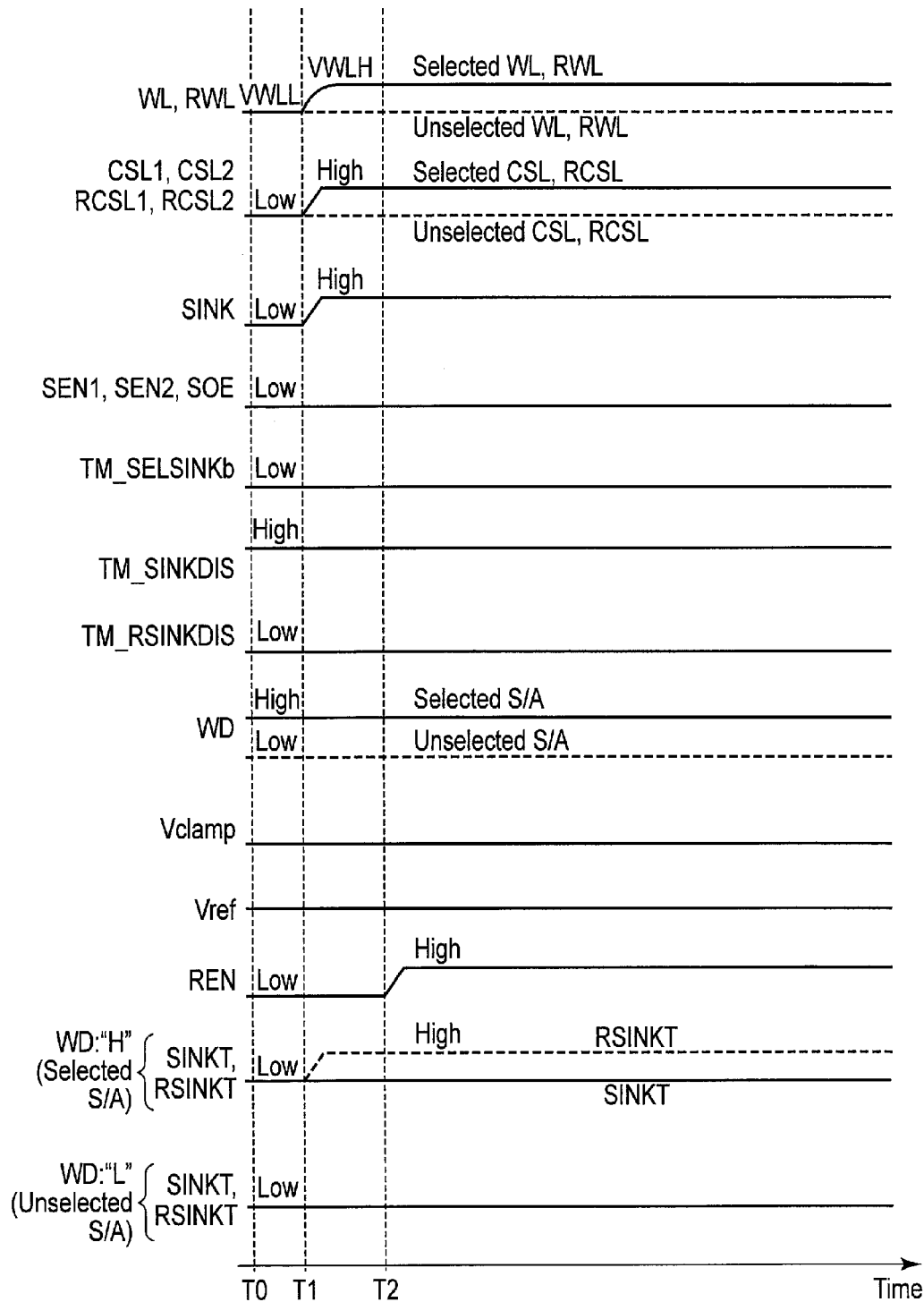
FIG. 54 is a waveform chart of signals when the semiconductor memory device according to the eighth embodiment executes "Operation 4"

The operation of the semiconductor storage device 100 in above described "Operation 4" will be explained below with reference to FIG. 54. The control circuit 22 executes read test mode 3 as follows.

First, the control circuit 22 enters write test mode A. Subsequently, the control circuit 22 supplies data "1" to the write data bus WDB belonging to the cell array 31 in which the memory cell MC or reference cell RC as a current measurement target exists, and data "0" to the write data bus WDB belonging to the cell array 31 which is not a current measurement target.

Then, the control circuit 22 enters read test modes A, B, and C. After that, the control circuit 22 forms a current path to the selected reference cell RC as follows.

[Time T0]

The row decoder 12 sets the voltages of the word line WL and reference word line RWL at "VWLL". The control circuit 22 sets the voltages of the signals CSL1, CSL2, RCSL1, RCSL2, SINK, TM_SELSINKb, TM_RSINKDIS, REN, SEN1, SEN2, and SOE at "L (Low)" level. Also, the control circuit 22 sets the voltage of the signal TM_SINKDIS at "H (High)" level.

Furthermore, the control circuit 22 supplies "H" level data to the write data bus WDB corresponding to the read current sink 37 as a test mode target. In addition, the control circuit 22 supplies "L" level data to the data bus WDB corresponding to the read current sink 37 which is not a test mode target.

The operation of the control logic circuit 39 in "Operation 4" will now be explained with reference to FIGS. 49 and 51. "L" level write data WD is input to the control logic circuit 39 corresponding to a read current sink which is not a target of the test operation of "Operation 4". In the control logic circuit 39, therefore, the signals SINKT and RSINKT change to "L" level regardless of the signal SINK.

Also, "H" level write data WD is input to the control logic circuit 39 corresponding to a read current sink as a target of the test operation of "Operation 4". In addition, TM_SELSINKb and TM_RSINKDIS are at "L" level, and TM_SINKDIS is at "H" level. As a consequence, the signal RSINKT changes to "L" or "H" level and the signal SINKT maintains "L" level in accordance with the driving signal SINK supplied from the control circuit 22. At time T0, the signal SINK is at "L" level, so the signals SINKT and RSINKT change to "L" level.

Note that the PMOS transistors 33a and 33g are turned on, and the NMOS transistors 33d, 33f, 33j, and 33l are turned off, so the signals OUT and OUTb are charged to "H" level.

[Time T1]

In accordance with the row address, the row decoder 12 raises the voltages of a selected word line WL (Selected) and selected reference word line RWL (Selected) from the voltage VWLL to the voltage VWLH (VWLL<VWLH). Also, the row decoder 12 maintains the voltages of an unselected word line WL (Unselected) and unselected reference word line RWL (Unselected) at the voltage VWLL.

In addition, in accordance with the column address, the column decoder 13 raises the voltages of a selected first column selection signal CSL1 (Selected), selected first reference column selection signal RCSL1 (Selected), selected second column selection signal CSL2 (Selected), and selected second reference column selection signal RCSL2 (Selected) from "L" level to "H" level. Also, the column decoder 13 maintains the voltages of an unselected first column selection signal CSL1 (Unselected), unselected first reference column selection signal RCSL1 (Unselected), unselected second column selection signal CSL2 (Unselected), and unselected second reference column selection signal RCSL2 (Unselected) at "L" level.

Furthermore, the control circuit 22 raises the voltage of the signal SINK from "L" level to "H" level As shown in FIGS. 49 and 51, the control logic circuit 39 raises the signal RSINKT from "L" level to "H" level in accordance with the driving signal SINK supplied from the control circuit 22.

Consequently, only the selected reference cell RC corresponding to a read current sink as a target of the test operation is electrically connected to the first reference global bit line RGBL1, second reference global bit line RGBL2, and GND.

[Time T2]

The operation of the semiconductor storage device 100 at time T2 is the same as that of the semiconductor storage device 100 at time T2 in "Operation 4" explained in the sixth embodiment.

Effects of Eighth Embodiment

In the embodiment described above, the semiconductor storage device 100 can achieve the same effects as those of the sixth embodiment by controlling the signals SINKT and RSINK in a read operation.

Ninth Embodiment

The ninth embodiment will be explained below. A semiconductor storage device according to the ninth embodiment includes a control logic circuit different from that of the sixth embodiment. Note that the basic arrangement and basic operation of the storage device according to the ninth embodiment are the same as those of the storage device according to the above described sixth embodiment. Therefore, an explanation of items explained in the above described sixth embodiment and items readily analogizable from the above described sixth embodiment will be omitted.

<Outline of Read Current Sink>

First, an example of a read current sink circuit according to the ninth embodiment will be explained below. In the read current sink 37 according to the sixth embodiment, the signal SINK is input to the gate electrode of the NMOS transistor 37a, and the signal RSINK is input to the gate electrode of the NMOS transistor 37b. The read current sink according to the sixth embodiment differs from the read current sink according to the sixth embodiment in that a signal SINK is input to the gate electrodes of NMOS transistors 37a and 37b. The signals SINK is a signal supplied from the control logic circuit 39

<Outline of Control Logic Circuit>

An arrangement example of a control logic circuit 39 according to the ninth embodiment will be explained below with reference to FIG. 55. As shown in FIG. 55, the control logic circuit 39 generates a signal SINKT based on signals TM_SELSINKb and SINK, and write data WD.

More specifically, the control logic circuit 39 includes an OR circuit 39n, NAND circuit 39o, and inverter 39p. The OR circuit 39n has a first input terminal to which the write data WD is input, and a second input terminal to which the test signal TM_SELSINKb for a sink selection operation is input. The OR circuit 39n outputs the operation result from the output terminal. The NAND circuit 39o has a first input terminal to which the signal SINK is connected, and a second input terminal connected to the output terminal of the OR circuit 39n. The NAND circuit 39o outputs the operation result from the output terminal. The input terminal of the inverter 39p is connected to the output terminal of the NAND circuit 39o. The inverter 39p outputs the signal SINKT as the operation result from the output terminal.

<"Operation 1">

Next, the operation of the semiconductor storage device 100 in above described "Operation 1" will be explained with reference to FIG. 56.

[Time T0]

A row decoder 12 sets the voltages of a word line WL and reference word line RWL at "VWLL". A control circuit 22 sets the voltages of signals CSL1, CSL2, RCSL1, RCSL2, SINK, REN, SEN1, SEN2, and SOE at "L (Low)" level. The control circuit 22 also sets the voltage of the signal TM_SELSINKb at "H (High)" level.

The operation of the control logic circuit 39 will now be explained with reference to FIGS. 55 and 57. As shown in FIGS. 55 and 57, the control circuit 22 sets the test signal TM_SELSINKb at "H" level. In the control logic circuit 39 as described above, the signal SINKT changes to "L" or "H" level in accordance with the driving signal SINK supplied from the control circuit 22, regardless of the write data WD. At time T0, the signal SINK is at "L" level, so the signal SINKT changes to "L" level.

Note that PMOS transistors 33a and 33g are turned on, and NMOS transistors 33d, 33f, 33j, and 33l are turned off, so signals OUT and OUTb are charged to "H" level.

[Time T1]

In accordance with the row address, the row decoder 12 raises the voltages of a selected word line WL (Selected) and selected reference word line RWL (Selected) from a voltage VWLL to a voltage VWLH (VWLL<VWLH). Also, the row decoder 12 maintains the voltages of an unselected word line WL (Unselected) and unselected reference word line RWL (Unselected) at the voltage VWLL.

In addition, in accordance with the column address, a column decoder 13 raises the voltages of a selected first column selection signal CSL1 (Selected), selected first reference column selection signal RCSL1 (Selected), selected second column selection signal CSL2 (Selected), and selected second reference column selection signal RCSL2 (Selected) from "L" level to "H" level. Also, the column decoder 13 maintains the voltages of an unselected first column selection signal CSL1 (Unselected), unselected first reference column selection signal RCSL1 (Unselected), unselected second column selection signal CSL2 (Unselected), and unselected second reference column selection signal RCSL2 (Unselected) at "L" level.

Furthermore, the control circuit 22 raises the voltage of the signal SINK from "L" level to "H" level.

As shown in FIGS. 55 and 57, the control logic circuit 39 raises the signal SINKT from "L" level to "H" level in accordance with the driving signal SINK supplied from the control circuit 22.

Consequently, the selected memory cell MC is electrically connected to a first global bit line GBL1, second global bit line GBL2, and GND.

[Times T2-T9]

The operations of the semiconductor storage device 100 at times T2 to T9 are the same as those of the semiconductor storage device 100 at times T2 to T9 in "Operation 1" explained in the sixth embodiment.

<"Operation 2">

Figure 58:
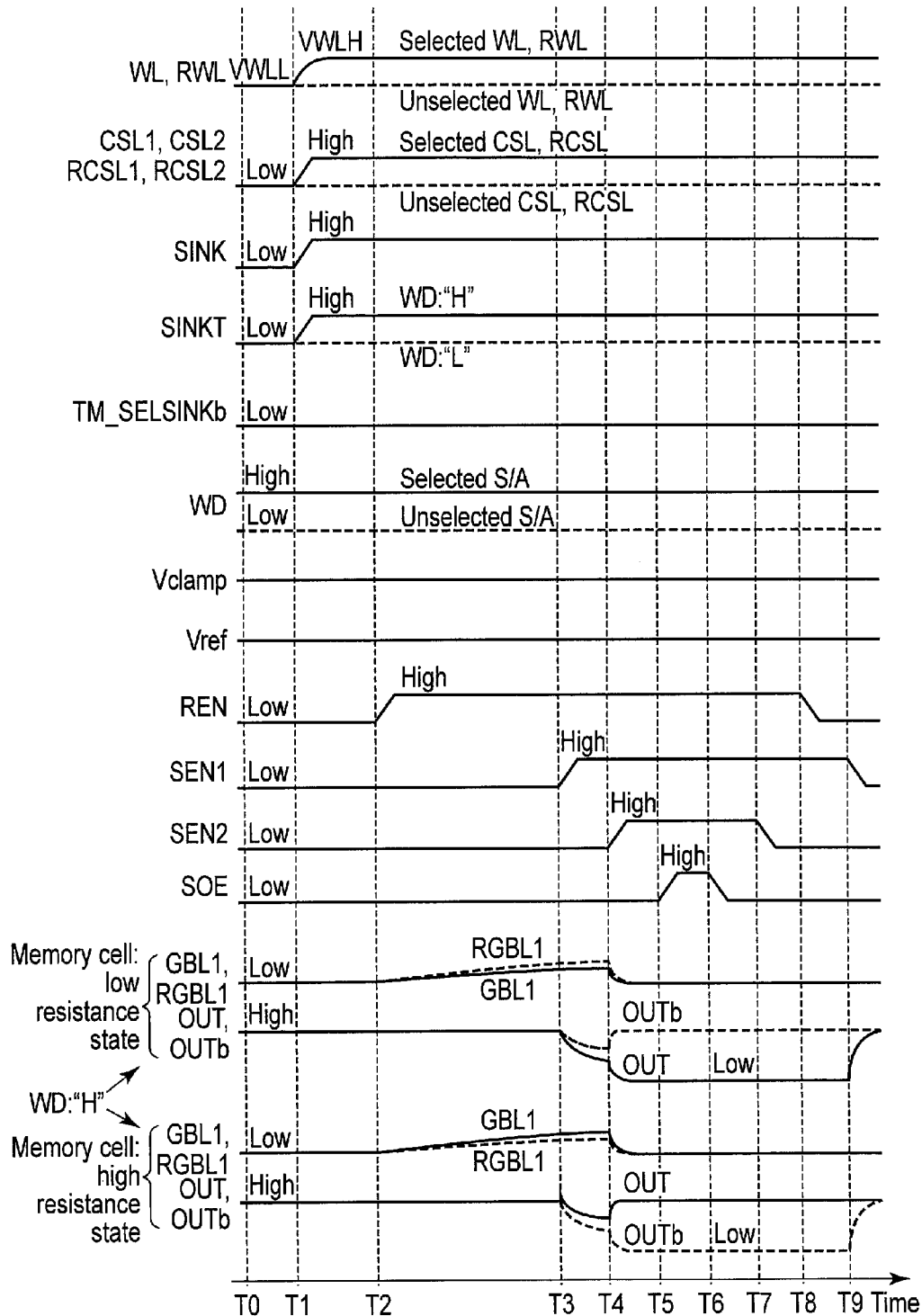
FIG. 58 is a waveform chart of signals when the semiconductor memory device according to the ninth embodiment executes "Operation 2"

The operation of the semiconductor storage device 100 in above described "Operation 2" will be explained below with reference to FIG. 58. The control circuit 22 executes read test mode 3 as follows.

First, the control circuit 22 enters write test mode A. Subsequently, the control circuit 22 supplies data "1" to the write data bus WDB belonging to a cell array 31 in which a memory cell MC or reference cell RC as a read operation target exists, and data "0" to the write data bus WDB belonging to the cell array 31 which is not a read operation target.

Then, the control circuit 22 enters read test modes A. After that, the control circuit 22 executes a read operation on the selected cell array 31 as follows.

[Time T0]

The row decoder 12 sets the voltages of the word line WL and reference word line RWL at "VWLL". The control circuit 22 sets the voltages of the signals CSL1, CSL2, RCSL1, RCSL2, SINK, TM_SELSINKb, REN, SEN1, SEN2, and SOE at "L (Low)" level.

Also, the control circuit 22 supplies "H" level data to the write data bus WDB corresponding to the read current sink 37 as a test mode target. In addition, the control circuit 22 supplies "L" level data to the write data bus WDB corresponding to the read current sink 37 which is not a test mode target.

The control logic circuit 39 in "Operation 2" will now be explained with reference to FIGS. 55 and 57. "L" level write data WD is input to the control logic circuit corresponding to a read current sink which is not a target of the test operation of "Operation 2". In the control logic circuit 39, therefore, the signal SINKT changes to "L" level regardless of the signal SINK.

Also, "H" level write data WD is input to the control logic circuit 39 corresponding to a read current sink as a target of the test operation of "Operation 2". Consequently, the signal SINKT changes to "L" or "H" level in accordance with the signal SINK supplied from the control circuit 22. At time T0, the signal SINK is at "L" level, so the signal SINKT changes to "L" level.

Note that the PMOS transistors 33a and 33g are turned on, and the NMOS transistors 33d, 33f, 33j, and 33l are turned off, so the signals OUT and OUTb are charged to "H" level.

[Time T1]

In accordance with the row address, the row decoder 12 raises the voltages of a selected word line WL (Selected) and selected reference word line RWL (Selected) from the voltage VWLL to the voltage VWLH (VWLL<VWLH). Also, the row decoder 12 maintains the voltages of an unselected word line WL (Unselected) and unselected reference word line RWL (Unselected) at the voltage VWLL.

In addition, in accordance with the column address, the column decoder 13 raises the voltages of a selected first column selection signal CSL1 (Selected), selected first reference column selection signal RCSL1 (Selected), selected second column selection signal CSL2 (Selected), and selected second reference column selection signal RCSL2 (Selected) from "L" level to "H" level. Also, the column decoder 13 maintains the voltages of an unselected first column selection signal CSL1 (Unselected), unselected first reference column selection signal RCSL1 (Unselected), unselected second column selection signal CSL2 (Unselected), and unselected second reference column selection signal RCSL2 (Unselected) at "L" level.

Furthermore, the control circuit 22 raises the voltage of the signal SINK from "L" level to "H" level.

As shown in FIGS. 55 and 57, the control logic circuit 39 raises the signal SINKT from "L" level to "H" level in accordance with the driving signal SINK supplied from the control circuit 22.

Consequently, the selected memory cell MC corresponding to a read current sink as a target of the test operation is electrically connected to the first global bit line GBL1, second global bit line GBL2, and GND. Also, a selected reference cell RC corresponding to a read current sink as a target of the test operation is electrically connected to the first reference global bit line RGBL1, second reference global bit line RGBL2, and GND.

[Times T2-T9]

The operations of the semiconductor storage device 100 at times T2 to T9 are the same as those of the semiconductor storage device 100 at times T2 to T9 in "Operation 1" explained in the sixth embodiment.

<"Operation 3">

The operation of the semiconductor storage device 100 in "Operation 3" will be explained below with reference to FIG. 59. The control circuit 22 executes read test mode 2 as follows.

First, the control circuit 22 enters write test mode A. Subsequently, the control circuit 22 supplies data "1" to the write data bus WDB belonging to the cell array 31 in which the memory cell MC or reference cell RC as a current measurement target exists, and data "0" to the write data bus WDB belonging to the cell array 31 which is not a current measurement target. In addition, the control circuit 22 sets the reference voltage Vref at "L (Low)" level not to form the current path of a reference current Iref.

Then, the control circuit 22 enters read test modes A, B, and C. After that, the control circuit 22 forms a current path to the selected memory cell MC as follows.

[Time T0]

The row decoder 12 sets the voltages of the word line WL and reference word line RWL at "VWLL". The control circuit 22 sets the voltages of the signals CSL1, CSL2, RCSL1, RCSL2, SINK, TM_SELSINKb, REN, SEN1, SEN2, and SOE at "L (Low)" level.

Furthermore, the control circuit 22 supplies "H" level data to the write data bus WDB corresponding to the read current sink 37 as a test mode target. In addition, the control circuit 22 supplies "L" level data to the data bus WDB corresponding to the read current sink 37 which is not a test mode target.

The operation of the control logic circuit 39 in "Operation 3" will now be explained with reference to FIGS. 55 and 57. "L" level write data WD is input to the control logic circuit 39 corresponding to a read current sink which is not a target of the test operation of "Operation 3". In the control logic circuit 39, therefore, the signals SINKT changes to "L" level regardless of the signal SINK.

Also, "H" level write data WD is input to the control logic circuit 39 corresponding to a read current sink as a target of the test operation of "Operation 3". In addition, TM_SELSINKb is set at "L" level. As a consequence, the signal SINKT changes to "L" or "H" level in accordance with the driving signal SINK supplied from the control circuit 22. At time T0, the signal SINK is at "L" level, so the signal SINKT changes to "L" level.

Note that the PMOS transistors 33*a* and 33*g* are turned on, and the NMOS transistors 33*d*, 33*f*, 33*j*, and 33*l* are turned off, so the signals OUT and OUTb are charged to "H" level.

[Time T1]

In accordance with the row address, the row decoder 12 raises the voltages of a selected word line WL (Selected) and selected reference word line RWL (Selected) from the voltage VWLL to the voltage VWLH (VWLL<VWLH). Also, the row decoder 12 maintains the voltages of an unselected word line WL (Unselected) and unselected reference word line RWL (Unselected) at the voltage VWLL.

In addition, in accordance with the column address, the column decoder 13 raises the voltages of a selected first column selection signal CSL1 (Selected), selected first reference column selection signal RCSL1 (Selected), selected second column selection signal CSL2 (Selected), and selected second reference column selection signal RCSL2 (Selected) from "L" level to "H" level. Also, the column decoder 13 maintains the voltages of an unselected first column selection signal CSL1 (Unselected), unselected first reference column selection signal RCSL1 (Unselected), unselected second column selection signal CSL2 (Unselected), and unselected second reference column selection signal RCSL2 (Unselected) at "L" level.

Furthermore, the control circuit 22 raises the voltage of the signal SINK from "L" level to "H" level.

As shown in FIGS. 55 and 57, the control logic circuit 39 raises the signal SINKT from "L" level to "H" level in accordance with the driving signal SINK supplied from the control circuit 22.

Consequently, only the selected memory cell MC corresponding to a read current sink as a target of the test operation is electrically connected to the first global bit line GBL1, second global bit line GBL2, and GND.

[Time T2]

The operation of the semiconductor storage device 100 at time T2 is the same as that of the semiconductor storage device 100 at time T2 in "Operation 3" explained in the sixth embodiment.

In this example as described above, the control circuit 22 can select the cell array 31 as a target of the test operation, and measure only the cell read current Ir flowing through a predetermined memory cell MC, by controlling data to be supplied to the write data bus WDB, the signal SINK, the clamp voltage Vclamp and reference voltage Vref. The cell read current Ir flowing through the predetermined memory cell MC can be measured by applying VDD from an external PAD and measuring the electric current by DC measurement.

<"Operation 4">

The operation of the semiconductor storage device 100 in above described "Operation 4" will be explained below with reference to FIG. 60. The control circuit 22 executes read test mode 3 as follows.

First, the control circuit 22 enters write test mode A. Subsequently, the control circuit 22 supplies data "1" to the write data bus WDB belonging to the cell array 31 in which the memory cell MC or reference cell RC as a current measurement target exists, and data "0" to the write data bus WDB belonging to the cell array 31 which is not a current measurement target. In addition, the control circuit 22 sets the clamp voltage Vclamp at "L (Low)" level not to form the current path of a cell read current Ir.

Then, the control circuit 22 enters read test modes A, B, and C. After that, the control circuit 22 forms a current path to the selected reference cell RC as follows.

[Time T0]

The operation of the semiconductor storage device 100 at time T0 is the same as that of the semiconductor storage device 100 at time T0 in "Operation 3" explained in the ninth embodiment.

[Time T1]

In accordance with the row address, the row decoder 12 raises the voltages of a selected word line WL (Selected) and selected reference word line RWL (Selected) from the voltage VWLL to the voltage VWLH (VWLL<VWLH). Also, the row decoder 12 maintains the voltages of an unselected word line WL (Unselected) and unselected reference word line RWL (Unselected) at the voltage VWLL.

In addition, in accordance with the column address, the column decoder 13 raises the voltages of a selected first column selection signal CSL1 (Selected), selected first reference column selection signal RCSL1 (Selected), selected second column selection signal CSL2 (Selected), and selected second reference column selection signal RCSL2 (Selected) from "L" level to "H" level. Also, the column decoder 13 maintains the voltages of an unselected first column selection signal CSL1 (Unselected), unselected first reference column selection signal RCSL1 (Unselected), unselected second column selection signal CSL2 (Unselected), and unselected second reference column selection signal RCSL2 (Unselected) at "L" level.

Furthermore, the control circuit 22 raises the voltage of the signal SINK from "L" level to "H" level As shown in FIGS. 55 and 57, the control logic circuit 39 raises the signal SINKT from "L" level to "H" level in accordance with the driving signal SINK supplied from the control circuit 22.

Consequently, only the selected reference cell RC corresponding to a read current sink as a target of the test operation is electrically connected to the first reference global bit line RGBL1, second reference global bit line RGBL2, and GND.

[Time T2]

The operation of the semiconductor storage device 100 at time T2 is the same as that of the semiconductor storage device 100 at time T2 in "Operation 4" explained in the sixth embodiment.

In this example as described above, the control circuit 22 can select the cell array 31 as a target of the test operation, and measure only the reference current Iref flowing through a predetermined reference cell RC, by controlling data to be supplied to the write data bus WDB, the signal SINK, the clamp voltage Vclamp and reference voltage Vref. The reference current Iref flowing through the predetermined reference cell RC can be measured by applying VDD from an external PAD and measuring the electric current by DC measurement.

Effects of Ninth Embodiment

In the embodiment described above, the semiconductor storage device 100 can achieve the same effects as those of the sixth embodiment by controlling the signal SINKT in a read operation.

10th Embodiment

The 10th embodiment will be explained below. A semiconductor storage device according to the 10th embodiment differs from each embodiment described above in that control logic circuits are formed in first and second write drivers. Note that the basic arrangement and basic operation of the storage device according to the 10th embodiment are the same as those of the storage device according to the above described first embodiment. Therefore, an explanation of items explained in the above described first embodiment and items readily analogizable from the above described first embodiment will be omitted.

<Outline of Memory Area>

Figure 61:
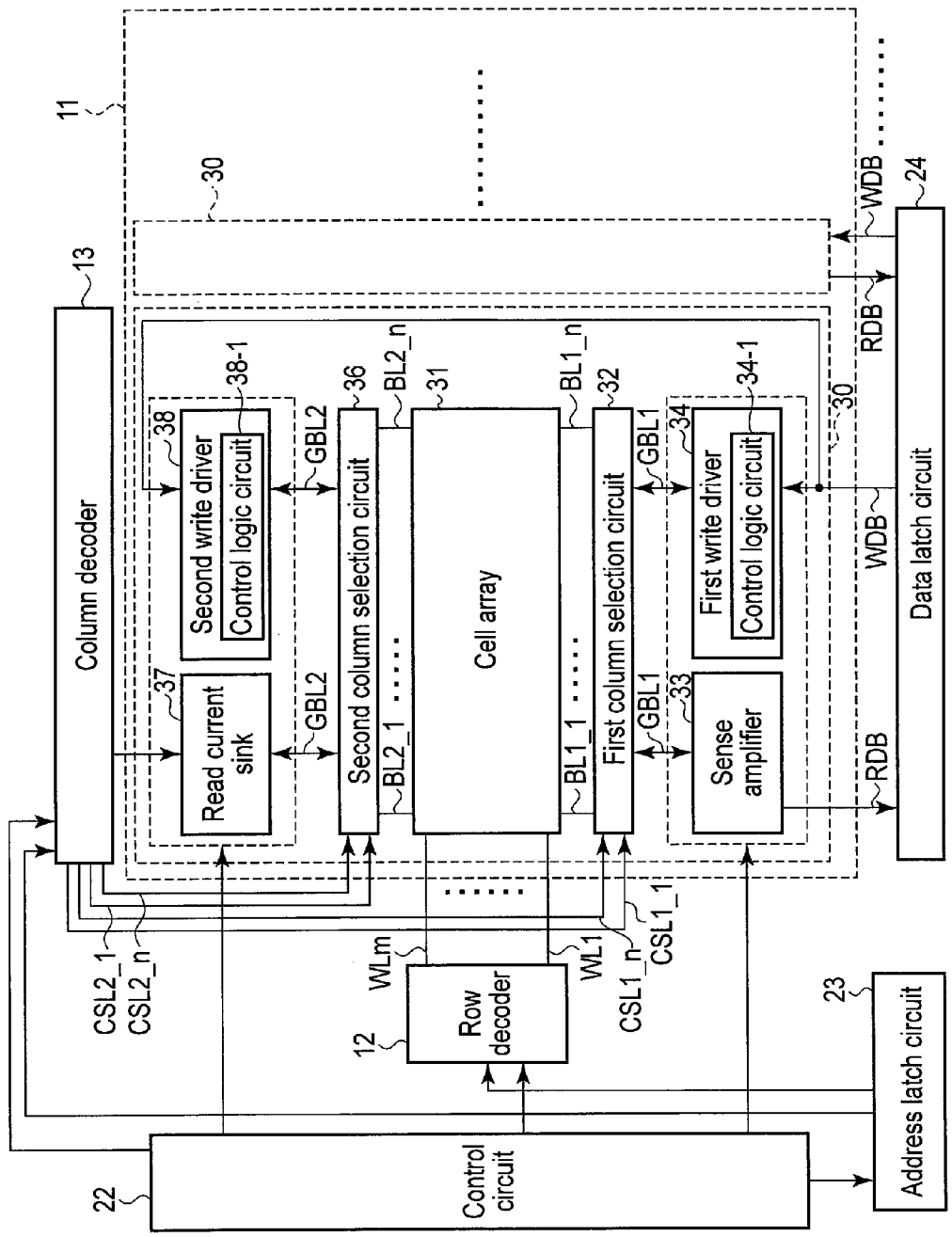
FIG. 61 is a block diagram schematically showing the basic arrangement of a memory area and its periphery according to the 10th embodiment.

A memory area 11 according to the 10th embodiment will now be explained with reference to FIG. 61. The memory area 11 according to the 10th embodiment does not include the control logic circuit 35 included in the memory area 11 according to the first embodiment. When compared to the memory area 11 according to the first embodiment, the memory area 11 according to the 10th embodiment further includes a first control logic circuit 34-1 for controlling a first write driver, and a second control logic circuit 38-1 for controlling a second write driver.

<Outlines of Control Logic Circuits>

Figure 62:
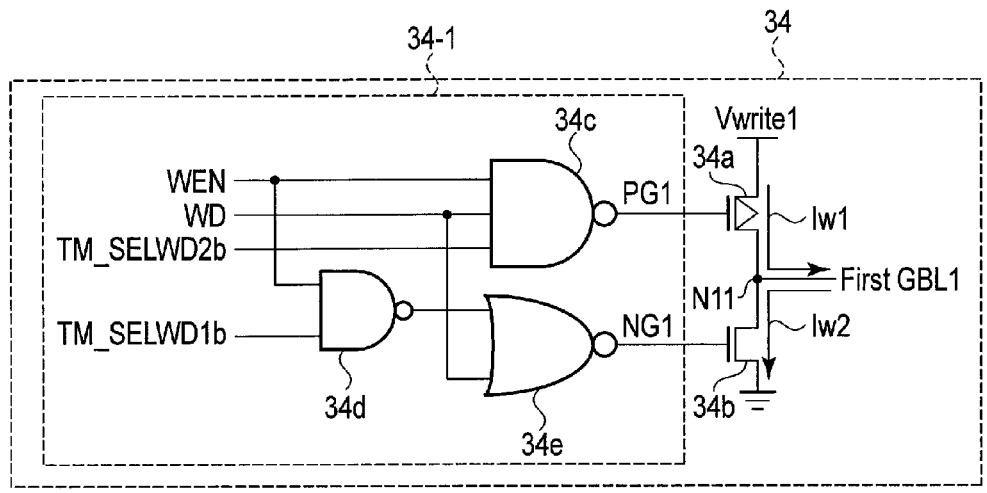
FIG. 62 is a circuit diagram schematically showing the basic arrangement of a first control logic circuit according to the 10th embodiment.

An arrangement example of the first control logic circuit 34-1 will be explained below with reference to FIG. 62. As shown in FIG. 62, a first write driver 34 includes a PMOS transistor 34a, an NMOS transistor 34b, and the first control logic circuit 34-1. The PMOS transistor 34a has a current path having one end to which a first write voltage Vwrite1 is applied, and the other end to which a node N11 electrically connected to a first global bit line GBL1 is connected, and includes a gate electrode to which a signal PG1 is applied from the first control logic circuit 34-1. The NMOS transistor 34b has a current path having one end connected to the node N11, and the other end connected to a ground voltage GND, and includes a gate electrode to which a signal NG1 is applied from the first control logic circuit 34-1. When the PMOS transistor 34a is turned on and the NMOS transistor 34b is turned off, a first write current Iw1 flows from the first write voltage source Vwrite1 to the first global bit line GBL1. When the PMOS transistor 34a is turned off and the NMOS transistor 34b is turned on, a second write current Iw2 flows from the first global bit line GBL1 to the current path of the NMOS transistor 34b.

The first control circuit 34-1 generates the signals PG1 and NG1 based on a signal TM_SELWD1b (an inverted signal of a signal TM_SELWD1), a signal TM_SELWD2b (an inverted signal of a signal TM_SELWD2), a signal WEN, and write data WD.

More specifically, the first control circuit 34-1 includes NAND circuits 34c and 34d, and a NOR circuit 34e. The NAND circuit 34c has a first input terminal to which the write enable signal WEN is input, a second input terminal to which the write data WD is input, and a third input terminal to which the test signal TM_SELWD2b for a second write driver selection operation is input. The NAND circuit 34c outputs the signal PG1 as the operation result from the output terminal. The NAND circuit 34d has a first input terminal to which the write enable signal WEN is input, and a second input terminal to which the test signal TM_SELWD1b for a first write driver selection operation is input. The NAND circuit 34d outputs the operation result from the output terminal. The NOR circuit 34e has a first input terminal to which the write data WD is input, and a second input terminal to which the output signal from the NAND circuit 34d is input. The NOR circuit 34e outputs the operation result as the signal NG1 from the output terminal.

Note that a control circuit 22 commonly controls the write enable signal WEN for each write driver simultaneous operation.

Figure 63:
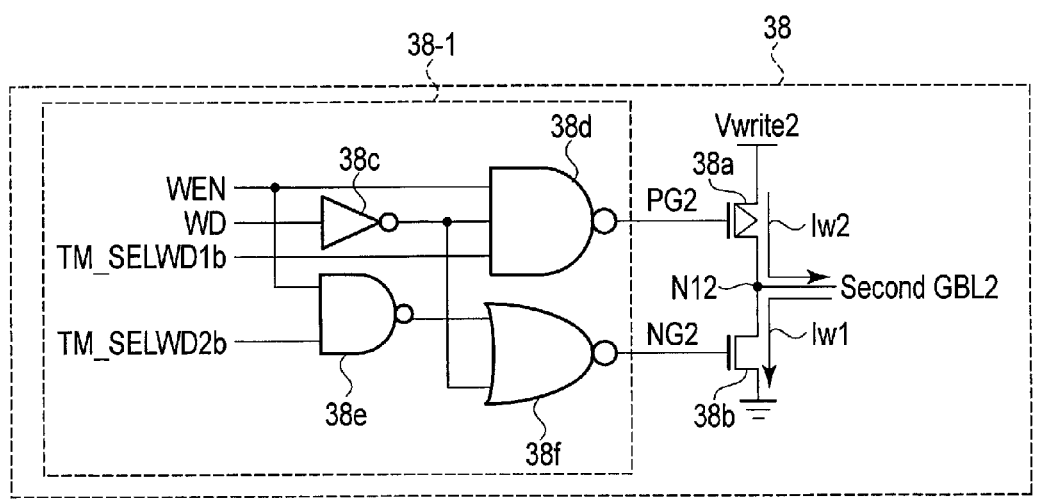
FIG. 63 is a circuit diagram schematically showing the basic arrangement of a second control logic circuit according to the 10th embodiment.

An arrangement example of the second control logic circuit 38-1 will be explained below with reference to FIG. 63. As shown in FIG. 63, a second write driver 38 includes a PMOS transistor 38a, an NMOS transistor 38b, and the second control logic circuit 38-1. The PMOS transistor 38a has a current path having one end to which a second write voltage Vwrite2 is applied, and the other end to which a node N12 electrically connected to a second global bit line GBL2 is connected, and includes a gate electrode to which a signal PG2 is applied from the second control logic circuit 38-1. The NMOS transistor 38b has a current path having one end connected to the node N12, and the other end connected to the ground voltage GND, and includes a gate electrode to which a signal NG2 is applied from the second control logic circuit 38-1. When the PMOS transistor 38a is turned on and the NMOS transistor 38b is turned off, a second write current Iw2 flows from the second write voltage source Vwrite2 to the second global bit line GBL2. When the PMOS transistor 38a is turned off and the NMOS transistor 38b is turned on, a the first write current Iw1 flows from the second global bit line GBL2 to the current path of the NMOS transistor 38b.

The second control logic circuit 38-1 generates the signals PG2 and NG2 based on the signals TM_SELWD1*b*, TM_SELWD2*b*, and WEN, and the write data WD.

More specifically, the second control logic circuit 38-1 includes an inverter 38*c*, NAND circuits 38*d* and 38*e*, and a NOR circuit 38*f*. The inverter 38*c* receives the write data WD, and outputs inverted data of the write data WD from the output terminal. The NAND circuit 38*d* has a first input terminal to which the write enable signal WEN is input, a second input terminal to which the output signal from the inverter 38*c* is input, and a third input terminal to which the test signal TM_SELWD1*b* for a first write driver selection operation is input. The NAND circuit 38*d* outputs the signal PG2 as the operation result from the output terminal. The NAND circuit 38*e* has a first input terminal to which the write enable signal WEN is input, and a second input terminal to which the test signal TM_SELWD2*b* for a second write driver selection operation is input. The NAND circuit 38*e* outputs the operation result from the output terminal. The NOR circuit 38*f* has a first input terminal to which the output signal from the inverter 38*c* is input, and a second input terminal to which the output signal from the NAND circuit 38*e* is input. The NOR circuit 38*f* outputs the operation result as the signal NG2 from the output terminal.

<Outline of Operation of Semiconductor Storage Device According to this Embodiment>

An outline of the operation of the semiconductor storage device according to this embodiment will be explained below. In general, the semiconductor storage device 100 according to this embodiment performs the following six operations for the first and second write drivers 34 and 38.

[Operation 5 (Standby/Read)]

In a standby operation or read operation, the control circuit 22 performs control so that the first and second write drivers 34 and 38 apply no voltage to a cell array 31.

[Operation 6 (Normal Write Operation)]

The control circuit 22 performs control so as to perform a write operation on the cell array 31 in accordance with the write data WD.

[Operation 7 (Test Mode 4 (Normal Write Operation in Only Current Iw1 Direction (WD: "H")))]

The control circuit 22 performs control so that the write driver performs a write operation by supplying only the current Iw1 to the cell array 31.

[Operation 8 (Test Mode 5 (Normal Write Operation in Only current Iw2 Direction (WD: "L")))]

The control circuit 22 performs control so that the write driver performs a write operation by supplying only the current Iw2 to the cell array 31.

[Operation 9 (Test Mode 6 (Current Iw1 Measuring Operation (Wd: "H")))]

The control circuit 22 performs control so that the write driver supplies only the current Iw1 to the cell array 31.

[Operation 10 (Test Mode 7 (Current Iw2 Measuring Operation (Wd: "L")))]

The control circuit 22 performs control so that the write driver supplies only the current Iw2 to the cell array 31.

<"Operation 5">

The operation of the semiconductor storage device 100 in above described "Operation 5" will be explained below with reference to FIGS. 62, 63, and 64.

As shown in FIGS. 62, 63, and 64, when the control circuit 22 supplies an "L" level write enable signal WEN to the first and second write drivers 34 and 38, the signals PG1 and PG2 change to "H" level, and the signals NG1 and NG2 change to "L" level, regardless of the test signals TM_SELWD1*b* and TM_SELWD2*b* and write data WD.

Accordingly, the PMOS transistor 34*a* and NMOS transistor 34*b* of the first write driver 34 are kept OFF. Also, the PMOS transistor 38*a* and NMOS transistor 38*b* of the second write driver 38 are kept OFF. Consequently, the first and second write drivers 34 and 38 supply no electric current to the cell array 31.

<"Operation 6">

Figure 65:
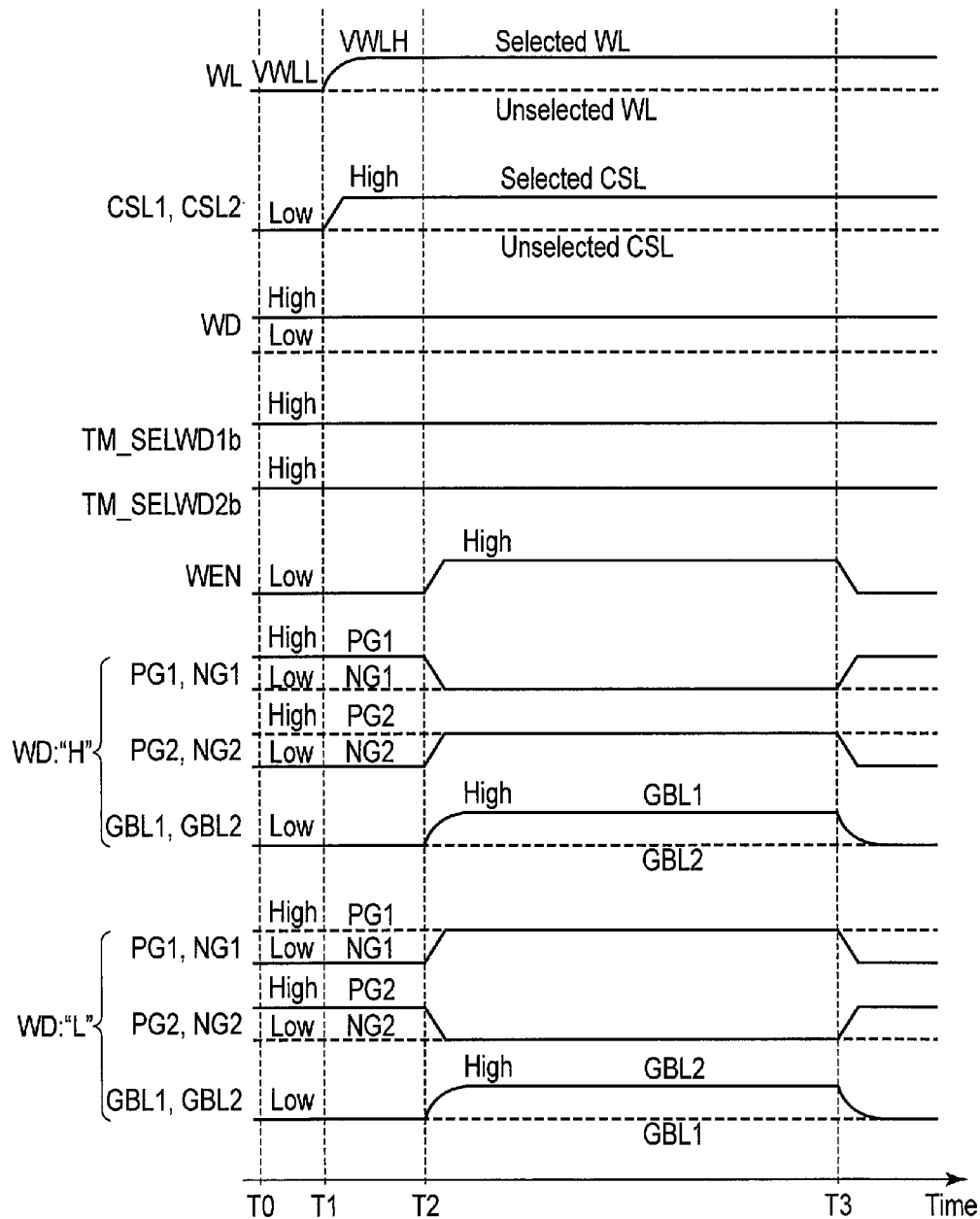
FIG. 65 is a waveform chart of signals when the semiconductor memory device according to the 10th embodiment executes "Operation 6"

The write operation of the semiconductor storage device 100 in above described "Operation 6" will be explained below with reference to FIG. 65.

[Time T0]

A row decoder 12 sets the voltages of a word line WL and reference word line RWL at "VWLL". The control circuit 22 sets the voltages of signals CSL1, CSL2, RCSL1, RCSL2, and WEN at "L (Low)" level. The control circuit 22 also sets the voltages of the signals TM_SELWD1*b* and TM_SELWD2*b* at "H (High)" level.

The operations of the first and second control logic circuits 34-1 and 38-1 will now be explained with reference to FIGS. 62, 63, and 64. As shown in FIGS. 62, 63, and 64, the control circuit 22 sets the write enable signal WEN at "L" level. In this case, in the first and second control logic circuits 34-1 and 38-1 as described above, PG1 and PG2 change to "H" level, and NG1 and NG2 change to "L" level. Consequently, in the first control logic circuit 34-1, the PMOS transistor 34*a* and NMOS transistor 34*b* are turned off. Also, in the second control logic circuit 38-1, the PMOS transistor 38*a* and NMOS transistor 38*b* are turned off.

In other words, at time T0, the write enable signal WEN is at "L" level, so the first and second write drivers 34 and 38 do not operation.

[Time T1]

In accordance with the row address, the row decoder 12 raises the voltages of a selected word line WL (Selected) from a voltage VWLL to a voltage VWLH (VWLL<VWLH). Also, the row decoder 12 maintains the voltages of an unselected word line WL (Unselected) and unselected reference word line RWL (Unselected) at the voltage VWLL.

In addition, in accordance with the column address, a column decoder 13 raises the voltages of a selected first column selection signal CSL1 (Selected), selected second column selection signal CSL2 (Selected), from "L" level to "H" level. Also, the column decoder 13 maintains the voltages of an unselected first column selection signal CSL1 (Unselected), and unselected second column selection signal CSL2 (Unselected), at "L" level. Consequently, the selected memory cell MC is electrically connected to first and second global bit lines GBL1 and GBL2.

[Time T2]

The control circuit 22 raises the voltage of the write enable signal WEN from "L" level to "H" level. The operations of the first and second logic circuits 34-1 and 38-1 will be explained with reference to FIGS. 62, 63, and 64. As shown in FIGS. 62, 63, and 64, the control circuit 22 sets the test signals TM_SELWD1*b* and TM_SELWD2*b* and write enable signal WEN at "H" level. When the write data WD is at "H" level in the first control logic circuit 34-1, the signals PG1 and NG1 are at "L" level. When the write data WD is at "H" level in the second control logic circuit 38-1, the signals PG2 and NG2 are at "H" level. Consequently, in the first control logic circuit 34-1, the PMOS transistor 34*a* is turned on, and the NMOS transistor 34*b* is turned off. Also, in the second control logic circuit 38-1, the PMOS transistor 38*a* is turned off, and the NMOS transistor 38*b* is turned on. Consequently, the first write voltage Vwrite1 is applied to the first global bit line GBL1, and the ground voltage GND is applied to the second global bit line GBL2.

Furthermore, when the write data WD is at "L" level in the first control logic circuit 34-1, the signals PG1 and NG1 are at "H" level. When the write data WD is at "L" level in the second control logic circuit 38-1, the signals PG2 and NG2 are at "L" level. Consequently, in the first control logic circuit 34-1, the PMOS transistor 34a is turned off, and the NMOS transistor 34b is turned on. Also, in the second control logic circuit 38-1, the PMOS transistor 38a is turned on, and the NMOS transistor 38b is turned off. Accordingly, the ground voltage GND is applied to the first global bit line GBL1, and the second write voltage Vwrite2 is applied to the second global bit line GBL2.

[Time T3]

The control circuit 22 lowers the voltage of the write enable signal WEN from "H" level to "L" level. Consequently, the write operations of the first and second write drivers 34 and 38 are complete.

<"Operation 7">

The write operation of the semiconductor storage device 100 in above described "Operation 7" will be explained below with reference to FIG. 66. First, the control circuit 22 enters a test mode of making the test signal TM_SELWD1b active ("L" level). Subsequently, the control circuit 22 supplies data "1" to a write data bus WDB belonging to the cell array 31 in which the memory cell MC as a write operation target exists, and data "0" to the write data bus WDB belonging to the cell array 31 which is not a write operation target.

[Time T0]

The row decoder 12 sets the voltages of the word line WL at "VWLL". The control circuit 22 sets the voltages of the signals CSL1, CSL2, WEN, and TM_SELWD1b at "L (Low)" level. The control circuit 22 also sets the voltage of the signal TM_SELWD2b at "H (High)" level. As described above, since the write enable signal WEN is at "L" level, the first and second write drivers 34 and 38 do not operate.

[Time T1]

The operation of the semiconductor storage device 100 at time T1 is the same as that of the semiconductor storage device 100 at time T1 in "Operation 6".

[Time T2]

The control circuit 22 raises the voltage of the write enable signal WEN from "L" level to "H" level. The operations of the first and second logic circuits 34-1 and 38-1 will be explained with reference to FIGS. 62, 63, and 64.

When the write data WD is at "H" level in the first control logic circuit 34-1, the signals PG1 and NG1 are at "L" level. When the write data WD is at "H" level in the second control logic circuit 38-1, the signals PG2 and NG2 are at "H" level. Consequently, in the first control logic circuit 34-1, the PMOS transistor 34a is turned on, and the NMOS transistor 34b is turned off. Also, in the second control logic circuit 38-1, the PMOS transistor 38a is turned off, and the NMOS transistor 38b is turned on. Consequently, the first write voltage Vwrite1 is applied to the first global bit line GBL1, and the ground voltage GND is applied to the second global bit line GBL2.

Furthermore, when the write data WD is at "L" level in the first and second control logic circuits 34-1 and 38-1, the signals PG1 and PG2 are at "H" level, and the signals NG1 and NG2 are at "L" level. Consequently, in the first and second control logic circuits 34-1 and 38-1, the PMOS transistor 34a, NMOS transistor 34b, PMOS transistor 38a, and NMOS transistor 38b are turned off. That is, when the write data WD is at "L" level, the first and second write drivers 34 and 38 do not operate.

[Time T3]

The control circuit 22 lowers the voltage of the write enable signal WEN from "H" level to "L" level. Consequently, the write operation of the first write driver 34 is complete.

Thus, the control circuit 22 can supply an electric current in only the current Iw1 direction and perform the write operation by controlling the signals TM_SELWD1b and TM_SELWD2b and write data WD.

<"Operation 8">

Figure 67:
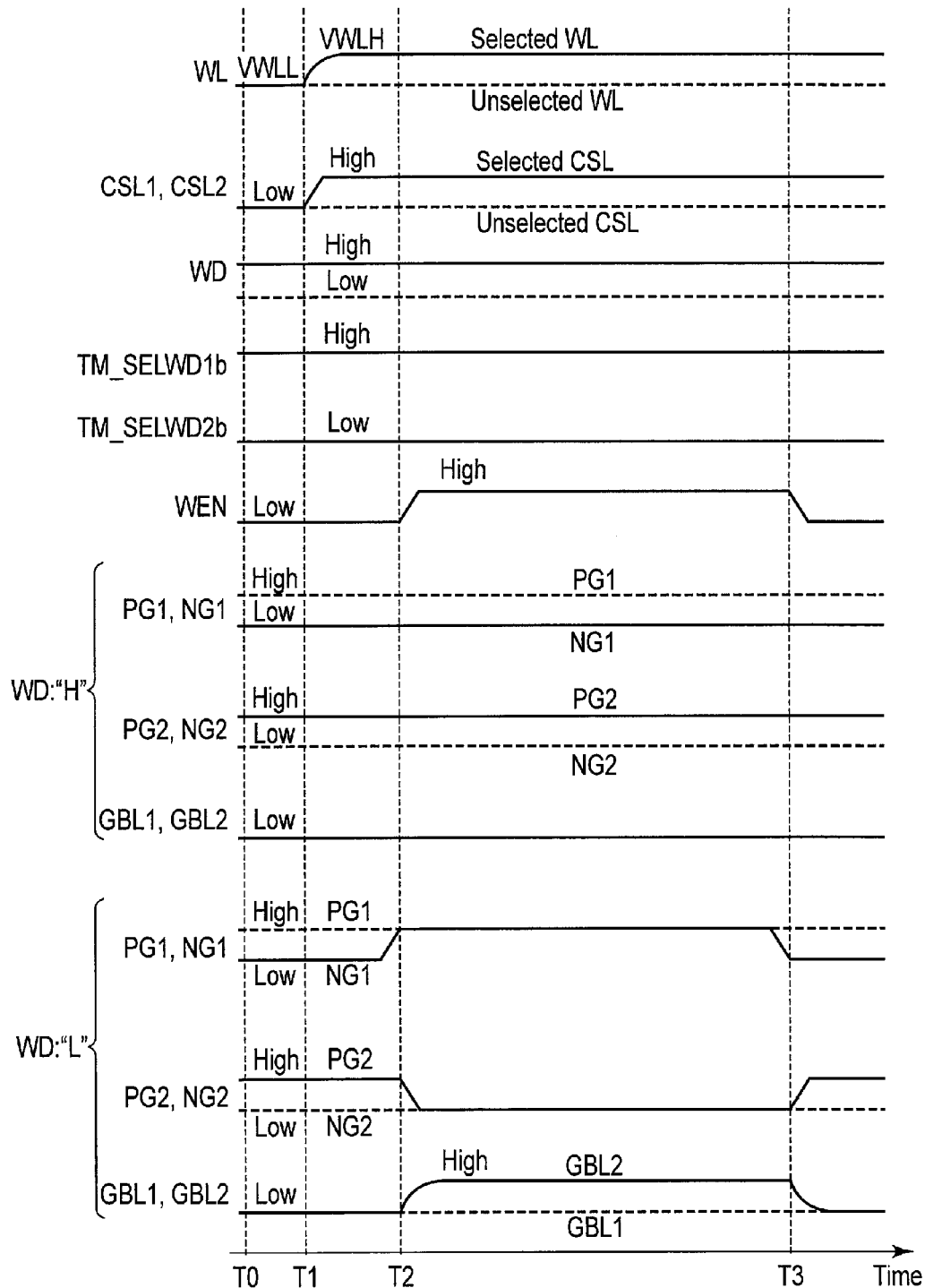
FIG. 67 is a waveform chart of signals when the semiconductor memory device according to the 10th embodiment executes "Operation 8"

The write operation of the semiconductor storage device 100 in above described "Operation 8" will be explained below with reference to FIG. 67. First, the control circuit 22 enters a test mode of making the test signal TM_SELWD2b active ("L" level). Subsequently, the control circuit 22 supplies data "0" to the write data bus WDB belonging to the cell array 31 in which the memory cell MC as a write operation target exists, and data "1" to the write data bus WDB belonging to the cell array 31 which is not a write operation target.

[Time T0]

The row decoder 12 sets the voltages of the word line WL at "VWLL". The control circuit 22 sets the voltages of the signals CSL1, CSL2, WEN, and TM_SELWD2b at "L (Low)" level. The control circuit 22 also sets the voltage of the signal TM_SELWD1b at "H (High)" level. As described above, since the write enable signal WEN is at "L" level, the first and second write drivers 34 and 38 do not operate.

[Time T1]

The operation of the semiconductor storage device 100 at time T1 is the same as that of the semiconductor storage device 100 at time T1 in "Operation 6".

[Time T2]

The control circuit 22 raises the voltage of the write enable signal WEN from "L" level to "H" level. The operations of the first and second logic circuits 34-1 and 38-1 will be explained with reference to FIGS. 62, 63, and 64.

When the write data WD is at "H" level in the first and second control logic circuits 34-1 and 38-1, the signals PG1 and PG2 are at "H" level, and the signals NG1 and NG2 are at "L" level. Consequently, in the first and second control logic circuits 34-1 and 38-1, the PMOS transistor 34a, NMOS transistor 34b, PMOS transistor 38a, and NMOS transistor 38b are turned off. That is, when the write data WD is at "H" level, the first and second write drivers 34 and 38 do not operate.

Furthermore, when the write data WD is at "L" level in the first control logic circuit 34-1, the signals PG1 and NG1 are at "H" level. When the write data WD is at "L" level in the second control logic circuit 38-1, the signals PG2 and NG2 are at "L" level. Consequently, in the first control logic circuit 34-1, the PMOS transistor 34a is turned off, and the NMOS transistor 34b is turned on. Also, in the second control logic circuit 38-1, the PMOS transistor 38a is turned on, and the NMOS transistor 38b is turned off. Accordingly, the ground voltage GND is applied to the first global bit line GBL1, and the second write voltage Vwrite2 is applied to the second global bit line GBL2.

[Time T3]

The control circuit 22 lowers the voltage of the write enable signal WEN from "H" level to "L" level. Consequently, the write operations of the first and second write drivers 34 and 38 are complete.

Thus, the control circuit 22 can supply an electric current in only the current Iw2 direction and perform the write operation by controlling the signals TM_SELWD1*b* and TM_SELWD2*b* and write data WD.

<"Operation 9">

Figure 68:
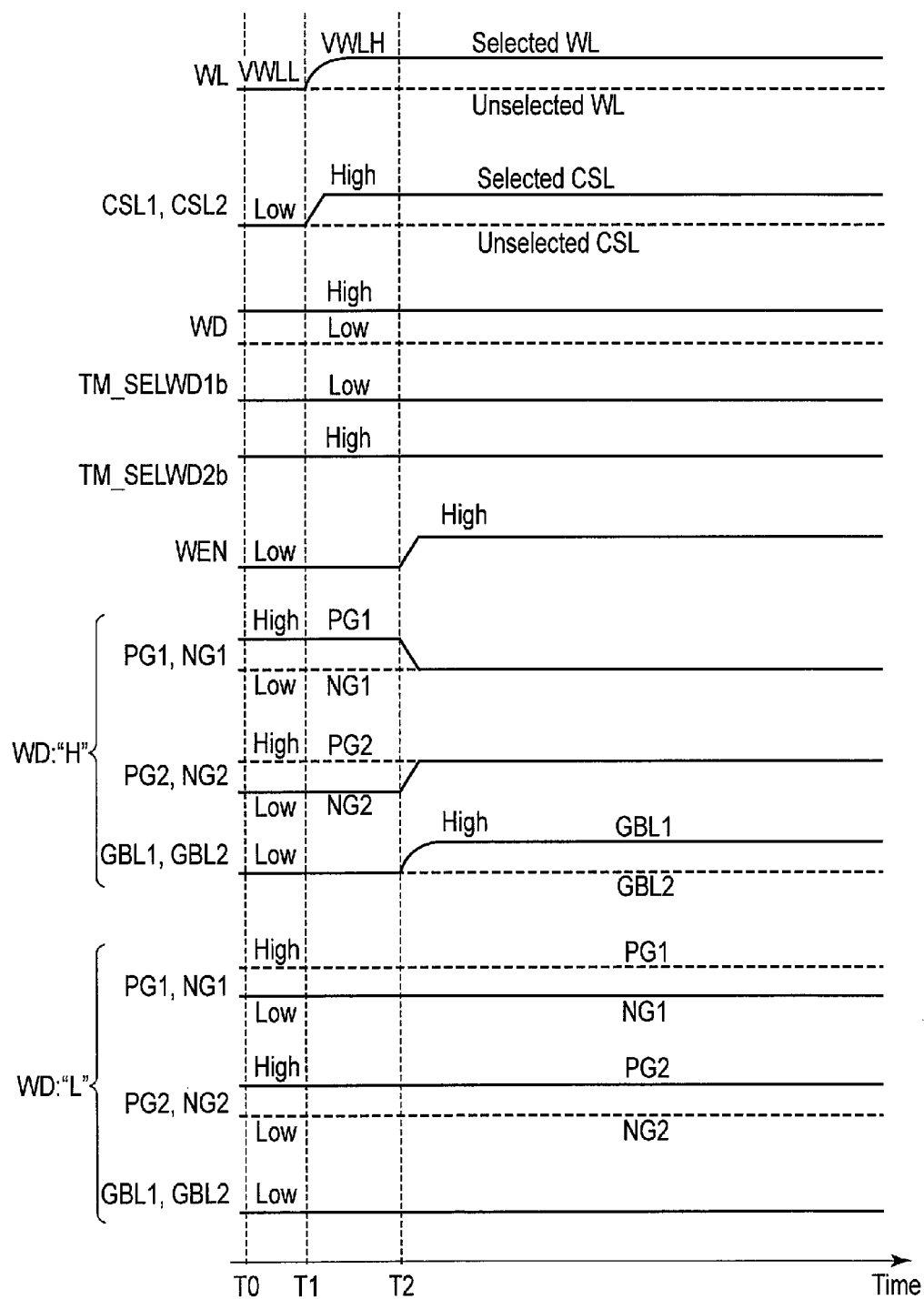
FIG. 68 is a waveform chart of signals when the semiconductor memory device according to the 10th embodiment executes "Operation 9"

The write operation of the semiconductor storage device 100 in above described "Operation 9" will be explained below with reference to FIG. 68. First, the control circuit 22 enters a test mode of making the test signal TM_SELWD1*b* active ("L" level). The control circuit 22 also enters a test mode of maintaining the write enable signal WEN at "H" level in a write operation. Furthermore, the control circuit 22 enters a test mode of applying the write driver power supply voltage Vwrite1 from an external PAD and measuring the electric current. Subsequently, the control circuit 22 supplies data "1" to a write data bus WDB belonging to the cell array 31 in which the memory cell MC as a current measurement target exists, and data "0" to the write data bus WDB belonging to the cell array 31 which is not a current measurement target.

[Times T0-T2]

The operations of the semiconductor storage device 100 at times T0 to T2 are the same as those of the semiconductor storage device 100 at times T0 to T2 in "Operation 7".

Thus, the control circuit 22 can supply an electric current in only the current Iw1 direction by controlling the signals TM_SELWD1*b* and TM_SELWD2*b* and write data WD. To measure the current Iw1, the state of time T2 is maintained, and the electric current of the power supply voltage Vwrite1 is measured by DC measurement. This makes it possible to individually measure an electric current flowing through the selected memory cell MC.

<"Operation 10">

Figure 69:
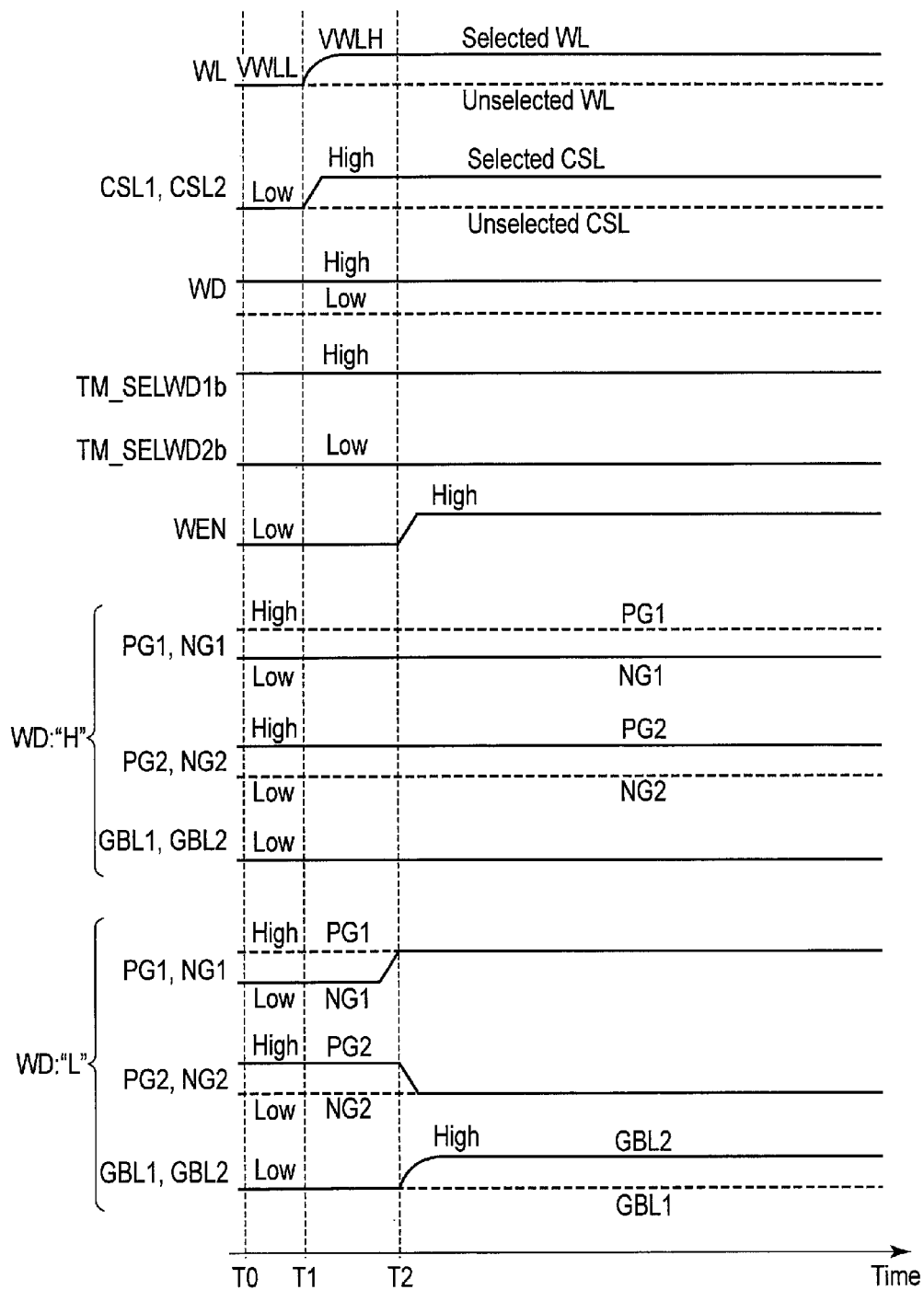
FIG. 69 is a waveform chart of signals when the semiconductor memory device according to the 10th embodiment executes "Operation 10"

The write operation of the semiconductor storage device 100 in above described "Operation 10" will be explained below with reference to FIG. 69. First, the control circuit 22 enters a test mode of making the test signal TM_SELWD2*b* active ("L" level). The control circuit 22 also enters a test mode of maintaining the write enable signal WEN at "H" level in a write operation. Furthermore, the control circuit 22 enters a test mode of applying the write driver power supply voltage Vwrite2 from an external PAD and measuring the electric current. Subsequently, the control circuit 22 supplies data "0" to a write data bus WDB belonging to the cell array 31 in which the memory cell MC as a measurement target exists, and data "1" to the write data bus WDB belonging to the cell array 31 which is not a current measurement target.

[Times T0-T2]

The operations of the semiconductor storage device 100 at times T0 to T2 are the same as those of the semiconductor storage device 100 at times T0 to T2 in "Operation 8".

Thus, the control circuit 22 can supply an electric current in only the current Iw2 direction by controlling the signals TM_SELWD1*b* and TM_SELWD2*b* and write data WD. To measure the current Iw2, the state of time T2 is maintained, and the electric current of the power supply voltage Vwrite2 is measured. This makes it possible to individually measure an electric current flowing through the selected memory cell MC.

Effects of 10th Embodiment

In the semiconductor storage device 100 according to the embodiment described above, the first control logic circuit 34-1 is formed in the first write driver 34, and the second control logic circuit 38-1 is formed in the second write driver 38. The semiconductor storage device 100 of this embodiment can freely select the memory cell MC as a target of current path formation, and freely select the direction of a flowing electric current, in accordance with write data and test signals on the write data bus WDB.

To explain the effects of this embodiment, first and second write drivers 34 and 38 according to a comparative example will be explained below with reference to FIGS. 70, 71, and 72.

An arrangement example of a first control logic circuit 34-2 according to the comparative example will be explained below with reference to FIG. 70. As shown in FIG. 70, the first write driver 34 according to the comparative example includes a PMOS transistor 34*f*, an NMOS transistor 34*g*, and the first control logic circuit 34-2. The PMOS transistor 34*f* has a current path having one end to which the write voltage Vwrite1 is applied, and the other end to which a node N13 electrically connected to the first global bit line GBL1 is connected, and includes a gate electrode to which a signal PG3 is applied from the first control logic circuit 34-2. The NMOS transistor 34*g* has a current path having one end connected to the node N13, and the other end connected to the ground voltage GND, and includes a gate electrode to which a signal NG3 is applied from the first control logic circuit 34-2.

The first control logic circuit 34-2 generates the signals PG3 and NG3 based on the signal WEN and write data WD.

More specifically, the first control circuit 34-2 includes a NAND circuit 34*h*, inverter 34*i*, and NOR circuit 34*j*. The NAND circuit 34*h* has a first input terminal to which the write enable signal WEN is input, and a second input terminal to which the write data WD is input. The NAND circuit 34*h* outputs the signal PG3 as the operation result from the output terminal. The inverter 34*i* receives the write enable signal WEN, and outputs an inverted signal of the write enable signal WEN from the output terminal. The NOR circuit 34*j* has a first input terminal to which the write data WD is input, and a second input terminal to which the output signal from the inverter 34*i* is input. The NOR circuit 34*j* outputs the operation result as the signal NG3 from the output terminal.

An arrangement example of a second control logic circuit 38-2 will be explained below with reference to FIG. 71. As shown in FIG. 71, a second write driver 38 according to the comparative example includes a PMOS transistor 38*g*, an NMOS transistor 38*h*, and the second control logic circuit 38-2. The PMOS transistor 38*g* has a current path having one end to which the write voltage Vwrite2 is applied, and the other end to which a node N14 electrically connected to the second global bit line GBL2 is connected, and includes a gate electrode to which a signal PG4 is applied from the second control logic circuit 38-2. The NMOS transistor 38*h* has a current path having one end connected to the node N14, and the other end connected to the ground voltage GND, and includes a gate electrode to which a signal NG4 is applied from the second control logic circuit 38-2.

The second control logic circuit 38-2 generates the signals PG4 and NG4 based on the signal WEN and write data WD.

More specifically, the second control logic circuit 38-2 includes inverters 38*i* and 38*j*, a NAND circuit 38*k*, and a NOR circuit 38*l*. The inverter 38*i* receives the write data WD, and outputs inverted data of the write data WD from the output terminal. The inverter 38*j* receives the write enable signal WEN, and outputs an inverted signal of the write enable signal WEN from the output terminal. The NAND circuit 38*k* has a first input terminal to which the write enable signal WEN is input, and a second input terminal to which the output signal from the inverter 38*i* is input. The NAND circuit 38k outputs the signal PG4 as the operation result from the output terminal. The NOR circuit 38l has a first input terminal to which the output signal from the inverter 38i is input, and a second input terminal to which the output signal from inverter 38j is input. The NOR circuit 38l outputs the operation result as the signal NG4 from the output terminal.

As shown in FIG. 72, the first or second write driver 34 or 38 according to the comparative example does not operate only when the write enable signal WEN is at "L" level. In the first and second write drivers 34 and 38 according to the comparative example, therefore, one of the electric current Iw1 flowing from the first write voltage Vwrite1 to the ground voltage GND and the electric current Iw2 flowing from the second write voltage Vwrite2 to the ground voltage GND necessarily flows, and the ground voltage floats accordingly. This makes it difficult to perform the write operation on each memory cell MC and measure the write current without this influence.

As described above, however, when using the first and second write drivers 34 and 38 according to the embodiment of this application, it is possible to perform only the write operation in a desired direction on each memory cell and measure the electric current while suppressing, e.g., an increase in transistor or address signal.

(Modifications Etc.)

Note that in the semiconductor storage devices 100 according to the first to ninth embodiments described above, the reference circuit for generating the reference current Iref uses parts of the first column selection circuit 32, cell array 31, second column selection circuit 36, and read current sink 37. However, the present invention is not limited to this, and the semiconductor storage device may also include an independent reference circuit 50 as shown in FIG. 73.

Also, when the write data bus WDB in the sub memory area 30 according to the above described first to ninth embodiments holds no data in a write operation, the sub memory area 30 may further include a latch circuit 60 for holding data on the write data bus WDB in the above described first to ninth embodiments as shown in FIG. 74.

In addition, in the above described second embodiment, the semiconductor storage device 100 may also execute "Operation 3" or "Operation 4" by controlling the signals CSL1 and RCSL1 instead of the clamp voltage Vclamp and reference voltage Vref. Likewise, in the above described second embodiment, the semiconductor storage device 100 may also execute "Operation 3" or "Operation 4" by controlling the signals CSL2 and RCSL2 instead of the clamp voltage Vclamp and reference voltage Vref. Furthermore, in the above described second embodiment, the semiconductor storage device 100 may also execute "Operation 3" or "Operation 4" by controlling the word line WL and reference word line RWL instead of the clamp voltage Vclamp and reference voltage Vref. Analogously, in the above described second embodiment, the semiconductor storage device 100 may also execute "Operation 3" or "Operation 4" by controlling the signals SINK and RSINK instead of the clamp voltage Vclamp and reference voltage Vref.

In each of the above described embodiments, the timing at which the control circuit 22 raises the voltage of the signal REN from "L" level to "H" level may also be earlier than time T1. In addition, at time T1, the control circuit 22 simultaneously changes the voltages of a selected word line WL (Selected), selected reference word line RWL (Selected), selected first column selection signal CSL1 (Selected), selected first reference column selection signal RCSL1 (Selected), selected second column selection signal CSL2 (Selected), and selected second reference column selection signal RCSL2 (Selected), but the present invention is not limited to this.

Also, in the semiconductor storage device 100 according to the 10th embodiment, the write voltage Vwrite1 of the first write driver and the write voltage Vwrite2 of the second write driver are independent of each other, but they may also be the same power supply voltage.

Furthermore, in each of the above described embodiments, an electric current is supplied to the cell array 31 via the sense amplifier 33 connected to the power supply, and the same electric current is supplied to the ground GND via the read current sink 37.

However, the present invention is not limited to this, and an electric current may also be supplied to the cell array 31 via the read current sink 37 (which functions as a source circuit in this case) connected to the power supply. In this case, each of the above described embodiments is applicable to even an arrangement in which the sense amplifier 33 senses the electric current and the electric current is supplied to the ground GND via the PMOS transistor 33a or 33g. The read current sink circuit 37 may also include a PMOS transistor instead of an NMOS transistor.

Moreover, in each of the above described embodiments, a bit line pair is referred to as first and second bit lines for convenience. However, the present invention is not limited to this, and a bit line pair may also be referred to as a bit line and source line.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a cell array including a plurality of memory cells;
   a sense amplifier reading data of the memory cell;
   a write driver writing data to the memory cell;
   a sub cell area including the cell array, the sense amplifier, and the write driver;
   a memory area including a plurality of sub cell areas; and
   a control circuit, when performing a first read operation of reading data from a selected sub cell area, supplying first write data to the sub cell area including the sense amplifier which performs the first read operation, for selecting the sub cell area as a target of the first read operation.

2. The semiconductor storage device according to claim 1, wherein
   the memory cell holds data in accordance with a change in resistance value,
   the sub cell area further includes:
   a reference circuit;
   a control logic circuit;
   a first circuit discharges a read current from the cell array to a first power supply, or supplies the read current from the first power supply to the cell array;
   a second circuit discharges a reference current from the reference circuit to the first power supply, or supplies the reference current to the reference circuit;

a write driver, when writing the write data to the memory cell, supplies one of an electric current and a voltage based on the write data to the memory cell, for changing the resistance value of the memory cell; and a write data bus supplies the write data to the write driver and the control logic circuit, the sense amplifier reads data stored in the memory cell by comparing the read current with the reference current, the control circuit supplies, to the memory area, a first control signal for selecting one of the first read operation, a second read operation of supplying the read current to a selected memory cell without supplying the reference current, and a third read operation of supplying the reference current to a selected reference circuit without supplying the read current, and supplies first write data to the sub cell area including the sense amplifier which performs one of the first read operation, the second read operation, and the third read operation, and the control logic circuit causes the sub cell area to execute the first read operation, the second read operation, and the third read operation based on the first write data and the first control signal.

3. The semiconductor storage device according to claim 2, wherein the control logic circuit operates the sense amplifier based on the first write data and the first control signal.

4. The semiconductor storage device according to claim 3, wherein the sense amplifier includes:

a first switch controls electrical connection to the cell array;

a third circuit supplies the read current from a second power supply to the cell array, or discharges the read current from the cell array to the second power supply;

a second switch controls electrical connection to the reference circuit; and a fourth circuit supplies the reference current from the second power supply to the reference circuit, or discharges the reference current from the reference circuit to the second power supply.

5. The semiconductor storage device according to claim 4, wherein the control circuit supplies a second control signal for driving the first switch and a third control signal for driving the second switch to a plurality of sense amplifiers, the control logic circuit transmits a fourth control signal to the first switch based on the second control signal, the first write data, and the first control signal, and transmits a fifth control signal to the second switch based on the third control signal, the first write data, and the first control signal, and the control logic circuit turns on the first switch and the second switch based on the fourth control signal and the fifth control signal in the first read operation, turns on the first switch based on the fourth control signal and turns off the second switch based on the fifth control signal in the second read operation, and turns off the first switch based on the fourth control signal and turns on the second switch based on the fifth control signal in the third read operation.

6. The semiconductor storage device according to claim 4, wherein the control circuit supplies a sixth control signal for driving the third circuit and a seventh control signal for driving the fourth circuit to a plurality of sense amplifiers, the control logic circuit transmits an eighth control signal to the third circuit based on the sixth control signal, the first write data, and the first control signal, and transmits a ninth control signal to the fourth circuit based on the seventh control signal, the first write data, and the first control signal, and the control logic circuit turns on the third circuit and the fourth circuit based on the eighth control signal and the ninth control signal in the first read operation, turns on the third circuit based on the eighth control signal and turns off the fourth circuit based on the ninth control signal in the second read operation, and turns off the third circuit based on the eighth control signal and turns on the fourth circuit based on the ninth control signal in the third read operation.

7. The semiconductor storage device according to claim 3, wherein the control circuit supplies a 10th control signal for driving the first circuit and an 11th control signal for driving the second circuit to a plurality of sub cell areas, the control logic circuit transmits a 12th control signal to the first circuit based on the 10th control signal, the first write data, and the first control signal from the control circuit, and transmits a 13th control signal to the second circuit based on the 11th control signal, the first write data, and the first control signal, and the control logic circuit turns on the first circuit and the second circuit based on the 12th control signal and the 13th control signal in the first read operation, turns on the first circuit based on the 12th control signal and turns off the second circuit based on the 13th control signal in the second read operation, and turns off the first circuit based on the 12th control signal and turns on the second circuit based on the 13th control signal in the third read operation.

8. The semiconductor storage device according to claim 4, wherein the sense amplifier includes:

a fifth circuit supplies the read current from a third power supply to the cell array, or discharge the read current from the cell array to the third power supply, in the first read operation, the second read operation, and the third read operation; and a sixth circuit supplies the reference current from the third power supply to the reference circuit, or discharge the reference current from the reference circuit to the third power supply, in the first read operation, the second read operation, and the third read operation.

9. The semiconductor storage device according to claim 8, wherein the control logic circuit transmits a 14th control signal to the fifth circuit and a 15th control signal to the sixth circuit based on the first write data and the first control signal, and the control logic circuit turns on the fifth circuit and the sixth circuit based on the 14th control signal and the 15th control signal in the first read operation, turns on the fifth circuit based on the 14th control signal and turns off the sixth circuit based on the 15th control signal in the second read operation, and turns off the fifth circuit based on the 14th control signal and turns on the sixth circuit based on the 15th control signal in the third read operation, and the control circuit or the control logic circuit turns off the third circuit and the fourth circuit in the first read operation, the second read operation, and the third read operation.

10. The semiconductor storage device according to claim 8, wherein the third power supply to which the fifth circuit and the sixth circuit are electrically connected is a power supply of the write driver.

11. The semiconductor storage device according to claim 2, wherein before performing the first read operation, the second read operation, and the third read operation, and when supplying the write data to the write data bus, the control circuit selects, based on the supplied write data, a write test mode of prohibiting the write driver from executing write to the memory cell.

12. The semiconductor storage device according to claim 1, wherein the memory cell is one of an MRAM (Magnetic Random Access Memory), a PCRAM (Phase Change Random Access Memory), and a ReRAM (Resistive Random Access Memory).

* * * * *